(12) United States Patent
Tanizawa et al.

(10) Patent No.: US 7,947,994 B2
(45) Date of Patent: *May 24, 2011

(54) NITRIDE SEMICONDUCTOR DEVICE

(75) Inventors: Koji Tanizawa, Tokushima (JP);
Tomotsugu Mitani, Tokushima (JP);
Yoshinori Nakagawa, Tokushima (JP);
Hironori Takagi, Tokushima (JP);
Hiromitsu Marui, Tokushima (JP);
Yoshikatsu Fukuda, Tokushima (JP);
Takeshi Ikegami, Tokushima (JP)

(73) Assignee: Nichia Corporation, Anan-shi (JP)

( * ) Notice: Subject to any disclaimer, the term of this patent is extended or adjusted under 35 U.S.C. 154(b) by 165 days.

This patent is subject to a terminal disclaimer.

(21) Appl. No.: 12/046,572

(22) Filed: Mar. 12, 2008

(65) Prior Publication Data

US 2008/0191195 A1    Aug. 14, 2008

Related U.S. Application Data

(62) Division of application No. 11/600,123, filed on Nov. 16, 2006, now Pat. No. 7,402,838, which is a division of application No. 09/265,579, filed on Mar. 10, 1999, now Pat. No. 7,193,246.

(30) Foreign Application Priority Data

| Mar. 12, 1998 | (JP) | P 10-060233 |
| May 25, 1998 | (JP) | P 10-161452 |
| Oct. 6, 1998 | (JP) | P 10-284345 |
| Nov. 17, 1998 | (JP) | P 10-326281 |
| Dec. 8, 1998 | (JP) | P 10-348762 |
| Dec. 25, 1998 | (JP) | P 10-368294 |
| Jan. 29, 1999 | (JP) | P 11-023048 |
| Jan. 29, 1999 | (JP) | P 11-023049 |

(51) Int. Cl.
*H01L 33/00* (2010.01)
(52) U.S. Cl. .................... 257/94; 257/E33.03
(58) Field of Classification Search .................. 257/94, 257/101, E33.03
See application file for complete search history.

(56) References Cited

U.S. PATENT DOCUMENTS

| 4,750,183 A | 6/1988 | Takahashi et al. |
| 5,042,043 A | 8/1991 | Hatano et al. |

(Continued)

FOREIGN PATENT DOCUMENTS

EP    1 014 455 A1    6/2000

(Continued)

OTHER PUBLICATIONS

Shuji Nakamura et al., "$In_xGa_{(1-x)}N, In_yGa_{(1-y)}N$ supperlattices grown on GaN films," Journal of Applied Physics, vol. 74, No. 6, pp. 3911-3915, Sep. 15, 1999.

(Continued)

*Primary Examiner* — W. David Coleman
(74) *Attorney, Agent, or Firm* — Volentine & Whitt, PLLC

(57) ABSTRACT

According to the nitride semiconductor device with the active layer made of the multiple quantum well structure of the present invention, the performance of the multiple quantum well structure can be brought out to intensify the luminous output thereof thereby contributing an expanded application of the nitride semiconductor device. In the nitride semiconductor device comprises an n-region having a plurality of nitride semiconductor films, a p-region having a plurality of nitride semiconductor films, and an active layer interposed therebetween, a multi-film layer with two kinds of the nitride semiconductor films is formed in at least one of the n-region or the p-region.

20 Claims, 10 Drawing Sheets

U.S. PATENT DOCUMENTS

| | | |
|---|---|---|
| 5,247,533 A | 9/1993 | Okazaki et al. |
| 5,382,170 A | 1/1995 | Imanishi |
| 5,408,105 A | 4/1995 | Adachi et al. |
| 5,656,832 A | 8/1997 | Ohba et al. |
| 5,665,977 A | 9/1997 | Ishibashi et al. |
| 5,747,827 A | 5/1998 | Duggan et al. |
| 5,751,752 A | 5/1998 | Shakuda |
| 5,777,350 A | 7/1998 | Nakamura et al. |
| 5,909,040 A | 6/1999 | Ohba et al. |
| 6,172,382 B1 | 1/2001 | Nagahama et al. |
| 6,198,112 B1 | 3/2001 | Ishida et al. |
| 2003/0010993 A1 | 1/2003 | Nakamura et al. |

FOREIGN PATENT DOCUMENTS

| | | | |
|---|---|---|---|
| GB | 2298735 A | 9/1996 | |
| JP | 60-145686 | 8/1985 | |
| JP | 62193192 | 8/1987 | |
| JP | 62-224095 | 10/1987 | |
| JP | 03-299480 | 10/1991 | |
| JP | 03-257887 | 11/1991 | |
| JP | 04-068579 | 3/1992 | |
| JP | 04-242985 | 8/1992 | |
| JP | 05-082834 | 4/1993 | |
| JP | 05-110139 | 4/1993 | |
| JP | 05-206513 | 8/1993 | |
| JP | 05-259508 | 10/1993 | |
| JP | 05-291618 | 11/1993 | |
| JP | 05-343739 | 12/1993 | |
| JP | 06-005916 | 1/1994 | |
| JP | 6033863 | 2/1994 | |
| JP | 06-120559 | 4/1994 | |
| JP | 06-151966 | 5/1994 | |
| JP | 07-249795 | 9/1995 | |
| JP | 72763744 | 10/1995 | |
| JP | 08-023124 | 1/1996 | |
| JP | 08-051251 | 2/1996 | |
| JP | 08-056015 | 2/1996 | |
| JP | 08-083956 | 3/1996 | |
| JP | 08-087468 | 4/1996 | |
| JP | 8-250810 A | 9/1996 | |
| JP | 08-330629 | 12/1996 | |
| JP | 08-330630 | 12/1996 | |
| JP | 09-036430 | 2/1997 | |
| JP | 09-083079 | 3/1997 | |
| JP | 09-092880 | 4/1997 | |
| JP | 09-097921 | 4/1997 | |
| JP | 09-116234 | 5/1997 | |
| JP | 09-148678 | * 6/1997 | |
| JP | 09-199762 | 7/1997 | |
| JP | 08-228025 | 9/1997 | |
| JP | 09-232629 | 9/1997 | |
| JP | 09-298341 | 11/1997 | |
| JP | 10-004210 | 1/1998 | |
| JP | 10-145000 | 1/1998 | |
| JP | 10-0841134 | 3/1998 | |
| JP | 10-135514 | 5/1998 | |
| JP | 10-135575 | 5/1998 | |
| JP | 10-145004 | 5/1998 | |
| JP | 10-223983 | 8/1998 | |
| JP | 10-242512 | 9/1998 | |
| JP | 10-242569 | 9/1998 | |
| JP | 10-256662 | 9/1998 | |
| JP | 10-335757 | 12/1998 | |
| JP | 11-031841 | 2/1999 | |
| JP | 11-068155 | 3/1999 | |
| JP | 11-195812 | 7/1999 | |
| JP | 11-243251 | 3/2008 | |
| WO | 99/05728 | 2/1999 | |

OTHER PUBLICATIONS

Shuji Nakamura et al., "InGaN Multiquantum-Well-Structure Laser Diode with GaN-AlGaN Modulation-Doped Strained-Layer Superlaticees", IEEE Journal, vol. 4, No. 3, pp. 483-489.

Takashi Mukai et al., "Amber InGaN-Based Light-Emitting Diodes Operable at High Ambient Temperatures", Jpn. J. Appl. Phys. vol. 37 (1998) pp. L479-L481.

S. Nakamura, "III-V Nitride Based Blue LDs with Modulation-Doped Strained-Layer Superlattices" Compound Semiconductors, 1997 IEEE International Symposium.

Shuji Nakamura et al., "Present Status of InGaN/GaN/AlgaN-Based Laser Diodes," Proceedings of the Second Internaitonal Conference on Nitride Semiconductors, ICNS '97, Oct. 27, 1997.

Shuji Nakamura et al., "InGaN/GaN/AlgaN-Based Laser Diodes with Modulation-Doped Strained-Layer Superlattices," Jpn. J. Appl. Phys. vol. 36 (1997) pp. L1568-L1571, Pt. 2, 12A.

Takashi Mukai et al., "InGaN-Based Blue Light-Emitting Diodes Grown on Epitaxially Laterally Overgrown Gan Substrates", Jpn. J. Appln. Phys. vol. 37 (1998) pp. L839-L841.

* cited by examiner

NITRIDE SEMICONDUCTOR DEVICE

CROSS-REFERENCE TO RELATED APPLICATIONS

This is a Divisional application of U.S. application Ser. No. 11/600,123, filed Nov. 16, 2006, which is a Divisional of U.S. application Ser. No. 09/265,579, filed Mar. 10, 1999, and now U.S. Pat. No. 7,193,246. Both Divisional applications are incorporated herein by reference in its entirety.

FIELD OF INVENTION

This invention is related to light emitting devices such as a light emitting diode (LED) and a laser diode (LD), photodetectors such as a solar cell and an optical sensor, and other nitride semiconductor devices used for electrical devices such as a transistor and a power device (for instance, $In_XAl_YGa_{1-X-Y}N$, $0 \leq X$, $0 \leq Y$, $X+Y \leq 1$).

BACKGROUND OF TECHNOLOGY

A nitride semiconductor has been practically developed as a material of highly luminous blue and pure green LED to fabricate light sources of a full color LED display, a traffic signal, and an image scanner. Those LED devices has a basic structure comprising a substrate of sapphire, a buffer layer made of GaN, n-contact layer made of GaN doped with Si, an active layer made of a single quantum well (SQW) structure of InGaN or made of a multiple quantum well (MQW) structure containing InGaN, a p-cladding layer made of AlGaN doped with Mg, and a p-contact layer made of GaN doped with Mg, subsequently formed thereon. Such LED device has an excellent characteristics that at the forward current of 20 mA, the light emission wavelength is 450 nm, the output is 5 mW, and the external quantum efficiency is 9.1% in case of the blue LED, and the light emission wavelength is 520 nm, the output is 3 mW, and the external quantum efficiency is 6.3% in case of the green LED.

Such nitride semiconductor light emitting device adapts a double hetero-structure with an active layer of a single quantum well or a multiple quantum well structure having a well layer of InGaN.

Also in such nitride semiconductor light emitting device, since the multiple quantum well structure has a plurality of mini-bands which emit light efficiently even with a small current, the device characteristics such as the output of the multiple quantum well structure is expected to be improved as compared with that of the single quantum well structure.

A publication of, for example, the Japanese Laid Open patent publication of H10-135514 discloses a LED device comprising an active layer including a light emitting layer of the multiple quantum well structure with a barrier layer of undoped GaN and a well layer of undoped InGaN, and also including cladding layers with greater bandgap than that of the barrier layer of the active layer, in order to improve the light emission efficiency and the light emission output.

However where the active layer is formed of the multiple quantum well structure, since the total thickness of such active layer is thicker than that of the single quantum well structure, the serial resistivity along the vertical direction becomes high, and in turn, in case of LED device, the Vf (the forward voltage) tends to increase.

A publication of, for example, the Japanese Laid Open patent publication of H9-298341 discloses a technology to reduce the Vf, that is, a laser device comprising a p-side beam waveguide layer and a contact layer which are made of a superlattice structure having an InAlGaN layer over the active layer. This technology is based upon the idea that where, p-side nitride semiconductor layers containing In are formed of the superlattice structure, the carrier concentration of the p-region layers increases and the threshold current of the laser device decreases. However since a quaternary compound such as InAlGaN generally has a poor crystallinity, further it is difficult to make the nitride semiconductor containing In to be p-type, practically such LED device or LD device can be hardly fabricated.

As described above, although the multiple quantum well structure has been expected favorable to increase the luminous output because the light emitting output can be expected to be highly improved, it has been difficult to realize such expected effect of the multiple quantum well structure the active layer of.

It is to be noted that, as for the LD device, the present applicant has announced that a nitride semiconductor laser device with an active layer is successfully fabricated to achieve the continuous oscillation of ten thousands hours or more firstly in the world. (ICNS' 97 Subscript, Oct. 27-31, 1997, P444 to 446, and Jpn. J. Appl. Phys. Vol. 36 (1997) pp. L1568 to 1571, Part 2, No. 12A, 1 Dec. 1997)

However the LED devices used for the light source for illumination such as for the outside display exposed to direct sunshine require the lower Vf and the higher light emission efficiency than those of the conventional LED devices. Also the LD devices used for the light source such as for an optical pick-up require further improvement a lower threshold current to have a longer life.

Recently an another publication of, for example, the Japanese Laid Open patent publication of H8-97468 suggests that in light emitting device made of the nitride semiconductor, instead of a conventional p-contact layer on which a GaN p-electrode is formed; a contact layer made of InGaN of bandgap less than the GaN is grown, so that a barrier between the p-contact layer and the p-electrode is reduced thereby obtaining a good ohmic contact therebetween.

However it is difficult to grow the good crystalline layer of InGaN having less defects, thus the satisfactorily low ohmic contact can be hardly obtained as expected. Further there is an another problem that such contact resistivity of the grown InGaN layers is unstable because of the divergence of the crystallinity of the InGaN layer. Therefore the conventional nitride semiconductor device including a p-contact layer made of InGaN can hardly achieve the satisfactorily low and stable operating voltage and the high light emitting output. As the result, there is a problem, where the LED device comprises the contact layer made of InGaN, that the forward voltage at the forward current of 20 mA falls within a range of 3.4V through 3.8V which is not sufficiently low and also has a great divergence.

In addition, since the device made up of the nitride semiconductor, in its structure, the device may be easily damaged by an electrostatic voltage of 100V which is much lower than that people can feel, a sufficient attention should be paid in handling the device. Therefore in order to enhance the reliability of the nitride semiconductor device, it has been desired to further improve its electrostatic withhold voltage.

SUMMARY OF THE INVENTION

This invention was made in such circumstances, an object of the present invention is to enhance the light emitting output, mainly of the nitride semiconductor devices such as LED and LD devices, and as well as to reduce the Vf and the threshold current thereby improving the light emission efficiency. Improving the light emission efficiency leads to improving the other characteristics of the electronic device made of the nitride semiconductor.

An another object of the present invention is to further enhance the light emitting output by bringing out satisfactorily the property of the active layer of a multiple quantum well structure, and in turn to expand the application of the nitride semiconductor device to various products.

Further an another object of the present invention is to provide the nitride semiconductor device having the low contact resistivity between the p-electrode and the p-contact layer thereby obtaining the high output at the low and stable operating voltage.

Further an another object of the present invention is to provide the nitride semiconductor light emitting device improving the light emitting output and the electrostatic withstand voltage.

A first nitride semiconductor device of the present invention can reduce the Vf or the threshold current to improve the light emitting output by composing the device as described hereinafter.

The first nitride semiconductor device of the present invention comprises an n-region having a plurality of nitride semiconductor films, a p-region having a plurality of nitride semiconductor films, and an active layer interposed between the n-region and the p-region. At least one of the nitride semiconductor layers of the n-region has an n-side multi-film layer comprising first nitride semiconductor films containing In and second nitride semiconductor films having different composition from those of the first nitride semiconductor films. Each of the first nitride semiconductor films, and each of the second nitride semiconductor films are laminated alternately and at least one of the first nitride semiconductor film and the second nitride semiconductor having the thickness less than 100 angstroms.

In the first nitride semiconductor device of the present invention, the thickness of the first and second nitride semiconductor films are 100 angstroms or less, preferably 70 angstroms or less, more preferably 50 angstroms. As such, by thinning the films, the multi-film layer has a superlattice structure to improve the crystallinity and in turn the output. It is to be noted that the active layer is made of the nitride semiconductor containing at least In, preferably made of InGaN having a single quantum well structure or a multiple quantum well structure.

In the first nitride semiconductor device of the present invention, it is preferable that the first nitride semiconductor films are made of $In_xGa_{1-x}N$ (0<x<1) and the second nitride semiconductor films are made of $In_yGa_{1-y}N$ (0≦y<1, y<x).

Further, in the first nitride semiconductor device of the present invention, the adjacent first nitride semiconductor films may differ in thickness each other or the adjacent second nitride semiconductor films may differ in thickness each other. Thus where the multi-film layer is alternately laminated with a plurality of first and second nitride semiconductor film, two of the first (second) nitride semiconductor film sandwiching a second (first) nitride semiconductor film may have different thickness from each other.

Further, in the first nitride semiconductor device of the present invention, the adjacent first nitride semiconductor films may differ in content of Group III element each other or the adjacent second nitride semiconductor films may differ in content of Group III element each other. Thus where the multi-film layer is alternately laminated with a plurality of first and second nitride semiconductor film, two of the first (second) nitride semiconductor film sandwiching a second (first) nitride semiconductor film may have different composition ratio of Group III element.

Further, in the first nitride semiconductor device of the present invention, the n-side multi-film layer may be spaced away from the active layer, but preferably are formed in contact with the active layer in order to improve the output.

Further, in the first nitride semiconductor device of the present invention, the first nitride semiconductor films are not doped with an impurity and the second nitride semiconductor films are not doped with the impurity. The term of "undoped" represents the status not being doped intentionally, which includes the status even where the impurity is diffused from the adjacent nitride semiconductor layers according to the present invention. The impurity concentration due to such diffused impurity often has a gradient concentration in the layers.

Further, in the first nitride semiconductor device of the present invention, the n-type impurity is doped in either of the first nitride semiconductor films and the second nitride semiconductor films. This is referred to as a modulation dope, and by being modulation doped, also the output can be improved. It is to be noted that the n-type impurity can be selected from Group IV and Group VI elements such as Si, Ge, Sn, and S, and preferably Si or Sn is used for the n-type impurity.

Further, in the first nitride semiconductor device of the present invention, the n-type impurity is doped in both of the first nitride semiconductor films and the second nitride semiconductor films. Where the n-type impurity is doped, the concentration is adjusted to be $5 \times 10^{21}/cm^3$ or less, preferably $1 \times 10^{20}/cm^3$ or less. Where it is more than $5 \times 10^{21}/cm^3$, the nitride semiconductor film has a poor crystallinity so that the output tends to be reduced, on the contrary. This is also adapted for the case where the modulation dope is used.

Further, in the first nitride semiconductor device of the present invention, the nitride semiconductor layers of the p-region has a p-side multi-film layer comprises third nitride semiconductor films containing Al and fourth nitride semiconductor films having different composition from those of the third nitride semiconductor films. Each of the third nitride semiconductor films and each of the fourth nitride semiconductor films are laminated alternately and at least one of the third nitride semiconductor films and the fourth nitride semiconductor films have the thickness of 100 angstroms or less, preferably 70 angstroms or less, more preferably 50 angstroms. As such, by thinning the films, the multi-film layer has a superlattice structure to improve the crystallinity and in turn the output.

Further, in the first nitride semiconductor device of the present invention, the third nitride semiconductor films are preferably made of $Al_aGa_{1-a}N$ (0<a≦1) and the fourth nitride semiconductor films are made of $In_bGa_{1-b}N$ (0≦b<1, b<a). More preferably the fourth nitride semiconductor films are made of GaN.

Further, in the first nitride semiconductor device of the present invention, the adjacent third nitride semiconductor films may differ in thickness each other or the adjacent fourth nitride semiconductor films may differ in thickness each other. Thus where the multi-film layer is alternately laminated with a plurality of third and fourth nitride semiconductor film, two of the third (fourth) nitride semiconductor film sandwiching a fourth (third) nitride semiconductor film may have different thickness from each other.

Further, in the first nitride semiconductor device of the present invention, the adjacent third nitride semiconductor films differ in content of Group III element each other or the adjacent fourth nitride semiconductor films differ in content of Group III element each other. Thus where the multi-film layer is alternately laminated with a plurality of third and fourth nitride semiconductor film, two of the third (fourth) nitride semiconductor film sandwiching a fourth (third) nitride semiconductor film may have different composition ratio of Group III element.

Further, in the first nitride semiconductor device of the present invention, the p-side multi-film layer may be spaced away from the active layer, but preferably are formed in contact with the active layer in order to improve the output.

Further, in the first nitride semiconductor device of the present invention, the third nitride semiconductor films are not doped with an impurity and the fourth nitride semiconductor films are not doped with the impurity. Where the p-side multi-film layer is undoped, its thickness is preferably 0.1 µm or less. Where the thickness is more than 0.1 µm, the electron holes are difficult to be injected, the output tends to be reduced. It is to be noted that the definition of the "undope" is the same as described above for the n-type multi-film layer.

Further, in the first nitride semiconductor device of the present invention, the p-type impurity may be doped in either of the third nitride semiconductor film and the fourth nitride semiconductor film. It is to be noted that the p-type impurity can be selected from Group II elements such as Mg, Zn, Cd, Be, and Ca, and preferably Mg or Be is used for the p-type impurity.

Further, in the first nitride semiconductor device of the present invention, the n-type impurity is doped in both of the third nitride semiconductor film and the fourth nitride semiconductor film. Where the p-type impurity is doped, the concentration is adjusted to be $1 \times 10^{22}/cm^3$ or less, preferably $5 \times 10^{20}/cm^3$ or less. Where it is more than $1 \times 10^{22}/cm^3$, the nitride semiconductor film has a poor crystallinity so that the output tends to be reduced. This is also adapted for the case where the modulation dope is used.

According to the second through fifth nitride semiconductor devices of the present invention as described hereinafter, the nitride semiconductor devices with the active layer made of the multiple quantum well structure can improve the light emitting output thereof thereby contributing an expanded application of the nitride semiconductor device.

The second nitride semiconductor device of the present invention, comprises an n-region having a plurality of nitride semiconductor films, a p-region having a plurality of nitride semiconductor films, and an active layer interposed between the n-region and the p-region. At least one of the nitride semiconductor layers of the n-region is an n-side multi-film layer comprising two kinds of nitride semiconductor film which are mutually different in bandgap and in concentration of the n-type impurity. The two kinds of nitride semiconductor film are laminated alternately. At least one of the nitride semiconductor layers of the p-region is a p-side multi-film cladding layer comprising third and fourth nitride semiconductor films which are mutually different in bandgap and containing respectively p-type impurity. Each of the third nitride semiconductor films and each of the fourth nitride semiconductor films are laminated alternately. The active layer is multiple quantum well structure of $In_aGa_{1-a}N$ (0≦a<1).

The third nitride semiconductor device of the present invention, comprises an n-region having a plurality of nitride semiconductor films, a p-region having a plurality of nitride semiconductor films, and an active layer interposed between the n-region and the p-region. At least one of the nitride semiconductor layers of the n-region is an n-side multi-film layer comprising two kinds of the nitride semiconductor film which are mutually different in concentration of the n-type impurity and having same composition. And the two kinds of nitride semiconductor film are laminated alternately. At least one of the nitride semiconductor layers of the p-region is a p-side multi-film cladding layer comprising third and fourth nitride semiconductor films being mutually different in bandgap and containing respectively the p-type impurity. Each of the third nitride semiconductor films and each of the fourth nitride semiconductor films are laminated alternately. And the active layer is multiple quantum well structure of $In_aGa_{1-a}N$ (0≦a<1).

And in the second and third nitride semiconductor device of the present invention, the third nitride semiconductor films and the fourth nitride semiconductor films may differ or be same in concentration of the p-type impurity.

The fourth nitride semiconductor device of the present invention, comprises an n-region having a plurality of nitride semiconductor films, a p-region having a plurality of nitride semiconductor films, and an active layer interposed between the n-region and the p-region. At least one of the nitride semiconductor layers of the n-region is an n-side multi-film layer comprising two kinds of nitride semiconductor film differing in concentration of an n-type impurity and having same composition, the two kinds of nitride semiconductor film are laminated alternately. At least one of the nitride semiconductor layers of the p-region is a p-side single-layered cladding layer composed of $Al_bGa_{1-b}N$ (0≦b≦1). And the active layer is multiple quantum well structure of $In_aGa_{1-a}N$ (0≦a<1).

In the third and fourth nitride semiconductor devices of the present invention, preferably the two kinds of nitride semiconductor film are made of GaN.

The fifth nitride semiconductor device of the present invention, comprises an n-region having a plurality of nitride semiconductor films, a p-region having a plurality of nitride semiconductor films, and an active layer interposed between the n-region and the p-region. At least one of the nitride semiconductor layers of the n-region is an n-side multi-film layer comprising two kinds of nitride semiconductor film differing in bandgap and in concentration of n-type impurity, the two kinds of nitride semiconductor film being laminated alternately. At least one of the nitride semiconductor layers, of the p-region is a p-side single-layered cladding layer composed of $Al_bGa_{1-b}N$ (0≦b≦1). And the active layer is multiple quantum well structure of $In_aGa_{1-a}N$ (0≦a<1).

In the second through fifth nitride semiconductor devices of the present invention, preferably the devices further comprises a second n-side multi-film layer between the active layer and the first n-side multi-film layer. The second n-side multi-film layer comprises first nitride semiconductor films containing In and second nitride semiconductor films of composition different from the first nitride semiconductor films. Each of the first nitride semiconductor films and each of the second nitride semiconductor films are laminated alternately.

Further the second through fifth nitride semiconductor devices of the present invention may further comprise an n-contact layer containing the n-type impurity between the first n-side multi-film layer and a substrate in the n-region.

Further in the second through fifth nitride semiconductor devices of the present invention, preferably, the n-contact layer is formed on an undoped GaN layer.

Further in the second through fifth nitride semiconductor devices of the present invention, preferably, the undoped GaN layer may be formed on a buffer layer of $Ga_dAl_{1-d}N$ (0<d≦1) grown at low temperature and the GaN p-contact layer is formed on the p-side multi-film cladding layer or the p-side single-layered cladding layer.

Thus the second through fifth nitride semiconductor devices of the present invention are formed by interposing the active layer of a multiple quantum well structure between the first n-side multi-film layer including two kinds of nitride semiconductor films with the different n-type impurity concentration in the n-region, and the p-side multi-film layer having the third and fourth nitride semiconductor films or the p-cladding layer of the single-layered structure of the composition of $Al_bGa_{1-b}$ ($0 \leq b \leq 1$) doped with the p-type impurity, thereby improving the light emission efficiency.

As such, combination of a plurality of nitride semiconductor layers having particular composition and structure brings out the performance of the active layer made of the quantum well structure. Preferable combination of the nitride semiconductor films with the active layer made of the quantum well structure will be described hereinafter.

In the second through fifth nitride semiconductor devices of the present invention, the devices comprises a second n-side multi-film layer between the active layer and the first n-side multi-film layer. The second n-side multi-film layer comprises first nitride semiconductor films containing In and second nitride semiconductor films of composition different from the first nitride semiconductor films. In such case, the light emitting output can be further improved, and the Vf can be reduced so that the light emitting output can be further improved.

Further where the second through fifth nitride semiconductor devices of the present invention comprise an n-contact layer containing the n-type impurity between the first n-side multi-film layer and a substrate in the n-region, the light emitting output can be improved, and the Vf can be reduced.

Further in the second through fifth nitride semiconductor devices of the present invention, where the n-contact layer is formed on an undoped GaN layer, since the undoped GaN layer has a good crystallinity, in turn, the crystallinity of the n-contact layer on which the n-electrode is formed can be improved, as well as the crystallinity of other nitride semiconductor layers formed on the n-contact layer such as the active layer can be improved. Therefore the light emitting output can be improved.

Further in the second through fifth nitride semiconductor devices of the present invention, where the undoped GaN layer is formed on a buffer layer of $Ga_dAl_{1-d}N$ ($0 < d \leq 1$) grown at low temperature, the crystallinity of the undoped GaN layer can be further improved so that the light emitting output can be further improved. Also where the GaN p-contact layer is formed on the p-side multi-film cladding layer or the p-side single-layered cladding layer, a good p-type conductivity and a good ohmic contact between the p-side GaN contact layer and the p-electrode formed thereon can be obtained so that the light emitting output can be improved.

The sixth nitride semiconductor devices of the present invention was completed finding that where the device comprised a p-contact layer containing In made of a superlattice structure, it was formed of a good crystallinity with less crystal defect. The device provides with the nitride semiconductor device with a low operating voltage and a stable and high output.

Thus the sixth nitride semiconductor devices of the present invention, comprises an n-region having a plurality of nitride semiconductor layers, a p-region having a plurality of nitride semiconductor layers containing a p-contact layer, and an active layer interposed between the n-region and the p-region. In the sixth nitride semiconductor devices of the present invention, the contact layer is superlattice structure of the first nitride semiconductor films and second nitride semiconductor films of composition different from the first nitride semiconductor film. At least one of the first nitride semiconductor films and second nitride semiconductor films contains In.

Thus the contact resistibility between the p-electrode and the p-contact layer can be reduced so that high output can be obtained at a low operating voltage.

Further in the sixth nitride semiconductor devices of the present invention, preferably a composition inclined layer having a composition varying continuously from the first nitride semiconductor film to the second nitride semiconductor film is formed between the first nitride semiconductor film and the second nitride semiconductor film. As the result, the crystallinity of the p-contact layer can be further improved.

Further in the sixth nitride semiconductor devices of the present invention, preferably the first nitride semiconductor films and the second nitride semiconductor films contain In, and the first nitride semiconductor films contains more In than that in the second nitride semiconductor films. Such formed p-contact layer has a lower resistivity.

Further in the sixth nitride semiconductor devices of the present invention, preferably the first nitride semiconductor films are made of $In_xGa_{1-x}N$ and the second nitride semiconductor films are made of $Al_yGa_{1-y}N$ ($0 \leq y < 1$).

Further in the sixth nitride semiconductor devices of the present invention, ones of the first nitride semiconductor films and the second nitride semiconductor films may be doped with the p-type impurity and the others may not be doped with the p-type impurity.

Further in the sixth nitride semiconductor devices of the present invention, where both of the first and second nitride semiconductor films are doped, preferably ones of the first nitride semiconductor films and the second nitride semiconductor films are doped with p-type impurity in the range of $1 \times 10^{19}/cm^3$ through $5 \times 10^{21}/cm^3$, the others are doped with p-type impurity in the range of $5 \times 10^{18}/cm^3$ through $5 \times 10^{19}/cm^3$ and the content of p-type impurity in the ones is larger than the content of p-type impurity in the others.

Further in the sixth nitride semiconductor devices of the present invention, preferably one of the first nitride semiconductor films is formed at the uppermost and the p-electrode is formed on the one of the third nitride semiconductor films. In this case, the p-type impurity concentration in the first, nitride semiconductor films is more than that in the second nitride semiconductor films.

Further the sixth nitride semiconductor devices of the present invention, further may comprise a p-side cladding layer containing Al between the p-type contact layer and the active layer.

Further in the sixth nitride semiconductor devices of the present invention, preferably the p-type cladding layer has superlattice structure of $Al_xGa_{1-x}N$ ($0 < x \leq 1$) layers and $In_yGa_{1-y}N$ ($0 \leq y < 1$) layers, and each of the $Al_xGa_{1-x}N$ layers and each of the $In_yGa_{1-y}N$ ($0 \leq y < 1$) layers are laminated alternately.

As described above, since the sixth nitride semiconductor devices of the present invention comprises the contact layer of a superlattice structure including the first nitride semiconductor films and second nitride semiconductor films of composition different from the first nitride semiconductor film. At least one of the first nitride semiconductor films and second nitride semiconductor films contains In. Thus a p-contact layer of a good crystallinity with less crystal defects can be formed to reduce its resistivity and the contact resistibility between the p-electrode and the p-contact layer can be reduced so that high output can be obtained at a stable and low operating voltage.

According to the seventh and eighth nitride semiconductor devices of the present invention as described hereinafter, the nitride semiconductor devices with the active layer made of the multiple quantum well structure can improve the light emitting output and the electrostatic withstand voltage thereof thereby contributing an expanded application of the nitride semiconductor device.

Thus the seventh nitride semiconductor devices of the present invention comprises an n-region having a plurality of nitride semiconductor layers, a p-region having a plurality of nitride semiconductor layers, and an active layer interposed between the n-region and the p-region.

In the seventh nitride semiconductor devices of the present invention, at least one of the nitride semiconductor layers of the n-region is an n-side multi-film layer comprising a lower layer of undoped nitride semiconductor, middle layer of nitride semiconductor with n-type impurity and upper layer of undoped nitride semiconductor, and the under layer, the middle layer and the upper layer are laminated in turn. And at least one of the nitride semiconductor layers of the p-region is a p-side multi-film cladding layer comprising third and fourth nitride semiconductor films are mutually different in bandgap and containing respectively p-type impurity, and each of the third nitride semiconductor films and each of the fourth nitride semiconductor films are laminated alternately. And the active layer is multiple quantum well structure of $In_aGa_{1-a}N$ ($0 \leq a < 1$).

In the seventh nitride semiconductor devices of the present invention, the third nitride semiconductor films and the fourth nitride semiconductor films may be different or same in concentration of p-type impurity.

The eighth nitride semiconductor devices of the present invention comprises an n-region having a plurality of nitride semiconductor layers, a p-region having a plurality of nitride semiconductor layers, an active layer interposed between the n-region and the p-region.

In the eighth nitride semiconductor devices of the present invention, at least one of the nitride semiconductor layers of the n-region is an n-side multi-film layer comprising a lower layer of Undoped nitride semiconductor, middle layer of nitride semiconductor with n-type impurity and upper layer of undoped nitride semiconductor, and the under layer, the middle layer and the upper layer are laminated in turn. At least one of the nitride semiconductor layers of the p-region is a p-side single-layered cladding layer composed of $Al_bGa_{1-b}N$ ($0 < b \leq 1$). The active layer is multiple quantum well structure of $In_aGa_{1-a}N$ ($0 \leq a < 1$).

In the seventh and eighth nitride semiconductor devices of the present invention, the under layer has a thickness in the range of 100 through 10000 angstroms, the middle layer has a thickness in the range of 50 through 1000 angstroms and the upper layer has a thickness in the range of 25 through 1000 angstroms.

The seventh and eighth nitride semiconductor devices of the present invention, preferably, further comprise a second n-side multi-film layer between the active layer and the first n-side multi-film layer, the second n-side multi-film layer comprising first nitride semiconductor films containing In and second nitride semiconductor films of composition different from the first nitride semiconductor films, and each of the first nitride semiconductor films and each of the second nitride semiconductor films are laminated alternately.

Further the seventh and eighth nitride semiconductor devices of the present invention may further comprise an n-contact layer containing n-type impurity between the first n-side multi-film layer and the substrate in the n-region.

Further in the seventh and eighth nitride semiconductor devices of the present invention, preferably the n-contact layer is formed on an undoped GaN layer.

Further in the seventh and eighth nitride semiconductor devices of the present invention, the undoped GaN layer may be formed on a buffer layer of $Ga_dAl_{1-d}N$ ($0 < d \leq 1$) grown at low temperature and GaN n-contact layer doped with Mg may be formed on the p-side multi-film cladding layer or the p-side single-layered cladding layer.

Thus the seventh and eighth nitride semiconductor devices of the present invention are formed by interposing the active layer of a multiple quantum well structure between the first, n-side multi-film layer including the undoped under layer, the middle layered doped with the n-type impurity and the undoped upper layer in the n-region, and the p-side multi-film layer having the third and fourth nitride semiconductor films or the p-cladding layer of the single-layered structure of the composition of $Al_bGa_{1-b}N$ ($0 \leq b \leq 1$) doped with the p-type impurity, thereby improving the light emission efficiency so that the device is formed of the nitride semiconductor with a good light emitting output and a good electrostatic withstand voltage.

As such, combination of a plurality of nitride semiconductor layers having particular composition and structure brings out the performance of the active layer made of the quantum well structure and leads to the improved electrostatic withstand voltage.

Furthermore, in the present invention, the thickness of each film composing the first n-side multi-film layer may be selected from particular ranges, respectively and combined to form the multi-film layer, so that the light emitting output and the electrostatic withstand voltage can be improved.

It is to be noted that the term "undoping" referred to herein is intended to speak of a condition in which no impurity is purposefully doped and the presence of impurity admixed as a result of diffusion from the neighboring nitride semiconductor film or films or as a result of contamination from the row material or the equipment is to be understood as representing the undoped condition for the purpose of the present invention. The impurity admixed as a result of the diffusion may often be found in the layer having a progressively varying concentration.

Preferable combination of the nitride semiconductor films with the active layer made of the quantum well structure will be described hereinafter.

In this invention, where a second n-side multi-film layer is formed between the active layer and the first n-side multi-film layer, and the second n-side multi-film layer comprising first nitride semiconductor films containing In and second nitride semiconductor films of composition different from the first nitride semiconductor films, the light emitting output can be further improved the light emission efficiency as well as further reduced the forward voltage (referred to as the Vf).

Further where the nitride semiconductor device of the present invention further comprises an n-contact layer containing n-type impurity between the first n-side multi-film layer and the substrate in the n-region, the light emission output can be improved and the Vf can be reduced.

Further where the n-contact layer is formed on an undoped GaN layer in this invention, the undoped GaN layer is formed of a layer with a good crystallinity, and the crystallinity of the n-contact layer on which the n-electrode is formed is improved. Also the crystallinity of the nitride semiconductor layers which are formed on the n-contact layer such as the active layer and other nitride semiconductor layers can be, in turn, improved so that the light emission output can be improved.

Further where the undoped GaN layer is formed on a buffer layer of $Ga_dAl_{1-d}N$ ($0 < d \leq 1$) grown at low temperature, the crystallinity of the undoped GaN layer can be improved, and in turn the crystallinity of the n-contact layer or the like can be improved so that the light emission output can be improved.

Further where the GaN p-contact layer doped with Mg is formed on said p-side multi-film cladding layer or said p-side single-layered cladding layer, since a good p-type characteristics can be easily obtained, a good ohmic contact between the GaN p-contact layer and the p-electrode formed thereon can be obtained, as the result, the light emission output can be improved.

The ninth through eleventh nitride semiconductor devices of the present invention comprise an n-region and a p-region that includes a plurality of nitride semiconductor films. The composition and the number of laminating the films are made asymmetric so that the light emission output and the electrostatic withstand voltage are enhanced and the Vf is reduced, thereby contributing an expanded application of the nitride semiconductor device.

Thus ninth nitride semiconductor devices of the present invention comprise an n-region and a p-region that includes a plurality of nitride semiconductor films, and an active layer interposed between the n-region and the p-region. At least one of the nitride semiconductor layers of the n-region is an n-side multi-film layer comprising nitride semiconductor films laminated and at least one of the nitride semiconductor layers of the p-region is a p-side multi-film layer comprising nitride semiconductor films laminated. The n-side multi-film layer and the p-side multi-film layer are different in composition.

Thus tenth nitride semiconductor devices of the present invention comprise an n-region and a p-region that includes a plurality of nitride semiconductor films, and an active layer interposed between the n-region and the p-region. At least one of the nitride semiconductor layers of the n-region is an h-side multi-film layer comprising nitride semiconductor films laminated and at least one of the nitride semiconductor layers of the p-region is a p-side multi-film layer comprising nitride semiconductor films laminated. The n-side multi-film layer and the p-side multi-film layer are different in number of laminating.

Thus eleventh nitride semiconductor devices of the present invention comprise an n-region and a p-region that includes a plurality of nitride semiconductor films, and an active layer interposed between the n-region and the p-region. At least one of the nitride semiconductor layers of the n-region is an n-side multi-film layer comprising nitride semiconductor films laminated and at least one of the nitride semiconductor layers of the p-region is a p-side multi-film layer comprising nitride semiconductor films laminated. The n-side multi-film layer and the p-side multi-film layer are different in composition and in number of laminating.

In the ninth through eleventh nitride semiconductor devices of the present invention, preferably the number of laminating of the p-side multi-film layer is smaller than that of the n-side multi-film layer.

In the ninth through eleventh nitride semiconductor devices of the present invention, preferably the n-side multi-film layer contains $Al_zGa_{1-z}N$ ($0 \leq z < 1$) and $In_pGa_{1-p}N$ ($0 < p < 1$), and the p-side multi-film layer contains $Al_xGa_{1-x}N$ ($0 < x < 1$) and $In_yGa_{1-y}N$ ($0 \leq y < 1$).

Further in the ninth through eleventh nitride semiconductor devices of the present invention, at least one of the n-side multi-film layer and the p-side multi-film layer is a modulation doped layer.

Thus the ninth through eleventh nitride semiconductor devices of the present invention, as described above, comprises the active layer interposed between the n-side multi-film layer in the n-region and the p-side multi-film layer in the p-region, both multi-film layers includes a plurality of films with different composition and the number of laminating films. Specifying the layer structures around the active layer, bring out the performance of the nitride semiconductor device with the light emission output improved, the Vf reduced, and the electrostatic withstand voltage improved.

The active layer made of the multiple quantum well structure had a possibility to intensify the light emitting output, there was a difficulty to satisfactory bring out the performance of the multiple quantum well structure.

Against the difficulty, in order to bring out the performance of the active layer of the quantum well structure, the inventors have studied many cases and found that films in contact with or adjacent to the active layer which compose the n-side multi-film layer and the p-side multi-film layer brought out the performance of the active layer of the multiple quantum well structure, so that the high luminous output could be achieved, the Vf can be reduced, and the electrostatic withstand voltage can be improved.

The reason has not yet specified, but probably it is to be understood because the multi-film layer improves the crystallinity of the multi-film layer, the active layer, and the p-electrode, in cooperation with that, the difference of the crystal property of the n-side and p-side multi-film layers due to the different composition and/or number of laminating films preferably affects the device as a whole so that the device characteristics such as the luminous output, the Vf, and the electrostatic withstand voltage are improved.

In the ninth through eleventh nitride semiconductor devices of the present invention, the term "multi-film layer" is referred to as a layer with at least two laminating films that have different composition at least from each other. Thus the contacting two films have different composition, a plurality of such films are formed.

In the ninth through eleventh nitride semiconductor devices of the present invention, difference between the n-side and p-side multi-film, layers means that the total composition of one of the multi-film layer with a plurality of films is different from that of the other multi-film layer, even where the one of those films in the n-region is the same as that in the p-region. Thus the composition of the n-side and p-side multi-film layer may be partially identical but the composition of those nitride semiconductors are adjusted not to be exactly same each other.

For example, difference of the composition mans that elements composing the nitride semiconductor (kinds of elements of the binary or ternary compound), composition ratios of elements, or the bandgaps are different. It is to be noted that those values are an average value of the multi-film layer.

Further in the ninth through eleventh nitride semiconductor devices of the present invention, where the numbers of laminating films are different, one of the n-side or p-side multi-film layer may have more number of laminating films than the other.

Further in the ninth through eleventh nitride semiconductor devices of the present invention, where the number of laminating films composing the p-side multi-film layer is fewer than that composing the n-side multi-film layer, then the luminous output, the Vf, and the electrostatic withstand voltage can be preferably improved.

Further in the ninth through eleventh nitride semiconductor devices of the present invention, the number of laminating films composing the p-side multi-film layer is fewer than that composing the n-side multi-film layer Further in the ninth through eleventh nitride semiconductor devices of the present invention, where the n-side multi-film layer, contains $Al_zGa_{1-z}N$ ($0 \leq z < 1$) and $In_pGa_{1-p}N$ ($0 < p < 1$), and the p-side multi-film layer contains $Al_xGa_{1-x}N$ ($0<x<1$) and $In_yGa_{1-y}N$ ($0 \leq y<1$), then the luminous output, the Vf, and the electrostatic withstand voltage can be preferably improved.

Further in the ninth through eleventh nitride semiconductor devices of the present invention, where the p-side and/or n-side multi-film layer are modulation doped, then the luminous output, the Vf, and the electrostatic withstand voltage can be preferably improved.

Further in the ninth through eleventh nitride semiconductor devices of the present invention, the modulation dope means the closest same type films are doped with an impurity to different concentration. Thus it means that ones of the nitride semiconductor films may be undoped and the others are doped with the impurity, also where both of nitride semiconductor films are doped with the impurity, the closest films may have different impurity concentration from each other.

Further in the ninth through eleventh nitride semiconductor devices of the present invention, where the composition of n-side multi-film layer is different from that of the p-side multi-film layer, the number of laminating films composing the n-side multi-film layer may be same as or different from that of the p-side multi-film layer. Preferably they are different from each other, and more preferably the number of laminating films composing the p-side multi-film layer is fewer than that composing the n-side multi-film layer so that the luminous output, the Vf, and the electrostatic withstand voltage can be preferably improved.

Also in the present invention, where the number of laminating films composing the n-side multi-film layer is different from that composing the p-side multi-film layer, the composition of the n-side multi-film layer is different from that of the p-side multi-film layer in order to obtain above-mentioned effect of the present invention.

Also in the present invention, where the number of laminating films, composing the n-side multi-film layer is different from that composing the p-side multi-film layer, numbers of laminating films composing the m-side and p-side multi-film layer are not specifically limited, and any numbers may be adapted as long as they are different from each other. Preferably as described above, the number of laminating films composing the p-side multi-film layer is fewer than that composing the n-side multi-film layer in order to obtain above-mentioned effect of the present invention.

BEST MODE FOR CARRYING OUT THE INVENTION

Some preferred embodiments of the present invention will be described in detail hereinafter with reference to the accompanying drawings.

Embodiment 1

Figure 1:
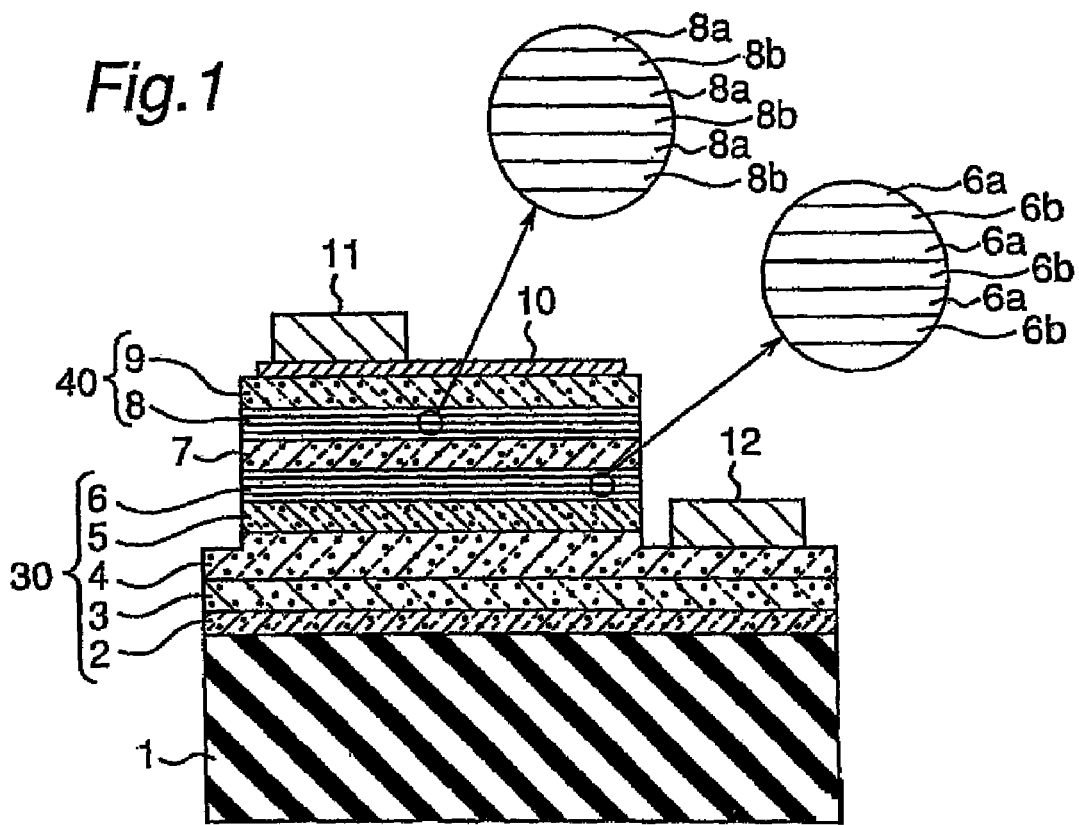
FIG. 1 is a schematic sectional view showing the structure of a nitride semiconductor device (LED device) according to the first embodiment of the present invention.

FIG. 1 is a schematic sectional view showing the structure of a nitride semiconductor device (LED device) according to, a first embodiment of the present invention. This LED device comprises a sapphire substrate 1 having one surface deposited successively in this order with a first buffer layer 2 made of GaN and closest to the substrate surface, a second buffer layer 3 made of undoped GaN, an n-contact layer 4 of GaN doped with Si, a third buffer layer 5 of undoped GaN, an n-side multi-film layer 6 in the form of an InGaN/GaN superlattice structure, an active layer 7 of a multi quantum well structure made of InGaN/GaN, a p-side multi-film layer 8 in the form of an AlGaN/GaN superlattice structure, and a p-contact layer 9 of GaN doped with Mg that is remotest from the substrate surface.

The LED device according to the first embodiment has the active layer 7 of the multi quantum well structure sandwiched between an n-region 30 including the first buffer layer 2, the second buffer layer 3, the n-contact layer 4, the third buffer layer 5 and the n-side multi-film layer 6, and a p-region 40 including the p-side multi-film layer 8 and the p-contact layer 9.

The nitride semiconductor device according to the first embodiment includes the n-side multi-film layer 6 beneath the active layer 7 in the n-region depositing, as shown in FIG. 1, a first nitride semiconductor film 6a containing In and a second nitride semiconductor film 6b of a composition different from that of the first nitride semiconductor film 6a. The n-side multi-film layer 6 includes at least one of each of the first nitride semiconductor film 6a and the second nitride semiconductor film 6b, and preferably includes more than three films in total and more preferably at least two of each film 6a and 6b, i.e. more than 4 films in total. Where the n-side multi-film layer 6 is formed in contact with the active layer 7 such as shown, one of the nitride semiconductor films 6a and 6b which is held in contact with an initial layer (a well or a barrier layer) of the active layer may be either the first nitride semiconductor film 6a or the second nitride semiconductor film 6b. And the depositing sequence of the nitride films 6a and 6b in the n-side multi-film layer 6 may be arbitrarily chosen. Also, although the n-side multi-film layer 6 is formed in direct contact with the active layer 7 in the illustrated embodiment, an another layer made of an n-type nitride semiconductor may intervene between the n-side multi-film layer 6 and the active layer 7. At least one of the or each first nitride semiconductor film 6a and the or each second nitride semiconductor film 6b is designed to have a film thickness not greater than 100 angstroms, preferably not greater than 70 angstroms, and more preferably not greater than 50 angstroms. When the film has thickness within the above-mentioned range, since the film is thinner than a critical elastic thickness, a crystallinity of the first or second nitride semiconductor film deposited on such thin film can be improved thereby improving the crystallinity of the n-side multi-film layer as a whole, to increase the output capability of the device.

The or each first nitride semiconductor film 6a is made of a nitride semiconductor containing In, preferably a ternary compound which is expressed by the following formula of $In_xGa_{1-x}N$ ($0<X<1$) wherein x is preferably not greater than 0.5 and more preferably not greater than 0.1. On the other hand, the or each second nitride semiconductor film 6b may be made of any suitable nitride semiconductor, provided that the latter is different from that used for the or each first nitride semiconductor film 6a. In order, however, for the or each second nitride semiconductor film 6b of an excellent crystallinity to be grown, a nitride semiconductor of a binary or ternary compounds having a bandgap higher than the or each first nitride semiconductor film 6a has to be developed, although not exclusively limited thereto. If among the various nitride semiconductors, GaN is chosen as a material for the or each second nitride semiconductor film 6b, the multi-film layer having an excellent crystallinity can be formed. Accordingly, the use of $In_xGa_{1-x}N$, wherein x is not greater than 0.5, for the or each first nitride semiconductor film 6a and GaN for the or each second nitride semiconductor film 6b is a preferred combination of materials.

In a preferred embodiment, any one of the first and second nitride semiconductor films has a film thickness not greater than 100 angstroms, preferably not greater than 70 angstroms and more preferably not greater than 50 angstroms. Selection of the film thickness not greater than 100 angstroms for each of the first and second nitride semiconductor films means that the respective nitride semiconductor film can have a film thickness not greater than the critical elastic-thickness and, therefore, the nitride semiconductor having an excellent crystallinity can be grown as compared with the case in which it is grown into a thick film. Selection of the film thickness not greater than 70 angstroms is effective to cause the multi-film layer to have a superlattice structure and, therefore, when the active layer is subsequently grown on this superlattice multi-film layer having an excellent crystallinity, the multi-film layer can have a function similar to that of a buffer layer allowing the active layer to be grown having an excellent crystallinity.

In another preferred embodiment, at least one of the first and second nitride semiconductor films can have a film thickness different from that of the next adjacent one of the first and second nitride semiconductor films that adjoin such one of the first and second nitride semiconductor films. By way of example, assuming that the or each first nitride semiconductor film is made of InGaN and the or each second nitride semiconductor film is made of GaN, the or each InGaN layer intervening between the neighboring GaN layers may have a varying film thickness either increasing or decreasing as the distance thereof to the active layer decreases. By so doing, the multi-film layer can have a varying index of refraction with the nitride semiconductor films having different indexes of refraction and, hence, the multi-film layer can exhibit the substantially same effects as those of a grading composition nitride semiconductor layer. Accordingly, in a semiconductor device such as a semiconductor laser of a type requiring the use of a beam waveguide, the multi-film layer can provide the beam waveguide to adjust the mode of the laser beam.

Also, at least one of the first and second nitride semiconductor films may contain Group III elements of a composition that is different from that in the next adjacent first or second nitride semiconductor film. By way of example, assuming that the first nitride semiconductor films are made of InGaN and the second nitride semiconductor films are made of GaN, the amount of In contained in the InGaN layer intervening between the neighboring GaN layers may be increased or decreased as the distance thereof to the active layer decreases. In such case, as is the case with the use of the differing film thickness discussed above, the multi-film layer can have a varying index of refraction with the nitride semiconductor films having different indexes of refraction and, hence, the multi-film layer can exhibit the substantially same effects as those of a grading composition nitride semiconductor layer. It is to be noted that the index of refraction tends to decrease with decrease of the amount of In used.

Again, in the practice of the first preferred embodiment, one or both of the first and second nitride semiconductor films may be either undoped or doped with n-type impurity. To enhance the crystallinity, the first and second nitride semiconductor films are preferably undoped, but may be modulation doped, or both of the first and second nitride semiconductor films may be doped with the n-type impurity. Where both of the first and second nitride semiconductor films are doped with the n-type impurity, the concentration of the n-type impurity in the or each first nitride semiconductor film may be different from that in the or each second nitride semiconductor film.

In the first preferred embodiment of the present/invention, as shown in FIG. 1, the p-region atop the active layer 7 has the p-side multi-film layer 8 comprised of an alternating structure comprised of a third nitride semiconductor film 8a containing Al and a fourth nitride semiconductor film 8b of a composition different from the first nitride semiconductor film 8a. Specifically, as is the case with the n-side multi-film layer 6, the number of the third or fourth nitride semiconductor films 8a or 8b may not be limited to three with the total number of those films 8a and 8b being six as shown, but may be one or more with the minimum total number of those films 8a and 8b being three or preferably four or more. Where the p-side multi-film layer 8 is utilized in the p-region as shown, the p-side multi-film layer 8 preferably has a film thickness thinner than that of the n-side multi-film layer to render the Vf or the threshold current of the device to be prone to decrease. Where the p-side multi-film layer 8 is formed in contact with the active layer 7 as shown in FIG. 1, one of the nitride semiconductor films 8a and 8b which is held in contact with a final layer (a well or a barrier layer) of the active layer may be either the third nitride semiconductor film 8*a* or the fourth nitride, semiconductor film 8*b*. It is to be noted that in FIG. 1 the p-side multi-film layer 8 is shown as formed in contact with the active layer 7, an another layer made of a different nitride semiconductor may intervene between the multi-film layer 8 and the active layer 7.

In the preferred embodiment, at least one of the third and fourth nitride semiconductor films can have a film thickness different from that of the next adjacent one of the third and fourth nitride semiconductor films that adjoin such one of the third and fourth nitride semiconductor films. By way of example, assuming that the or each third nitride semiconductor film is made of AlGaN and the or each fourth nitride semiconductor film is made of GaN, the or each AlGaN layer intervening between the neighboring GaN layers may have a varying film thickness either increasing or decreasing as the distance thereof to the active layer decreases. By doing so, the multi-film layer can have a varying index of refraction with the nitride semiconductor films having different indexes of refraction and, hence, the multi-film layer can exhibit the substantially same effects as those of a grading composition nitride semiconductor layer. Accordingly, in a semiconductor device such as a semiconductor laser of a type requiring the use of a beam waveguide, the multi-film layer can provide the beam waveguide to adjust the mode of the laser beam.

Also, at least one of the third and fourth nitride semiconductor films may contain Group III elements of a composition that is different from that in the next adjacent third or fourth nitride semiconductor film. By way of example, assuming that the third nitride semiconductor films are made of AlGaN and the fourth nitride semiconductor films are made of GaN, the amount of In contained in the InGaN layer intervening between the neighboring GaN layers may be increased or decreased as the distance thereof to the active layer decreases. In such case, as is the case with the use of the differing film thickness discussed above, the multi-film layer can have a varying index of refraction with the nitride semiconductor films having different indexes of refraction and, hence, the multi-film layer can exhibit the substantially same effects as those of a grading composition nitride semiconductor layer. It is to be noted that the index of refraction tends to decrease with decrease of the amount of In used. In view of this, depending on applications, the layer having the varying composition can be employed in the p-region.

The or each third nitride semiconductor film 8*a* is made, of a nitride semiconductor containing Al, preferably a ternary compound which is expressed by the following formula:

$Al_aGa_{1-a}N(0<X<1)$ wherein suffix a is preferably not greater than 0.5. If the value of suffix a exceeds 0.5, the crystallinity will be deteriorated exhibiting a tendency to form cracks. On the other hand, the or each fourth nitride semiconductor film 8*b* may be made of any suitable nitride semiconductor, provided that the latter is different from that used for the or each third nitride semiconductor film 8*a*. In order, however, for the or each fourth nitride semiconductor film 8*b* of an excellent crystallinity to be grown, a nitride semiconductor of a binary or ternary compounds having a bandgap lower than the or each third nitride semiconductor film 8*a* has to be developed, although not exclusively limited thereto. If of the various nitride semiconductors, GaN is chosen as a material for the or each fourth nitride semiconductor film 8*b*, the multi-film layer having an excellent crystallinity can be formed. Accordingly, the use of $Al_aGa_{1-a}N$, wherein suffix a is not greater than 0.5, for the or each second nitride semiconductor film 8*a* and GaN for the or each fourth nitride semiconductor film 8*b* is a preferred combination of materials.

The or each third nitride semiconductor film 8*a* has a film thickness not greater than 100 angstroms, preferably not greater than 70 angstroms, and more preferably not greater than 50 angstroms. Similarly, the or each fourth nitride semiconductor film 8*b* has a film thickness not greater than 100 angstroms, preferably not greater than 70 angstrom, and more preferably not greater than 50 angstrom. Selection of the film thickness not greater than 100 angstroms for each of the third and fourth nitride semiconductor films means that the respective nitride semiconductor film has a film thickness not greater than the critical elastic thickness and, so that the nitride semiconductor film having an excellent crystallinity can be grown as compared with the case in which it is grown into a thick film. And due to the excellent crystallinity of the nitride semiconductor films, the p-type layer having a high carrier concentration and a low resistivity can be obtained when p-type impurity are doped/thereby reducing the Vf or the threshold current of the device.

Again, in the practice of the first preferred embodiment, one or both of the third and fourth nitride semiconductor films may be either undoped or doped with n-type impurity. To obtain the p-type layer of a high carrier concentration, the use of a modulation doping technique is preferred. However, as discussed previously, where both of the third and fourth nitride semiconductor films are left undoped, the film thickness thereof is preferably not greater than 0.1 micron, preferably not greater than 700 angstrom, and more preferably not greater than 500 angstrom. This is because if the film thickness exceeds 0.1 micron, the resistance of the undoped layer tends to increase. On the other hand, where both of the third and fourth nitride semiconductor films are doped with the p-type impurity, the p-type impurity used in the or each third nitride semiconductor film 8*a* and the p-type impurity used in the or each fourth nitride semiconductor films 8*b* may be different from each other.

Figure 2:
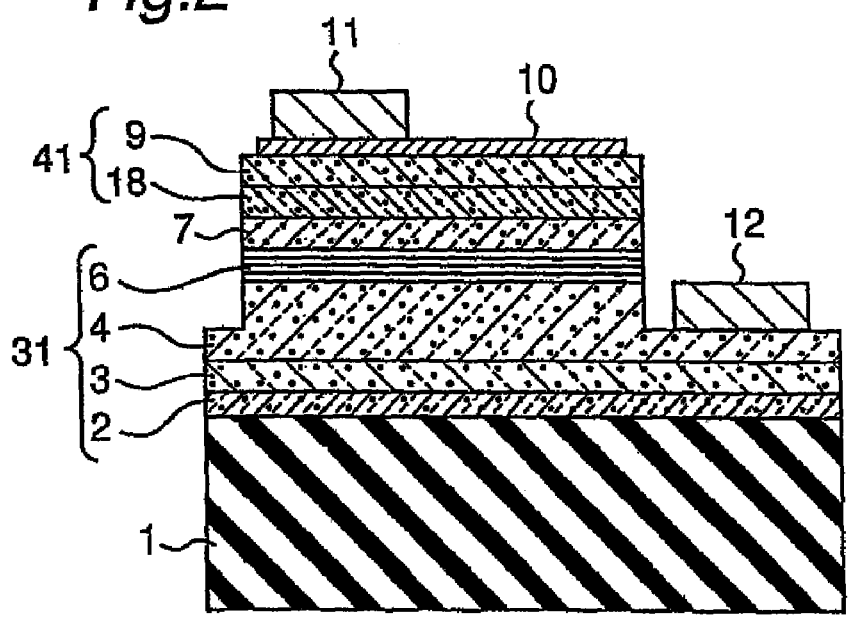
FIG. 2 is a schematic sectional view showing the structure of an LED device according to Example 2 of the present invention.

Although in the nitride semiconductor device according to the foregoing embodiment of the present invention, the p-side multi-film layer 8 has been formed in the p-region 40, the present invention may not be always limited thereto and, in place of the p-side multi-film layer 8, a p-clad layer 18 of a single layered structure may be formed as shown in FIG. 2. It is to be noted that in the nitride semiconductor device shown in FIG. 2, the p-region 41 is defined by the p-clad layer 18 and the p-contact layer 9.

Modification of Embodiment 1

Although in describing the first preferred embodiment of the present invention, reference has been made to the light emitting diode (LED) device, the present invention can be equally applied not only to the light emitting diode device, but also to a laser diode (LD) device which will now be described.

Specifically, in the LD device, the n-side multi-film layer, for example, is formed by alternately depositing one or more first nitride semiconductor films of InGaN and one or more second nitride semiconductor films of GaN with the or each first nitride semiconductor film having a different film thickness that progressively increases with decrease of the distance thereof to the active layer. With the n-side multi-film layer so constructed, that is to say, InGaN having a higher refraction index than that of GaN increases towards the active layer so that the n-side multi-film layer have a grading refraction index progressively increasing with decrease of the distance thereof to the active layer.

On the other hand, in the LD device, the p-side multi-film layer is formed by alternately depositing one or more third nitride semiconductor films of AlGaN and one or more fourth nitride semiconductor films of GaN with the or each third nitride semiconductor film having a different film thickness that is progressively thinner with decrease of the distance thereof to the active layer. With the p-side multi-film layer so constructed, that is to say, InGaN having a lower refraction index than that of GaN decreases towards the active layer so that the p-side multi-film layer have a grading refraction index progressively increasing with decrease of the distance thereof to the active layer.

The LD device of the structure described above can have an increased output with the lowered threshold voltage since the crystalline of each of the nitride semiconductor films can be improved favorably as is the case with the first embodiment.

Also, in the LD device, since any of the n-side and p-side multi-film layers with the active layer intervening therebetween has a grading index of refraction that increases as the distance thereof to the active layer decreases, a favorable beam waveguide can be formed allowing the mode of the laser beam to be easily and effectively adjusted.

In the LD device in the foregoing example, the n-side and p-side multi-film layer have been formed as a layer of a continuously grading index of refraction by utilizing a varying film thickness for the first or third nitride semiconductor films. However, the present invention is not always limited thereto, but the layer having the continuously varying index of refraction may be formed by grading film thickness for the second or fourth nitride semiconductor films.

Also, in the practice of the present invention, the index of refraction can be varied by making the composition of Group III element in at least one of the first and second nitride semiconductor films different from that in the next succeeding first or second nitride semiconductor film or films. By way of example, assuming that the first nitride semiconductor films are made of InGaN and the second nitride semiconductor films are made of GaN, the proportion of In in the nitride semiconductor films may be increased with decrease of the distance thereof to the active layer to thereby increase the index of refraction with decrease of the distance thereof to the active layer and, therefore, the nitride semiconductor layer having a similarly grading index of refraction can be formed. It is to be noted that in InGaN, the index of refraction increase with increase of In in the composition.

Again, the p-side multi-film layer can be formed as the layer having a varying index of refraction by making the composition of Group III element in at least one of the third and fourth nitride semiconductor films different from that in the next succeeding third and fourth nitride semiconductor film or films. By way of example, assuming that the third nitride semiconductor films are made of AlGaN and the fourth nitride semiconductor films are made of GaN, the proportion of In in the AlGaN films each between the neighboring GaN films may be decreased with decrease of the distance thereof to the active layer to thereby render the semiconductor films in the p-side multi-film layer to have grading indexes of refraction so that the nitride semiconductor layer as a whole can have a substantially grading index of refraction, it is to be noted that the index of refraction decreases with increase of the amount of Al used and, accordingly depending on applications, the layer having a grading composition can be disposed on the side of the p-region.

Embodiment 2

Hereinafter, the nitride semiconductor device according to a second preferred embodiment of the present invention will be described with reference to FIG. 4.

The nitride semiconductor device according to the second preferred embodiment of the present invention is a light emitting device of a double heterostructure comprising a substrate 1 having n-side and p-regions 130 and 140, each made up of a plurality of nitride semiconductor layers, with an active layer 7 of a multi quantum well structure intervening between the n- and p-regions 130 and 140.

Figure 4:
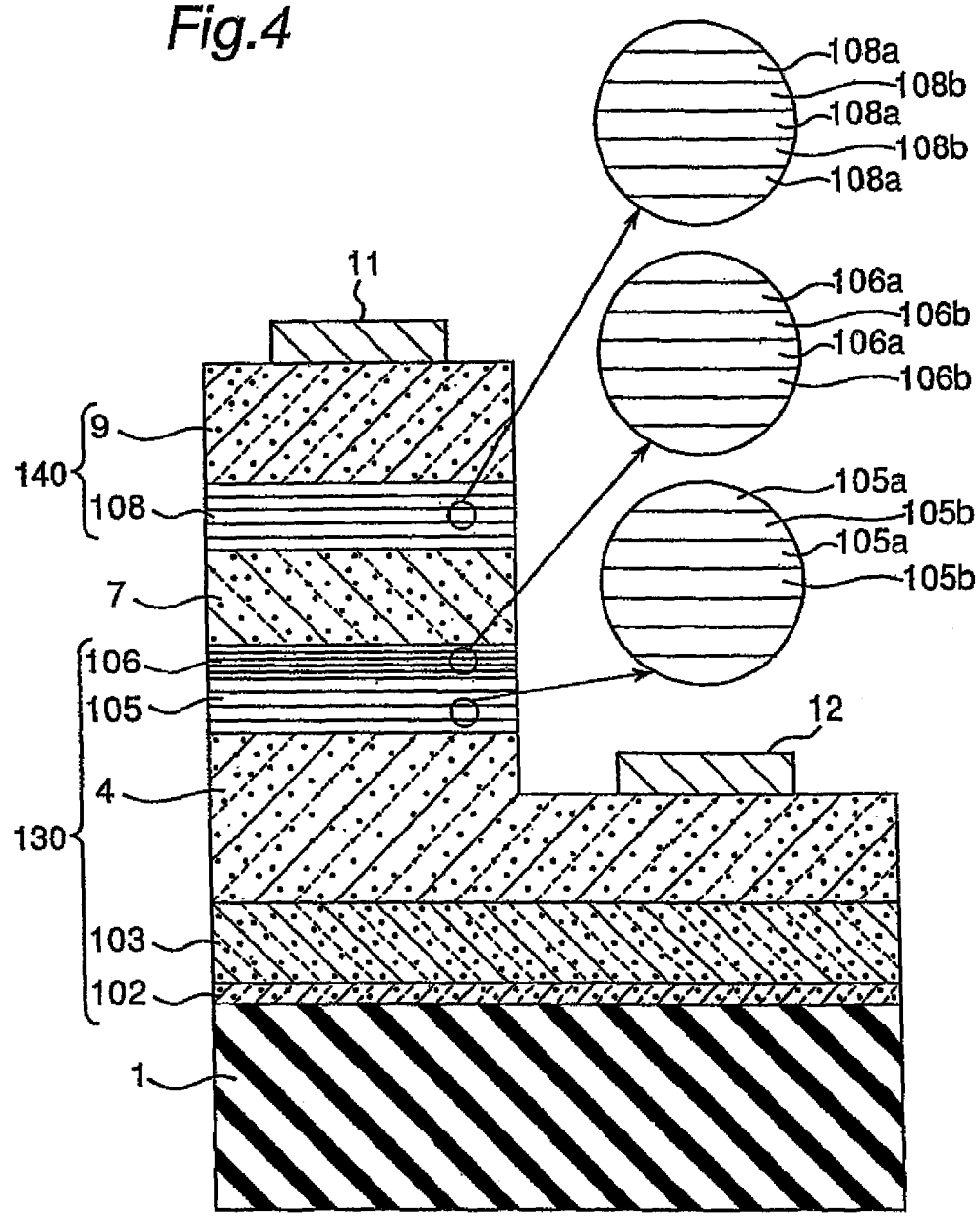
FIG. 4 is a schematic sectional view showing the structure of a nitride semiconductor device (LED device) according to the second embodiment of the present invention.

More specifically, in the nitride semiconductor device according to the second embodiment, the n-region 130 comprises a sequentially laminated structure including, as shown in FIG. 4, a buffer layer 102 closest to the substrate surface, an undoped GaN layer 103, an n-contact layer 4 doped with n-type impurity, an n-side first multi-film layer 105 doped with n-type impurity, and an n-side second multi-film layer 106 remotest from the substrate surface and made up of first and second nitride semiconductor films 106a and 106b alternating with each other. On the other hand, the p-region 140 comprises a sequentially laminated structure including a single-layered or p-side multi-film clad layer 108 and a GaN p-contact layer 9 doped with Mg. In this nitride semiconductor device according to the second embodiment, an n-electrode 12 and a p-electrode 11 are deposited respectively on the n-contact layer 4 and the GaN p-contact layer 9.

It is to be noted that in FIG. 4, the p-clad layer 108 is shown as employing a multi-film layer made up of third nitride semiconductor films 108a and fourth nitride semiconductor film 108b deposited one above the other so as to alternate with each other.

In the practice of the present invention, the substrate 1 may be employed in the form of an insulative substrate such as a sapphire substrate having its principal surface represented by a C-, R- or A-face or spinel ($MgAl_2O_4$), or a semiconductor substrate made of such as SiC (including 6H, 4H or 3C), Si, ZnO, GaAs, and GaN.

In the practice of the present invention, the buffer layer 102 is made of the nitride semiconductor of $Ga_dAl_{1-d}N$ (where $0<d\leq 1$). The use of the nitride semiconductor wherein the proportion of Al is small is preferred since the smaller the Al proportion, the better the crystallinity and, accordingly, the use of GaN as material for the butter layer 102 is more preferable.

The buffer layer 102 may have a film thickness adjusted to fall within the range of 0.002 to 0.5 μm, preferably within the range of 0.005 to 0.2 μm, and more preferably within the range of 0.01 to 0.02 μm. If the film thickness of the buffer layer 102 falls within this specific range, the nitride semiconductor can exhibit a good crystalline morphology, accompanied by enhancement of the crystallinity of the nitride semiconductor that is to be grown on the buffer layer 102.

The temperature of growth of the buffer layer 102 is adjusted to fall within the range of 200 to 900° C. and preferably within the range of 400 to 800° C. As far as the temperature of growth falls within this specific range, the resultant buffer layer 102 would exhibit an excellent polycrystal which in turn contributes to a good crystallinity of the nitride semiconductor to be grown on the buffer layer 102 using the polycrystal as a seed crystal.

The buffer layer 102 so grown at a relatively low temperature may not be essential and may therefore be dispensed with depending on the type of material for the substrate 1 and/or the growing method employed.

Next, the undoped GaN layer 103 deposited on one surface of the buffer layer 102 remote from the substrate 1 is a layer that is grown without n-type impurity added during the growth thereof. When the undoped GaN layer 103 is grown on the buffer layer 102, the undoped GaN layer 103 tends to show a good crystallinity to such an extent as to allow the n-contact layer 4, that is subsequently deposited on the undoped GaN layer 130, to have a good crystallinity. This undoped GaN layer 103 has a film thickness not smaller than 0.01 μm, preferably not smaller than 0.5 μm, and more preferably not smaller than 1 μm. If the undoped GaN layer 103 has the film thickness specified above, the various layers to be subsequently grown successively on this undoped GaN layer 103 can have a good crystallinity. Although the upper limit for the film thickness of the undoped GaN layer 103 may not be essential and is not therefore specified, it should be properly chosen in consideration of the manufacturing efficiency.

The n-contact layer 4 deposited on the undoped GaN layer 103 contains the n-type impurity in a concentration of not smaller than $3\times10^{18}/cm^3$, and preferably not smaller than $5\times10^{18}/cm^3$. The use of the relatively high concentration of the n-type impurity in the n-contact layer 4 is effective to lower the Vf and threshold current. On the other hand, if the concentration of the n-type impurity departs from the value specified above, the Vf value will hardly lower. The n-contact layer 4 if formed on the undoped GaN layer 103 which has a good crystallinity, but contains a relatively low concentration of the n-type impurity, can have a good crystallinity even though if contains the relatively high concentration of the n-type impurity. Although, the present invention is not specifically limited by the uppermost limit of the concentration of the n-type impurity in the n-contact layer 4, the uppermost limit is preferably not greater than $5\times10^{21}/cm^3$ in order for the contact layer to have a crystallinity required to allow it to function as a contact layer.

The n-contact layer 4 may have a composition of $In_eAl_fGa_{1-e-f}N$ (where $0\leq e$, $0\leq f$, and $e+f\leq 1$), although not limited thereto. However, the use of GaN or $Al_fGa_{1-f}N$ where suffix f is not greater than 0.2 is advantageous in that the nitride semiconductor layer having a minimized crystal defect can easily be obtained. This n-contact layer 4 may, although not limited thereto, have a film thickness within the range of 0.1 to 20 μm, preferably within the range of 0.5 to 10 μm, and more preferably within the range of 1 to 5 μm since the n-contact layer 4 provides a base on which the n-electrode is subsequently deposited. If the film thickness of the n-contact layer 4 falls within the above specified range, the resistance can be lowered, accompanied by reduction in forward voltage of the light emitting device.

However, where the n-side first multi-film layer 105 as will subsequently be described is formed to have a relatively thick layer and is then used as a contact layer, the n-contact layer 4 may be dispensed with.

The n-side first multi-film layer 105 is a laminated structure including at least two nitride semiconductor films doped with n-type impurity in different concentrations, respectively. These at least two nitride semiconductor films forming the n-side first multi-film layer 105 may have either respective bandgap different from each other or be of the same composition. The n-side first multi-film layer 105 has a film thickness not greater than 2 μm, preferably not greater than 1.5 μm and more preferably not greater than 0.9 μm. So long as the film thickness of the n-side first multi-film layer 105 is as specified above, the light emitting output can be increased. Although the lowermost limit for the film thickness is not specifically limited, the lowermost limit thereof may be preferably not smaller than 0.05 μm.

The fact that the nitride semiconductor films forming the n-side first multi-film layer 106 have different impurity concentrations is referred to as a "modulation doping" and one of the nitride semiconductor films forming the n-side first multi-film layer 106 is preferably not doped with impurity, that is, undoped.

The following description applies where the n-side first multi-film layer 105 is made up of the at least two nitride semiconductor films having the different bandgap, respectively.

The nitride semiconductor film 105a, one of the multiple films forming the n-side first multi-film layer 105 and having a relatively large bandgap, and the nitride semiconductor film 105b having a relatively small bandgap have a respective film thickness adjusted to a value not greater than 100 angstroms, preferably not greater than 70 angstroms and more preferably within the range of 10 to 40 angstroms. If the film thickness is greater than 100 angstroms, each of the nitride semiconductor film having the relatively large bandgap and the nitride semiconductor film having the relatively small bandgap will have a film thickness greater than the critical elastic thickness and will therefore be susceptible to inclusion of micro cracks and/or crystalline defects. Although the lowermost limit of the film thickness of each of the nitride semiconductor film having the relatively large bandgap and the nitride semiconductor film having the relatively small bandgap is not specifically limited, it may be of a value corresponding to a single atom layer and, more preferably, not smaller than 10 angstroms as discussed above.

Where the n-side first multi-film layer 105 is made up of the nitride semiconductor films of a relatively small film thickness as discussed above, each nitride semiconductor film forming the n-side first multi-film layer 105 can have a film thickness not greater than the critical elastic thickness and, therefore, the nitride semiconductor having considerably minimized crystalline defects can be grown. Also, this n-side first multi-film layer 105 is effective to suppress to a certain extent development of crystalline defects running from the substrate 1 through the undoped GaN layer 103 and the n-contact layer 4 and, also, allows the subsequently formed n-side second multi-film layer 106 to have a good crystallinity while exhibiting an effect similar to a HEMT.

The nitride semiconductor film 105a having the relatively large bandgap is preferably formed by growing a nitride semiconductor containing at least Al, preferably of $Al_gGa_{1-g}N$ (where $0<g\leq 1$). On the other hand, the nitride semiconductor film 105b having the relatively small bandgap may be made of any nitride semiconductor provided that the bandgap is smaller than that of the nitride semiconductor film 105a, but is preferably made of a binary or ternary compound nitride semiconductor such as $Al_hGa_{1-h}N$ (where $0\leq h<1$ and $g>h$) or $In_jGa_{1-j}N$ (where $0\leq j<1$) as it is easily grown and exhibits a good crystallinity.

More preferably the nitride semiconductor film 105a having the relatively large bandgap is of a composition, $Al_gGa_{1-g}N$ (where $0<g<1$) containing substantially no In, while the nitride semiconductor film 105a having the relatively small bandgap is of a composition, $In_jGa_{1-j}N$ (where $0\leq j<1$) containing substantially no Al, However, a combination of $Al_gGa_{1-g}N$ (where $0<g\leq 0.3$), wherein the Al crystal mixing ratio (suffix g) is not greater than 0.3, with GaN is most preferred in order to secure the multi-film layer having an excellent crystallinity.

Where the n-side first multi-film layer 105 is desired to function as a clad layer that may be used as a beam confinement layer and a carrier confinement layer, it is necessary to grow a nitride semiconductor having a bandgap larger than that of a well layer of the active layer. The nitride semiconductor film having the larger bandgap is a nitride semiconductor having a higher Al composition ratio. The nitride semiconductor having a higher Al composition ratio is conventionally used to be grown in the form of a thick film, the nitride semiconductor was susceptible to inclusion of cracks, accompanied by difficulty in crystalline growth.

However, the use of the n-side first multi-film layer 105 such as in the present invention is effective to minimize inclusion of cracks since even though the individual nitride semiconductor films 105a and 105b forming the multi-film layer is formed as a layer having a higher Al composition ratio, they have a film thickness not greater than the critical elastic thickness. For this reason, the layer of a higher Al composition ratio can be grown with excellent crystallinity, to enhance both the beam confinement and the carrier confinement, thereby allowing the threshold current in the case of the laser device or the Vf (forward voltage) in the case of the LED device to be advantageously lowered.

Also, the n-type impurity concentration in the nitride semiconductor film 105a having the relatively larger bandgap that that of the nitride semiconductor film 105b are preferably different from each other. This can be accomplished by the use of the so-called modulation doping technique and, if one of the layers is doped with a smaller dose of the n-type impurity or is doped with no impurity that is, undoped, while the other of the layers is doped with a larger dose of the n-type impurity, both the threshold current and the Vf value can be reduced advantageously. This is because the inclusion of the layer of a low impurity concentration in the multi-film layer is effective to increase the electron mobility in that layer, and the coexistence with the layer having the high impurity concentration in the multi-film layer enhances formation of the multi-film layer with high carrier concentration preserved. In other words, it is understood that the coexistence of the layer of a low impurity concentration having a high mobility and the layer of a high impurity concentration, and a high carrier concentration makes it possible to allow the layer having both a high carrier concentration and a high mobility to serve as the clad layer which eventually contributes to reduction in the threshold current and the Vf.

Where the nitride semiconductor film 105a having the relatively large bandgap is to be doped with a relatively large amount of the n-type impurity, the dose of the n-type impurity to be doped is adjusted to fall preferably within the range of $1\times10^{17}/cm^3$ through $1\times10^{20}/cm^3$ and more preferably within the range of $1\times10^{18}/cm^3$ through $5\times10^{19}/cm^3$. If the dose is smaller than $1\times10^{17}/cm^3$, the nitride semiconductor film 105a would make little difference with the nitride semiconductor layer having the relatively small bandgap, rendering it to be difficult to secure the layer of a high carrier concentration, whereas if the dose is greater than $1\times10^{20}/cm^3$, the leak current in the device itself tends to increase. On the other hand, the nitride semiconductor film having the relatively small bandgap should have the n-type impurity concentration lower, preferably one-tenth (1/10) or less, than that in the nitride semiconductor film having the relatively large bandgap. Although the nitride semiconductor film 105a is doped with no n-type impurity as is more preferred will produce the layer having a high mobility, the resultant film thickness thereof will be so small that the nitride semiconductor film 105a will include n-type impurity that are diffused thereinto from the nitride semiconductor layer having the relatively large bandgap. In such case, the amount of the n-type impurity diffused into the nitride semiconductor film 105a is preferably suppressed to be not greater than $1\times10^{19}/cm^3$. The n-type impurity may be selected from the group consisting of Group IV-B elements such as Si and Ge and Group VI-B elements such as Se, S and O and are preferably Si, Ge or S. This feature is equally applicable where a relatively small dose of the n-type impurity is doped in the nitride semiconductor layer having the relatively large bandgap while a relatively large dose of the n-impurity is doped in the nitride semiconductor layer having the relatively small bandgap.

While in the foregoing the modulation doping of the impurity in the multi-film layer has been described, it is to be noted that the respective nitride semiconductor films having the relatively large and small bandgap may contain an equal dose of the n-type impurity doped.

As for the nitride semiconductor films 105a and 105b forming the n-side first multi-film layer 105, the or each film doped with a high concentration of the impurity preferably has a grading distribution of the impurity with a relatively high impurity concentration at a center area of the film and a relatively low impurity concentration (more preferably, undoped) at end portions thereof along the thickness direction. More specifically, assuming that, the multi-film layer is comprised of films of AlGaN doped with Si as impurity and undoped GaN films, the Si-doped AlGaN films as donors provides electrons in a conduction band thereof which fall in the conduction band of GaN that has a lower potential than AlGaN. Since the GaN crystals are not doped with donor impurity, the carriers will not be scattered in the presence of the impurity. For this reason, the electron can easily move in the GaN crystals with the substantially higher electron mobility. This phenomenon is similar to that occurring in a two dimensional electron gas, and causes the electron mobility in a lateral direction higher and the resistivity lower. In addition, doping of the n-type impurity with a high concentration at the center area of the AlGaN film having large bandgap enhances this phenomenon. In other words, some of the electrons moving in the GaN film will be affected by scattering of the n-type impurity (Si in this case) contained in the AlGaN film. However, if the end portions of the AlGaN film along the thickness direction thereof are undoped, the electrons will hardly be affected by the scattering of Si and, therefore, the electron mobility of the undoped GaN film can be increased.

The following discussion is directed to the n-side first multi-film layer 105 depositing nitride semiconductor films of the same composition, but doped with different concentrations of n-type impurity from one another.

Although not limited thereto, the nitride semiconductor films forming the n-side first multi-film layer 105 has the same composition and preferably made of GaN. If the n-side first multi-film layer 105 as a whole is made of GaN, GaN which is a binary compound can grow with a better crystallinity than that of the ternary compound and can contributes to the crystallinity of the subsequently nitride semiconductor films.

In the practice of the second embodiment of the present invention, the n-side first multi-film layer 105 may comprise multi-film layer of a laminated structure including the nitride semiconductor film 105a made of GaN containing n-type impurity, and the nitride semiconductor film 105b made of GaN containing n-type impurity in a concentration different from that in the nitride semiconductor film 105a. Preferably, one of the nitride semiconductor films 105a and 105b is undoped.

The n-side first multi-film layer comprised of the two types of the modulation doped nitride semiconductor films of the same composition, but containing different dose of the n-type impurity doped therein can bring about effects similar to those brought about by the n-side first multi-film layer 105 comprised of the two types of the modulation doped nitride semiconductor films having the different bandgap.

The concentration of the n-side impurity is within the range of $1\times10^{17}$ through $1\times10^{21}/cm^3$, preferably $1\times10^{18}$ through $1\times10^{19}/cm^3$, and more preferably within the range of $3\times10^{18}$ through $7\times10^{18}/cm^3$. Also, in the practice of the present invention, the n-side first multi-film layer 105 may have a total film thickness, although not limited thereto, within the range of 1,000 to 4,000 angstroms and preferably within the range of 2,000 to 3,000 angstroms. Each of the nitride semiconductor films forming the multi-film layer 105 has a film thickness not greater than 500 angstroms, preferably not greater than 200 angstroms and more preferably not greater than 100 angstroms. Although the lowermost limit thereof is not specifically limited, it may correspond to the film thickness of a single atom layer and preferably not smaller than 10 angstroms. The film thickness specified above is effective to enhance a good crystallinity grown with that may result In increase of the light emitting output.

The n-side first multi-film layer 105 comprising the two types of the films having the different bandgap or the same composition as discussed above may concurrently serve also as an n-contact layer. In such case, the n-side first multi-film layer 105 has a film thickness within the range of 0.5 to 4 μm, preferably within the range of 1 to 3 μm and more preferably within the range of 2 to 2.8 μm. This film thickness of the n-side first multi-film layer 105 is adjusted by adjusting the number of at least two types of the nitride semiconductor films laminated and/or the film thickness of each of the nitride semiconductor films laminated. Each of the nitride semiconductor films forming the n-side first multi-film layer 105 may be formed of thin films having thickness within the above defined range, or more than the above defined range if the total layer thickness falls within the range of the layer thickness as above mentioned for the n-side first multi-film layer 105 that serves as the n-contact layer, it may be adjusted by the number of and/or the film thickness of each of at least two types of the nitride semiconductor films.

In the second embodiment of the present invention, the n-region 130 defined below the active layer 7 includes, as shown in FIG. 4, the n-side second multi-film layer 106 comprising one or more first nitride semiconductor films 106a containing In and one or more second nitride semiconductor films 106b of a composition different from that of the first nitride semiconductor films 106a. The total number of the first and second nitride semiconductor films 106a and 106b may be two, preferably three or more, and the use of two or more first or second nitride semiconductor films 106a and 106b is preferred so that the total number of the first and second nitride semiconductor films 106a and 106b will exceed four or more.

Where the n-side second multi-film layer 106 is formed in contact with the active layer 7, one of the nitride semiconductor films 106a and 106b which is held in contact with an initial layer component (a well or a barrier layer) of the active layer 7 may be either the first nitride semiconductor film 106a or the second nitride semiconductor film 106b and, thus, the sequence of lamination of the nitride semiconductor films 106a and 106b in the n-side second multi-film layer 106 may be arbitrarily chosen. Also, although in FIG. 4 the n-side second multi-film layer 106 is formed, in direct contact with the active layer 7, a layer made of, for example, an n-type nitride semiconductor may intervene between the multi-film layer 106 and the active layer 7.

In this second embodiment, at least one of the or each first nitride semiconductor film 106a and the or each second nitride semiconductor film 106b preferably has a film thickness not greater than 100 angstroms. Alternatively, both of the first and second nitride semiconductor films 106a and 106b may have a film thickness not greater than 100 angstroms, preferably not greater than 70 angstroms, and more preferably not greater than 50 angstroms. Selection of the small film thickness is effective to cause the multi-film layer 106 to have a superlattice structure, allowing the n-side second multi-film layer 106 to have a good crystallinity while improving the output.

As such, the use of the combination of the n-side first multi-film layer 105 and the n-side second multi-film layer 106 is effective to increase the beam emitting output along with reduction of the forward voltage (Vf). Although the reason therefor has yet been clearly confirmed, it appears that the n-side second multi-film layer 106 could have a good crystallinity sufficient to allow the active layer to be subsequently grown thereon.

The or each first nitride semiconductor film 106a is made of a nitride semiconductor containing In, preferably a ternary compound of $In_kGa_{1-k}N$ (0<k<1), wherein suffix k is preferably not greater than 0.5 and more preferably not greater than 0.2. On the other hand, the or each second nitride semiconductor film 106b may be made of any suitable nitride semiconductor, provided that the latter is different from that used for the or each first nitride semiconductor film 106a. In order, however, for the or each second nitride semiconductor film 106b of an excellent crystallinity to be grown, a nitride semiconductor of a binary or ternary compound having bandgap higher than the or each first nitride semiconductor film 106a has to be grown. In the n-side second multi-film layer 106, the or each second nitride semiconductor film 106b is preferably made of $In_mGa_{1-m}N$ (0≦m<1, and m<k) and in particular GaN is most preferred in order for the multi-film layer having a good crystallinity to be grown. Accordingly, the use of $In_kGa_{1-k}N$ wherein suffix k is not greater than 0.5 for the or each first nitride semiconductor film in combination with GaN for the or each second nitride semiconductor film is a most preferred combination of composition materials.

Also, one of the first and second nitride semiconductor films 106a and 106b has a film thickness which may be either different from or equal to the film thickness of the first or second nitride semiconductor film 106a or 106b which immediately adjoin such one of the first and second nitride semiconductor films 106a and 106b. The use of the different film thicknesses for the neighboring nitride semiconductor films means that when the multi-film layer is formed by laminating a plurality of the first or second nitride semiconductor films 106a or 106b, the neighboring first nitride semiconductor films 106a (or the neighboring second nitride semiconductor films 106b) with the second nitride semiconductor film 106b (or the first nitride semiconductor film 106a) intervening therebetween have respective film thicknesses different from each other.

By way of example, assuming that the first nitride semiconductor films 106a are made of InGaN and the second nitride semiconductor films 106b are made of GaN, the film thickness of the InGaN layer intervening between the neighboring GaN layers may be increased or decreased as the distance thereof to the active layer decreases to thereby provide a varying index of refraction so that the index refractive of the multi-film layer as a whole can be varied. In other words, an effect similar to the formation of a nitride semiconductor layer having a substantially varying index of refraction can be obtained. For this reason, in an element such as the laser device that requires the use of a light waveguide, this multi-film layer can provide a light waveguide so that the mode of the laser beam can be adjusted.

Also, the composition of Group III element in at least one of the first and second nitride semiconductor films 106a and 106b may be different from that in the next succeeding first or second nitride semiconductor film or films 106a or 106b. This means that where the multi-film layer is formed by laminating a plurality of the first or second nitride semiconductor films 106a or 106b, the neighboring first nitride semiconductor films 106a (or the neighboring second nitride semiconductor films 106b) with the second nitride semiconductor film 106b (or the first nitride semiconductor film 106a) intervening therebetween have respective compositions different from each other.

By way of example, if the different compositions of the same Group III elements are employed, where the first nitride semiconductor films 106a are made of InGaN and the second nitride semiconductor films 106b are made of GaN, the proportion of the In composition in the InGaN layer intervening between the neighboring GaN layers may be increased or decreased as the distance thereof to the active layer decreases to thereby provide a varying index of refraction, in a manner similar to the foregoing embodiment, in the multi-film layer so that the index refractive of the multi-film layer as a whole can be varied. It is to be noted that as the In composition decreases, the index of refraction tends to decrease.

The n-side second multi-film layer 106 may be formed in spaced relation to the active layer, but it is preferred that it be formed in the close vicinity of the active layer. Formation of the n-side second multi-film layer 106 in the close vicinity of the active layer is effective to secure a tendency of the output increasing.

Also, in the n-side second multi-film layer 106, both of the first and second nitride semiconductor films 106a and 106b may be undoped or doped with n-type impurity. Alternatively, only one of the first and second nitride semiconductor films 106a and 106b may be doped with impurity. In order for the crystallinity to be improved to thereby increase the output, the both are doped, preferably modulation doped with the n-type impurity (i.e. either of the first and second nitride semiconductor films 106a and 106b is doped with the n-type impurity), or more preferably undoped.

Where the both are doped with the n-type impurity, the concentration of the n-type impurity in the or each first nitride semiconductor film 106a and that in the or each second nitride semiconductor film 106b may be different from each other.

The n-type impurity may be selected from the group consisting of Group IV elements such as Si and Ge and Group VI elements such as Sn and S and are preferably Si or Sn.

It is to be noted that the term "undoptng" referred to herein is intended to speak of a condition in which no impurity is purposefully doped and the presence of impurity admixed as a result of diffusion from the neighboring nitride semiconductor film or films is to be understood as representing the undoped condition for the purpose of the present invention. The impurity admixed as a result of the diffusion may often be found in the layer having a progressively varying concentration.

Where the first and/or second nitride semiconductor films 106a and/or 106b are doped with the n-type impurity, the concentration of the impurity is adjusted to be not higher than $5 \times 10^{21}/cm^3$ and preferably not higher than $1 \times 10^{20}/cm^3$. If the impurity concentration is higher than $5 \times 10^{21}/cm^3$, the crystallinity of the nitride semiconductor films will be deteriorated, accompanied by reducing the output. A similar description equally applies to the modulation doping used for the multi-film layer as a whole.

In addition, in the n-side second multi-film layer 106, the first and second nitride semiconductor films has a film thickness not greater than 100 angstroms, preferably not greater than 70 angstroms and more preferably not greater than 50 angstroms. Selection of not greater than 100 angstrom for the film thickness of one nitride semiconductor film allows the nitride semiconductor film to have a film thickness not greater than critical elastic thickness so that as compared with formation as a thick film, the nitride semiconductor having a good crystallinity can be grown. Also, if the both have a film thickness not greater than 70 angstroms, the resultant n-side second multi-film layer 6 will exhibit a superlattice (multi-film) structure and if the active layer is subsequently grown on this multi-film layer having a good crystallinity, the n-side second multi-film layer 6 will functions in a manner similar to the buffer layer and, accordingly, the active layer having a good crystallinity can be grown.

In the practice of the second embodiment, the active layer 7 of the multi quantum well structure is formed of a nitride semiconductor containing In and Ga, preferably $In_aGa_{1-a}N$ (where $0 \leq a < 1$) and is preferably undoped (with no impurity added), although it may be doped with n-type or p-type impurity, so that a strong band-to-band light emission can be obtained with the half width of the emission wavelength narrowed. The active layer 7 may be doped with either the n-type impurity or the p-type impurity. Where the active layer 7 is doped with the n-type impurity, the band-to-band light emission strength can further be increased as compared with the undoped active layer 7. On the other hand, where the active layer 7 is doped with the p-type impurity, it is possible to shift the peak wavelength towards that of an energy level about 0.5 eV lower than the bandgap of the band-to-band emission, but the half width will increase. Where the active layer is doped with both of the n-type and p-type impurity, the light emission strength of the active layer doped only with the p-type impurity can further be increased. In particular, where the active layer doped with a p-type dopant is formed, the active layer preferably has an n-type conductivity by doping an n-type dopant such as Si therein. In order to grow the active layer having a good crystallinity, the active layer is preferably doped with no impurity, that is, non-doped.

The sequence of lamination of barrier and well layers forming the active layer 7 is not specifically limited for the purpose of the present invention. The active layer 7 may start with the well layer and terminate with the well layer, or start with the well layer and terminate with the barrier layer. Alternatively, the active layer 7 may start with the barrier layer and terminate with the barrier layer or start with the barrier layer and terminate with the well layer. The well layer has a film thickness adjusted to be not greater than 100 angstroms, preferably not greater than 70 angstroms and more preferably not greater than 50 angstroms. Although not specifically limited, the lowermost limit of the film thickness of the well layer may correspond to the film thickness of a single atom layer and, preferably not smaller than 10 angstroms. If the well layer is greater than 100 angstroms, the output will be difficult to increase.

On the other hand, the barrier layer has a film thickness adjusted to be not greater than 2,000 angstroms, preferably not greater than 500 angstroms and more preferably not greater than 300 angstroms. Although not specifically limited, the lowermost limit of the film thickness of the barrier layer may correspond to the film thickness of a single atom layer and, preferably not smaller than 10 angstroms. If the barrier layer is within the specified range, the output can be increased advantageously. In addition, the thickness of the active layer 7 in total is not specifically limited to a particular value, but the active layer 7 may have a total film thickness by adjusting the number of the barrier and well layers laminated and/or the sequence of lamination thereof in consideration of the desired wavelength of the eventually resulting LED device.

In the second embodiment of the present invention, the p-clad layer is employed in the form of the p-side multi-film dad layer 108 comprising a third nitride semiconductor film 108a having a relatively large bandgap and a fourth nitride semiconductor film 108b having a smaller bandgap than that of the third nitride semiconductor film 108a, which are laminated one above the other. The third and fourth nitride semiconductor films 108a and 108b may contain an equal or different concentration of p-type impurity. However, the p-clad layer may be employed in the form of a single layer made of $Al_bGa_{1-b}N$ (where $0 \leq b \leq 1$) containing p-type impurity.

The following description applies where the p-clad layer is in the form of the p-side multi-film clad layer having a multi-film layer (a superlattice structure).

The third and fourth nitride semiconductor films 108a and 108b forming the multi-film layer of the p-side multi-film clad layer 108 has a film thickness adjusted to be not greater than 100 angstroms, preferably not greater than 70 angstroms and more preferably in the range of 10 through 40 angstroms, while the third and fourth nitride semiconductor films 108a and 108b may have the respective film thicknesses different from each other or identical with each other. If each of the nitride semiconductor films forming the multi-film layer have a film thickness within the specified range, this means that the film thickness of each nitride semiconductor film is not greater than critical elastic thickness, and, therefore, the nitride semiconductor having a good crystallinity can be grown as compared with that grown into a thick film, accompanied by formation of the nitride semiconductor layer having a good crystallinity. And when the p-type impurity are added, the p-clad layer having a high carrier concentration and a low resistivity can be obtained thereby reducing the Vf or the threshold current of the device tending to decrease. These two types of films having the film thicknesses specified above are paired and are laminated in a plurality of pairs thereby forming the multi-film layer. Adjustment of the total thickness of the p-side multi-film clad layer 108 is carried out by adjusting the respective film thickness of the third and fourth nitride semiconductor films and by adjusting the number of them laminated one above the other. Although not limited thereto, the total film thickness of the p-side multi-film clad layer 108 is not greater than 2,000 angstroms, preferably not greater than 1,000 angstroms and more preferably not greater than 500 angstroms so that, provided that the total film thickness is within this specified range, the light emission can be increased with the forward voltage (Vf) lowered.

The third nitride semiconductor film 108a is preferably formed by growing a nitride semiconductor containing at least Al such as $Al_nGa_{1-n}N$ (where $0<n\leq 1$) whereas the fourth nitride semiconductor film 108b is preferably formed by growing a nitride semiconductor of a binary or ternary compound such as $Al_pGa_{1-p}N$ (where $0\leq p<1$ and $n>p$) or $In_rGa_{1-r}N$ (where $0\leq r\leq 1$).

If the p-clad layer is developed in the form of the p-side multi-film clad layer 108 of the superlattice structure, the crystallinity can be improved, accompanied by reduction in both the resistivity and the Vf value.

The third and fourth nitride semiconductor films 108a and 108b in the p-side multi-film clad layer 108 may contain different concentrations of the p-type impurity. The impurity concentration in one of the nitride semiconductor films 108a and 108b is different from that in the other of the nitride semiconductor films 108a and 108b. As is the case with the n-side first multi-film layer 5, the third nitride semiconductor film 108a having the relatively large bandgap has a higher impurity concentration than that in the fourth nitride semiconductor film 108b having the relatively low bandgap or undoped, in which case the threshold current and the Vf can advantageously be lowered. Alternatively, the reverse may be equally employed. In other words, the third nitride semiconductor film 108a having the relatively large bandgap may have a lower impurity concentration than that in the fourth nitride semiconductor film 108b having the relatively low bandgap.

The dose of the impurity doped in the third nitride semiconductor-film 108a is preferably adjusted within the range of $1\times 10^{18}/cm^3$ through $1\times 10^{21}/cm^3$, and more preferably within the range of $1\times 10^{19}/cm^3$ through $5\times 10^{20}/cm^3$. If the dose doped in the third nitride semiconductor film 108a is not greater than $1\times 10^{18}/cm^3$, since there is small dose difference between the third and fourth nitride semiconductor, films 108a and 108b, the resultant layer with a high carrier concentration also is difficult to obtained. Meanwhile if the dose doped in the third nitride semiconductor film 108a is not less than $1\times 10^{21}/cm^3$, the crystallinity is deteriorated. On the other hand, the fourth nitride semiconductor film 108b is enough to have less concentration of p-type impurity than that of the third nitride semiconductor film 108a, and preferably the concentration of the p-type impurity of the fourth film 108b is less by more than one-tenth than that of the third film 108a. Most preferably the fourth film 108b is undoped to have the highest mobility, however since the fourth film thickness is so thin that the fourth nitride semiconductor film 108b has a p-type impurity diffused from the third nitride semiconductor film 108a. And the dose of the p-type impurity is preferably less than $1\times 10^{18}/cm^3$. As is the case where the third nitride semiconductor film 108a having the relatively large bandgap has a less impurity concentration than that in the fourth nitride semiconductor film 108b having the relatively low bandgap.

Group IIA and IIB elements such as Mg, Zn Ca, and Be can be selected as the p-type impurity, preferably such the p-type impurity is Mg, Ca, or the like.

In the nitride semiconductor layers comprising multi-film layers with highly doped with the impurity, it is desirable that the film around the middle portion along the thickness direction has the high impurity concentration and the films adjacent to the end portions has the low impurity concentration (preferably undoped) so that the resistibility can be reduced.

Next, where the p-clad layer is formed of a single-layered structure of $Al_bGa_{1-b}N$ ($0\leq b\leq 1$) having p-type impurity, the thickness of the p-side single-layered layer is not greater than 2000 angstrom, preferably not greater than 1000 angstrom, more preferably in the range of 500 through 1000 angstrom. Where the layer thickness is within such range, advantageously, the output of the emission is enhanced and the Vf is reduced. The composition of the single-layered p-clad layer can be expressed as $Al_bGa_{1-b}N$ ($0\leq b\leq 1$).

Although the clad layer of a single-layered layer has poorer crystallinity than the multi-film p-clad layer, the crystallinity of the single-layered clad layer can be improved and the threshold current and the Vf can be reduced by combining the single-layered p-clad layer with the n-side first multi-film layer 105. In addition to that the combination of the single-layered p-clad layer with the n-side first multi-film layer 105 can be effective in suppressing the deterioration of the device characteristics, advantageously the manufacturing process can be simplified because of the single-layered layer.

The p-type impurity concentration of the single-layered p-clad layer falls within the range of $1\times 10^{18}/cm^3$ through $1\times 10^{21}/cm^3$, preferably $5\times 10^{18}/cm^3$ through $5\times 10^{20}/cm^3$, more preferably $5\times 10^{19}/cm^3$ through $1\times 10^{19}/cm^3$. The impurity concentration is within the above-mentioned range, the p-type layer can be grown with a good crystallinity.

Next, in this embodiment, where the GaN p-contact layer 9 doped with Mg is a single-layered structure, the p-contact layer 9 is made up of the binary composition not including In and Al. If the p-contact layer 9 contains In or Al, the good ohmic contact can be hardly obtained so that the light emission effects is reduced. The thickness of the p-contact layer 9 falls within the range of 0.001 through 0.5 µm, preferably 0.01 through 0.3 µm, and more preferably 0.05 through 0.2 µm. Where the thickness of the p-contact layer 9 is thinner than 0.001 µm, it has an electrical short-circuit with the AlGaN p-clad layer so that it is difficult that the p-contact layer 9 function as a contact layer. Also where the thickness of the p-contact layer 9 is thicker than 0.5 µm, since the GaN contact layer of the binary composition are grown on the AlGaN clad layer of the ternary composition different from each other, the lattice defect tends to run in the GaN p-contact layer 9 due to the misfit between the crystals. It is to be noted that as the contact layer is thinner, the Vf will be lowered and the light emission effect will be improved. Where the p-type impurity in the GaN p-contact layer 9 is Mg, the p-type characteristics and the ohmic contact can be easily achieved. The Mg concentration falls within the range of $1 \times 10^{18}/cm^3$ through $1 \times 10^{21}/cm^3$, preferably $5 \times 10^{19}/cm^3$ through $3 \times 10^{20}/cm^3$, more preferably approximately $1 \times 10^{20}/cm^3$. Where the Mg concentration falls within the above-mentioned range, advantageously the p-type layer can be grown with a good crystallinity and the Vf can be reduced.

Further the n-electrode 12 and the p-electrode 11 are deposited on the n-contact layer 4 and the GaN contact layer 9 doped with Mg, respectively. Although not specifically limited thereto, the material of the n-electrode 12 and the p-electrode 11 can be used with, for example, w/Al and Ni/Au, respectively.

Embodiment 3

Now referring to FIG. 5, the embodiment 3 of the present invention will be described hereinafter.

Figure 5:
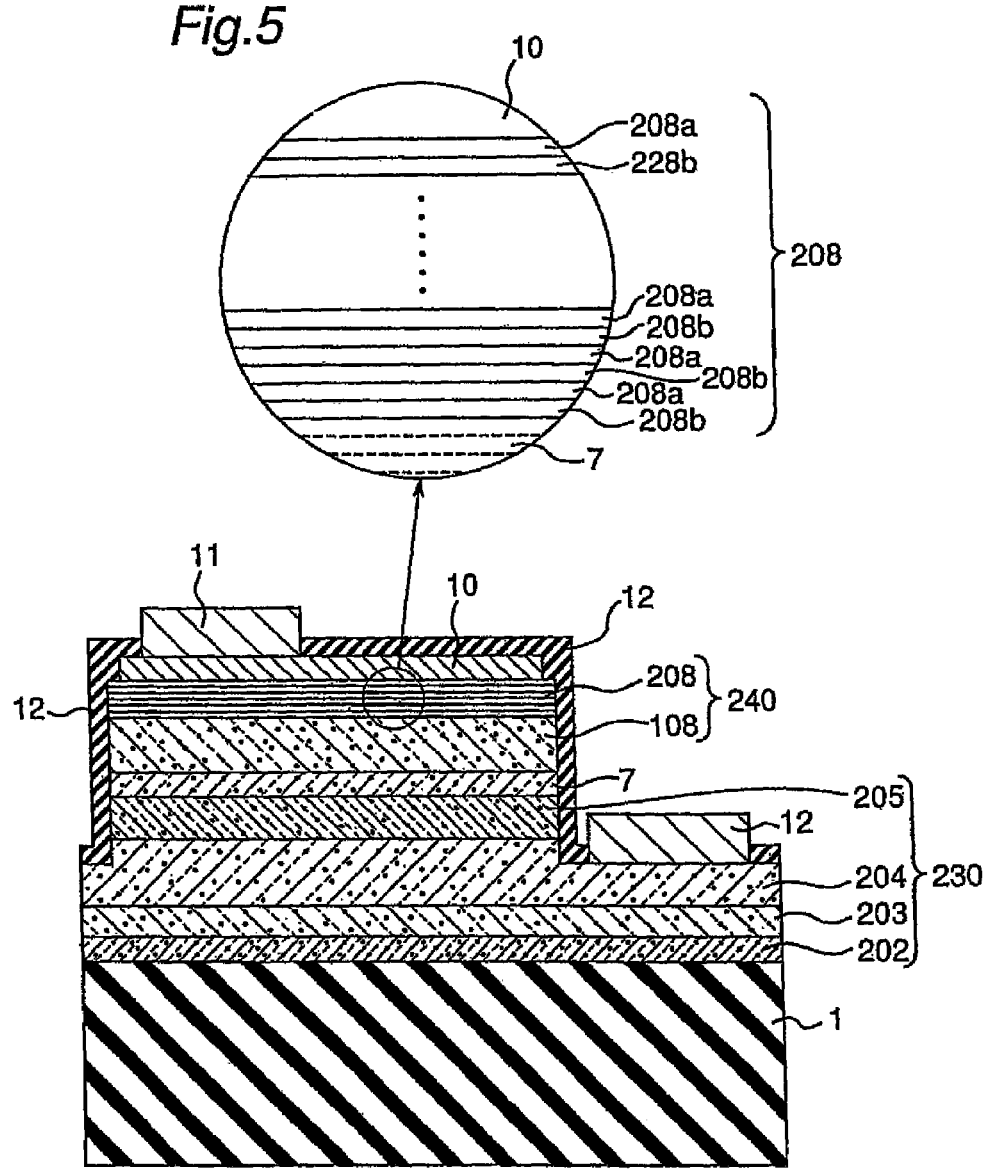
FIG. 5 is a schematic sectional view showing the structure of a nitride semiconductor device according to the third embodiment of the present invention.

As shown in FIG. 5, a nitride semiconductor fight emitting device according to the third preferred embodiment of the present invention, comprises, on a substrate 1 of material such as sapphire via a buffer layer 202, an n-side first nitride semiconductor layer 203, an n-side second nitride semiconductor layer 204, an n-side third nitride semiconductor layer 205, an active layer 7, a p-cladding layer 108, and a p-contact layer 208 formed subsequently thereon. In this embodiment 3, a transparent p-electrode 10 is formed on the approximately entire top surface of the p-contact layer 208 and a p-pad electrode 11 for bonding is farmed on a portion of the p-electrode 11. Also the emitting device has a portion where a surface of the n-side nitride semiconductor layer 204 is exposed and an n-electrode 12 is formed thereon.

As shown in FIG. 5, the nitride semiconductor light emitting device according to the third embodiment, includes an n-region 230 having the buffer layer 202, the n-side first nitride semiconductor layer 203, the n-side second nitride semiconductor layer 204, the n-side third nitride semiconductor layer 205, and also includes a p-region 240 having the p-cladding layer 108 and the p-contact layer 208.

The nitride semiconductor light emitting device according to the third embodiment is characterized in that the p-contact layer 208 has a superlattice structure alternatively depositing a first nitride semiconductor film 208a and a second nitride semiconductor film 208b that are made of composition different from each other, and in that at least one of the first and second nitride films 208a and 208b contain In. As described herein, the p-contact layer can be grown with a good crystallinity having much less lattice defect by forming a superlattice structure alternatively laminated with the first nitride semiconductor film 208a and the second nitride semiconductor film 208b, in which at least one of the first and second nitride semiconductor films contains In. Thus with comparison over the conventional light emitting device comprising an InGaN contact layer of a single-layered structure that is not the superlattice structure, the p-contact layer 208 according to the embodiment can be grown with a lower resistivity by itself and a better ohmic contact with the p-electrode 10.

Further describing in more detail about this embodiment 3, the p-contact layer 208 may be formed by combining, by way of example, the first nitride semiconductor film 208a and a second nitride semiconductor film 208b as indicated in Table 1.

TABLE 1

| | First nitride semiconductor film 208a | Second nitride semiconductor film 208b |
|---|---|---|
| 1 | $In_xGa_{1-x}N$ | GaN |
| 2 | $In_xGa_{1-x}N$ | $In_yGa_{1-y}N$ (x > y) |
| 3 | $In_xGa_{1-x}N$ | $Al_zGa_{1-z}N$ (0 < z < 1) |

In this third embodiment, in order for the first semiconductor layer to have little lattice defect, the suffix x in the $In_xGa_{1-x}N$ is set to be as x<0.5, preferably as x<0.4, and more preferably x<0.3.

Because as the p-contact layer 208 of the present invention is thicker, the resistibility along the thickness direction is higher, the thickness is set to be not greater than 0.1 µm, preferably not greater than 500 angstroms, and more preferably not greater than 200 angstroms. Also the thickness of each of the first and second nitride semiconductor films composing the p-contact layer 208 is set to be hot greater than 100 angstroms, preferably not greater than 70 angstroms, more preferably not greater than 50 angstroms, and most preferably within the range of 10 through 40 angstroms.

The reason why the film thickness of the first and second nitride semiconductor films composing the p-contact layer 208 is set to be preferably not greater than 100 angstroms is because where the thickness thereof is over than 100 angstroms, they are more than critical elastic thickness to cause more likeliness of the microscopic cracks or the lattice defect in the films and to deteriorate the effect of the superlattice structure. In this invention, as long as the first and second nitride semiconductor films 208a and 208b have the thickness of at least an one atom film, but preferably 10 angstroms or more as mentioned above.

And the p-contact layer 208 of this invention may be formed with the p-type conductivity as a whole by adding a p-type impurity such as Mg into at least one of the first and second nitride semiconductor films 208a and 208b. Further where both of the first and second nitride semiconductor films 208a and 208b are doped with the p-type impurity, the p-type impurity concentration of either one of nitride semiconductor films is preferably higher than that of the other (referred to as "modulation dope").

Thus by adjusting the impurity concentration of either one of the first and second nitride semiconductor films 208a or 208b to be higher than that of the other, more carriers are generated in one of the nitride semiconductor film having the higher impurity concentration, while the mobility in the nitride semiconductor film having the lower impurity concentration can be higher than that in the other nitride semiconductor film. Therefore both of the carrier concentration and the mobility as the whole superlattice layer alternatively laminated with the first and second nitride semiconductor films 208a or 208b, can be higher thereby reducing the resistivity of the p-contact layer 208. Thus because of the modulation dope in the p-contact layer 208 as mentioned above, the nitride semiconductor light emitting, device according to the third embodiment can reduce the forward voltage at the predetermined current.

Where the modulation dope is used, it is preferable that either one of the nitride semiconductor films is doped with the p-type impurity of the impurity concentration in the range of $1\times10^{19}$ through $5\times10^{21}/cm^3$, and the other film has the impurity concentration in the range of $5\times10^{16}$ through $3\times10^{19}/cm^3$ and also less than that of the former film. This is because where more than $5\times10^{21}/cm^3$ of the p-type impurity are added in the nitride semiconductor film, the crystallinity thereof is deteriorated and the resistivity thereof is so high that the good ohmic contact is difficult to be achieved. And where less than $5\times10^{18}/cm^3$ of the p-type impurity are added in the nitride semiconductor film, the carrier concentration is not enough that the emission output is reduced.

In the p-contact layer 208 of the present invention, either one of the first and second films can be the uppermost film and contact with the p-cladding layer 108. However according to the present invention, it is preferable that the first nitride semiconductor film 208a including In is formed at the uppermost, and the p-electrode 10 is formed on the first nitride semiconductor film 208a. As such, the ohmic contact resistivity between the p-contact layer 208 and p-electrode 10 can be reduced.

Since the first nitride semiconductor film 208a contain In or more amount of In than the second nitride semiconductor film 208b, the first nitride semiconductor film 208a has bandgap less than that of the second film 208b so that the energy gap between the lowest energy level in the conduction band of the metal forming the p-electrode and highest energy level in the valence band of the first nitride semiconductor film 208a thereby lowering the ohmic resistivity.

Also the nitride semiconductor light emitting device, according to the third embodiment, preferably comprises the p-cladding layer of the superlattice structure having a film made up of $Al_xGa_{1-x}N$ ($0<x\leq1$) and a film made up of $In_yGa_{1-y}N$ ($0\leq y<1$) that are alternatively deposited thereon. The thickness of each of the films composing the p-cladding layer is set to be not greater than 100 angstroms means not greater than the critical elastic thickness, preferably not greater than 70 angstroms, more preferably, not greater than 50 angstroms, most preferably within the range of 10 through 40 angstroms. Thus the resistivity of the p-cladding layer 108 can be reduced by forming the p-type cladding layer of the superlattice structure. The total thickness of the p-cladding layer 108 is preferably set to be within the range of the 100 angstrom through 2 μm, more preferably within the range of the 500 angstrom through 1 μm. By setting the layer thickness within the above range, the p-cladding layer 108 can function as a good carrier confinement layer and comparatively reduce its resistivity as a whole.

Embodiment 4

The nitride semiconductor light emitting device according to this embodiment 4, as shown in FIG. 5, has the same structure with an exception of the difference to the embodiment 3 that gradient composition films 208c are formed between the first and second nitride semiconductor films 208a and 208b. The gradient composition films 208c are referred to ones of which composition are gradually and continuously changed towards the direction of the thickness.

Figure 6:
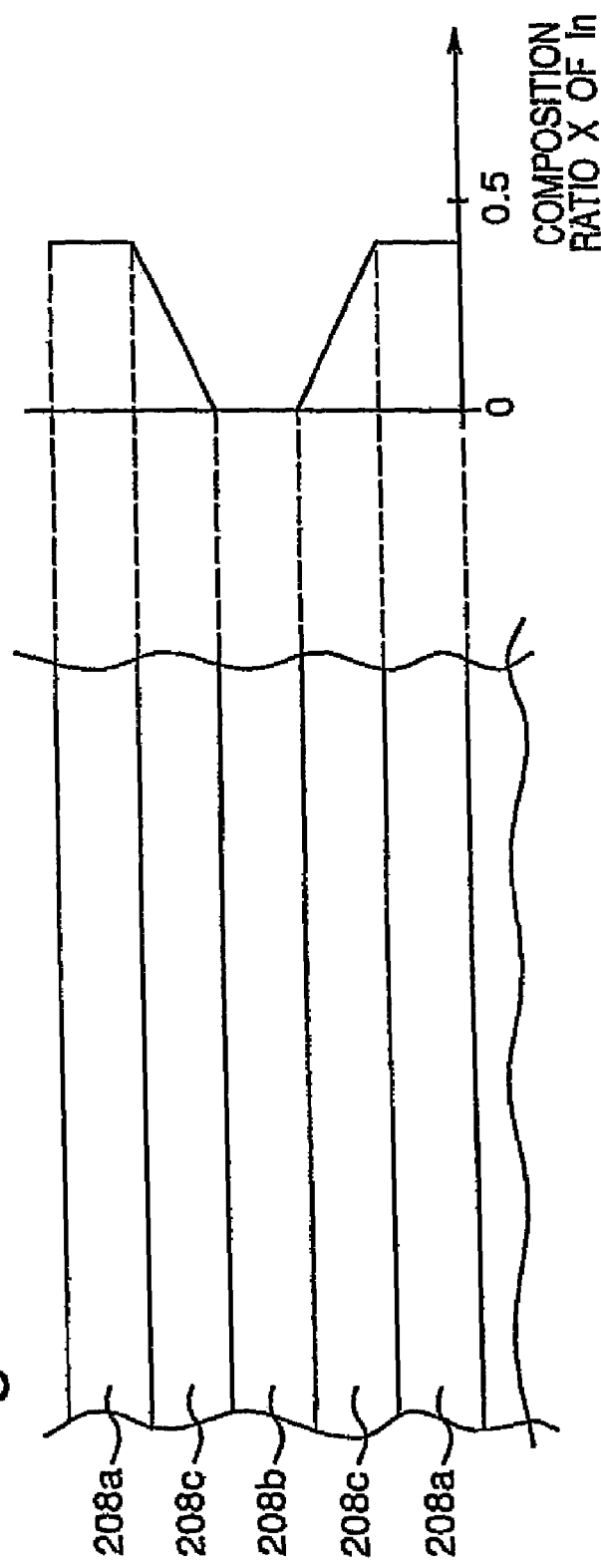
FIG. 6A is a sectional view showing the structure of a p-contact layer of the nitride semiconductor device according to the fourth embodiment of the present invention.
FIG. 6B is a chart schematically showing the composition of In of FIG. 6A.

For instance, where the first nitride semiconductor film 208a is made of $In_xGa_{1-x}N$ and the second nitride semiconductor film 208b is made of GaN, as shown in FIG. 6B, the gradient composition film 208c is a film gradually changing its composition ratio of In from the surface contacting the first nitride semiconductor film 208a towards the surface contacting the second nitride semiconductor film 208b along the thickness direction. In the embodiment 4, as long as the gradient composition film 208c gradually changes its composition ratio, it is not necessary to change it linearly along the thickness as indicated in FIG. 6B.

In the nitride semiconductor light emitting device according to the embodiment 4 that is composed as described above, since there is no discrete transition of the composition at the boundary between the first and second nitride semiconductor films 208a and 208b, particular elements can be prevented from segregating at the boundary. As the result of preventing the segregation of elements the first and second nitride semiconductor films 208a and 208b can be grown with less lattice defect. In the example that has the first nitride semiconductor film 208a of $In_xGa_{1-x}N$ and second nitride semiconductor film 208b of GaN, the segregation of In can be prevented so that the crystallinity can be improved.

Embodiment 5

Now referring to the schematic sectional view of FIG. 8, a nitride semiconductor light emitting device according to the fifth embodiment of the present invention will be described hereinafter.

Figure 8:
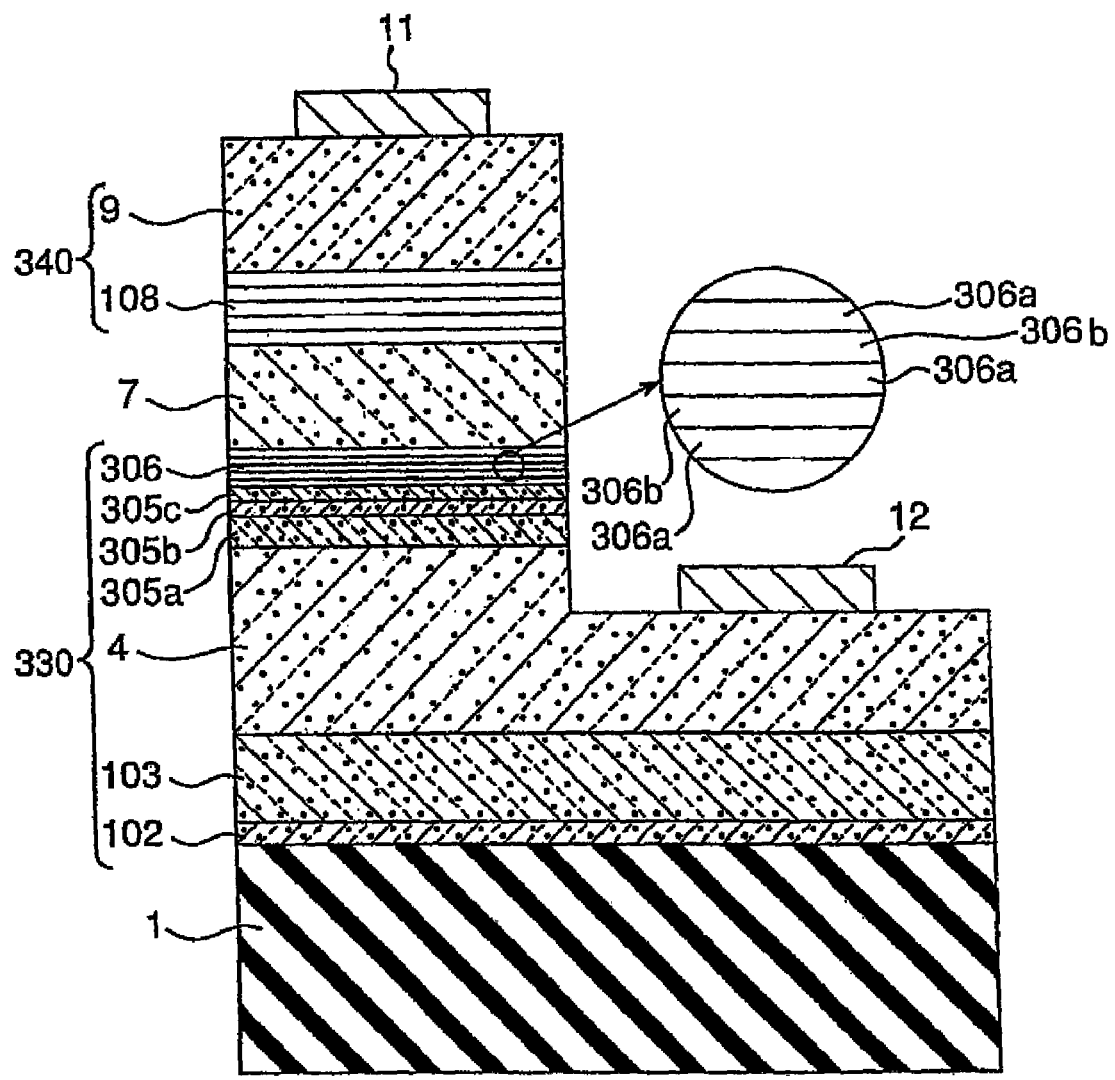
FIG. 8 is a schematic sectional view showing the structure of a nitride semiconductor device (LED device) according to the fifth embodiment of the present invention.

As shown in FIG. 8, the nitride semiconductor light emitting device according to the fifth embodiment, comprises, on a substrate 1 via a buffer layer 102, an undoped GaN layer 103, a n-contact layer 4 doped with a n-type impurity, an n-side first multi-film layer 305 having an undoped lower film 305a, an n-type impurity doped inter-film 305b, and an undoped upper film 305c, an n-side second multi-film layer 306 having a first nitride semiconductor film 306a and a second nitride semiconductor film 306b, an active layer 7 of multiple quantum well structure, a multi-film p-cladding layer 8 or a single-layered p-cladding layer 8, and a p-contact layer 9 of GaN doped with Mg, subsequently formed thereon. Further an n-electrode 12 and a p-electrode 11 are formed on the n-contact layer 4 and the p-contact layer 9 of GaN, respectively.

The nitride semiconductor light emitting device according to the embodiment comprises an n-region 330 including the buffer layer 102, the undoped GaN layer 103, the n-contact layer 4, and the first and second multi-film layers 305 and 306, and also a p-region 340 including the p-cladding layer 108 and p-contact layer 9 of GaN.

In this embodiment, semiconductor substrates of insulating material such as sapphire with C-, R-, or A-principal surface, and spinel ($MgAl_2O_4$), or other material such as SiC (including 6H—, 4H—, and 3C—SiC), and Si, ZnO, GaAs, GaN can be utilized for the substrate 1.

In the fifth embodiment, the buffer layer 102 is made up of the nitride semiconductor of $Ga_dAl_{1-d}$ (d is within the range of $0<d\leq1$). As the composition rate of Al becomes lower, preferably its crystallinity is enhanced more. And more preferably the buffer layer 102 is made of GaN.

The thickness of the buffer layer 102 is adjusted within the range of 0.002 through 0.5 μm, preferably in the range of 0.005 through 0.2 μm, more preferably in the range of 0.01 through 0.02 μm. Where the buffer layer 102 has thickness within the above-mentioned range, the crystal morphology of the nitride semiconductor layer becomes so good that the crystallinity of the nitride semiconductor grown on the buffer layer 102 is improved.

The growth temperature is adjusted in the range of 200 through 900° C., preferably in the range of 400 through 800° C. Where the growth temperature falls within the above-mentioned range, a good polycrystallinity can be obtained and then a good crystalline nitride semiconductor layer can be advantageously grown on the buffer layer 102 by using the polycrystalline as a seed crystal.

The buffer layer 102 grown in the low temperature may be omitted depending oh the substrate material and the growing process.

Next, in the fifth embodiment, the case where the undoped GaN layer 103 is grown without adding the n-type impurity will be explained. Where the undoped GaN 103 is grown on the buffer layer 102, a good crystallinity of the undoped GaN layer 103 can be obtained so that the crystallinity of the n-contact layer grown on the undoped GaN layer 103 is improved. The thickness of the undoped GaN layer 103 is 0.01 μm or more, preferably 0.05 μm or more, and more preferably 1 μm or more. The layer thickness is within the above-mentioned range, layers subsequent to the n-contact layer 4 can be advantageously grown with the crystallinity improved. Although not specifically limited thereto, the uppermost limit of the thickness of the undoped GaN layer 103 is appropriately adjusted with consideration of the manufacturing efficiency or the like.

In the fifth embodiment, the n-contact layer 4 containing the n-type impurity has the n-type impurity concentration of $3 \times 10^{18}/cm^3$ or more, preferably of $5 \times 10^{18}/cm^3$ or more. As such, where the n-type impurity is doped more into the n-contact layer 4, the Vf or the threshold current can be reduced. Where the impurity concentration is beyond the above-mentioned range, the Vf is difficult to be reduced. Where the n-contact layer 4 is farmed on the undoped GaN layer 103 with the low impurity concentration and the good crystallinity, the crystallinity of the undoped GaN layer 103 can be enhanced even though it contains the high concentrated n-type impurity therein. Although not specifically limited thereto, the uppermost limit of the n-type impurity concentration of the n-contact layer is preferably $5 \times 10^{21}/cm^3$ or less to secure the function as the contact layer 4.

The composition of the n-contact layer 4 can be $In_e Al_f Ga_{1-e-f}N$ ($0 \leq e$, $0 \leq f$, $e+f \leq 1$), although not specifically limited thereto, where the nitride semiconductor layer is GaN or the $Al_f(Ga_{1-f})N$ with the suffix f of 0.2 or less, the nitride semiconductor layer having less crystal defect can be easily obtained. Although the thickness of the n-contact layer is not specifically limited, since the n-contact layer 4 is one for forming the n-electrode 12 thereon, the thickness thereof falls within the range of 0.1 through 20 μm, preferably within the range of 0.5 through 10 μm, and more preferably in the range of 1 through 5 μm so that the resistivity and the Vf of the light emitting device can be advantageously reduced.

The n-contact layer 4 can be omitted in case where the n-side first multi-film layer 305 is formed of a thick layer as described below.

In the fifth embodiment, the n-side first multi-film layer 305 comprises at least three films including undoped lower film 305a nearest from the substrate 1, the inter-film 305b doped with n-type impurity, and the undoped upper layer 305c.

Even where each film composing the n-side first multi-film layer 305 does not often directly affect the device characteristics such as the electrostatic withstand voltage, by combining all films into the n-side first mufti-film layer 305, a particular result can be achieved in preferably improving the device characteristics, especially the output of light, emission and the electrostatic withstand voltage. This result is an unexpected result that was observed firstly after the device of such layered structure was actually formed. In other words, finding such result completed this invention.

The n-side first multi-film layer 305 may have films other than the lower film 305a through the upper film 305c as mentioned above. Also the n-side first multi-film layer 305 may contact with the active layer or have an another interlayer therebetween.

The nitride semiconductor including the lower film 305a through the upper film 305c can be formed, of various composition of the nitride semiconductor expressed in a formula of $In_g Al_h Ga_{1-g-h}N$ ($0 \leq g<1$, $0 \leq h<1$), and preferably it is made of the composition of GaN. Also the composition of each film of the n-side first multi-film layer 305 may be same or different.

Although the thickness of the n-side first multi-film layer 305 is not specifically, limited, it may fall within the range of 175 through 12000 angstroms, preferably in the range of 1000 through 10000 angstroms, more preferably in the range of 2000 through 6000 angstroms. When the thickness of the n-side first multi-film layer 305 is in the above-mentioned range, it is preferable because the Vf is optimized and the electrostatic withstand voltage is enhanced.

Each film of the n-side first multi-film layer 305, i.e. the lower film 305a, inter-film 305b, and the upper film 305c are preferably adjusted in thickness to have the total thickness of the n-side first multi-film layer 305 in the above-mentioned range.

Also in the fifth embodiment, although not specifically limited thereto, the following experiments and considerations are conducted to find the preferable ranges of the thickness for each film, i.e. the lower film 305a, inter-film 305b, and the upper film 305c composing the n-side first multi-film layer 305.

Figure 9A:
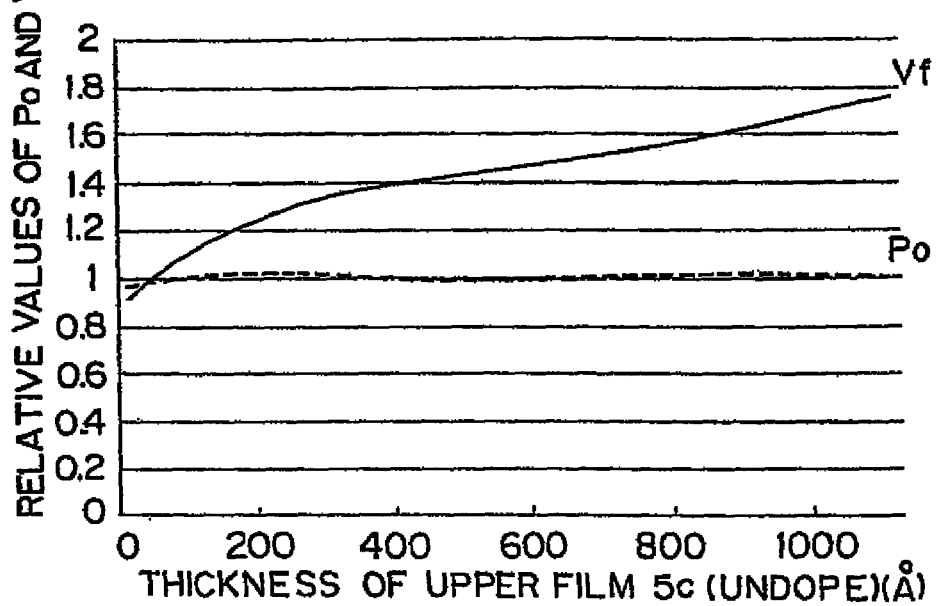
FIG. 9A is a chart showing the relative values of the P0 and the Vf over the thickness of the undoped upper film 305c of the nitride semiconductor device according to the fifth embodiment of the present invention.
Figure 9B:
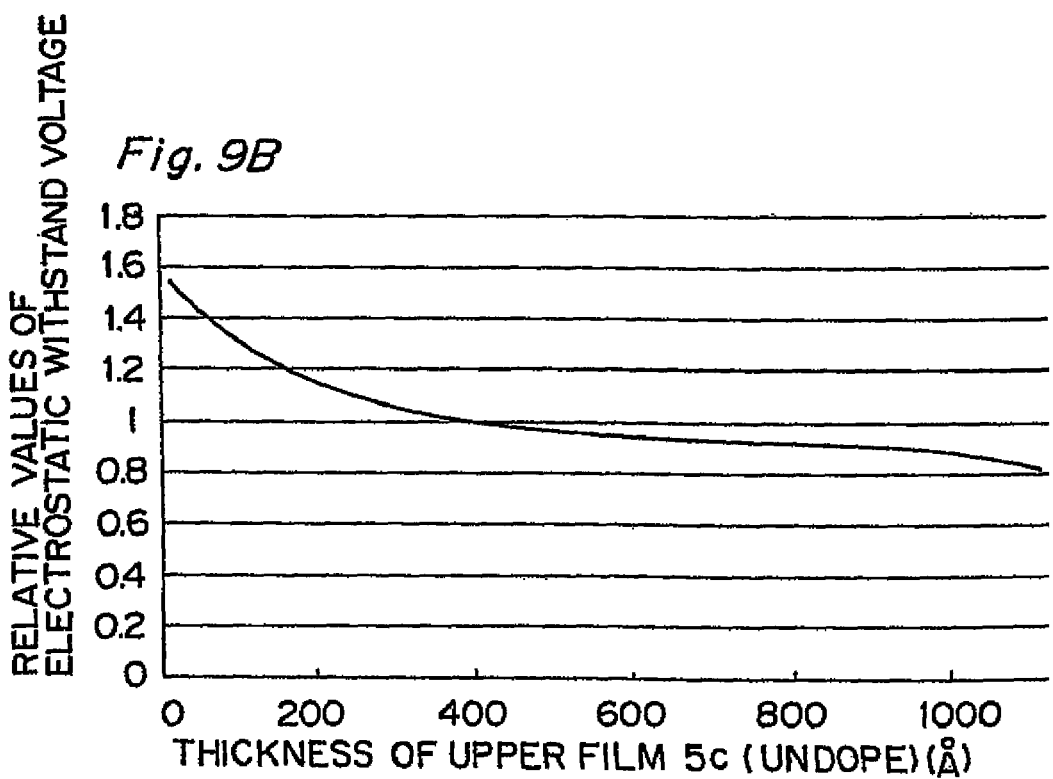
FIG. 9B is a chart showing the relative values of the electrostatic withstand voltage over the thickness of the undoped upper film 305c of the nitride semiconductor device according to the fifth embodiment of the present invention.

(1) Experiment 1

Where samples of the LED device are produced having the lower film 305a of thickness of 3000 angstroms and the inter-film 305b of thickness of 350 angstroms, and also having the upper layer of which thickness are subsequently changed, the characteristics of the forward voltage, the light emitting output, and the electrostatic withstand voltage were measured for each sample (each thickness of the layer). The results are shown in FIGS. 9A and 9B.

Figure 10A:
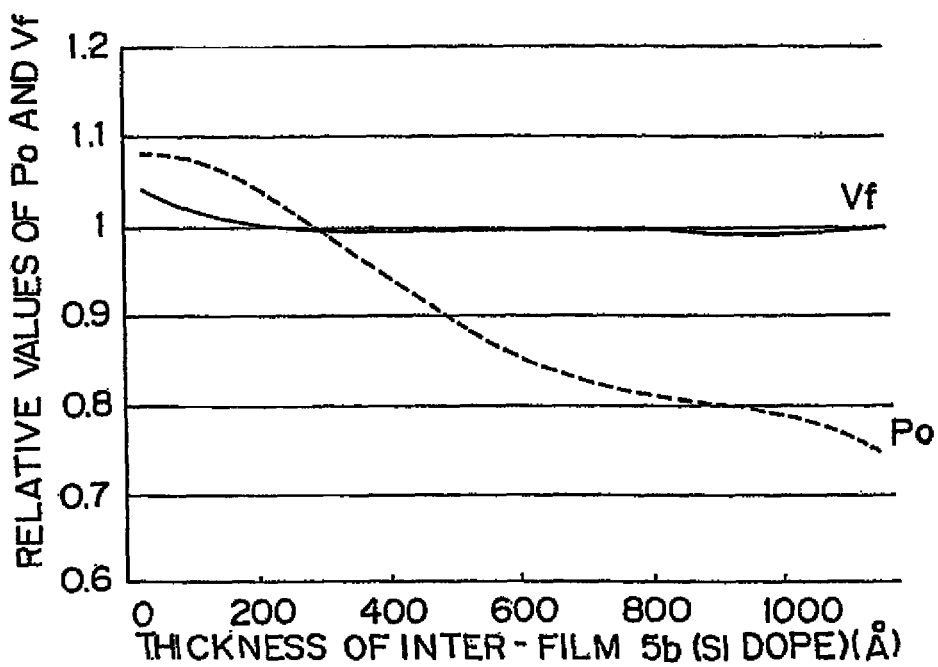
FIG. 10A is a chart showing the relative values of the P0 and the Vf over the thickness of the inter-film 305b of the nitride semiconductor device according to the fifth embodiment of the present invention.
Figure 10B:
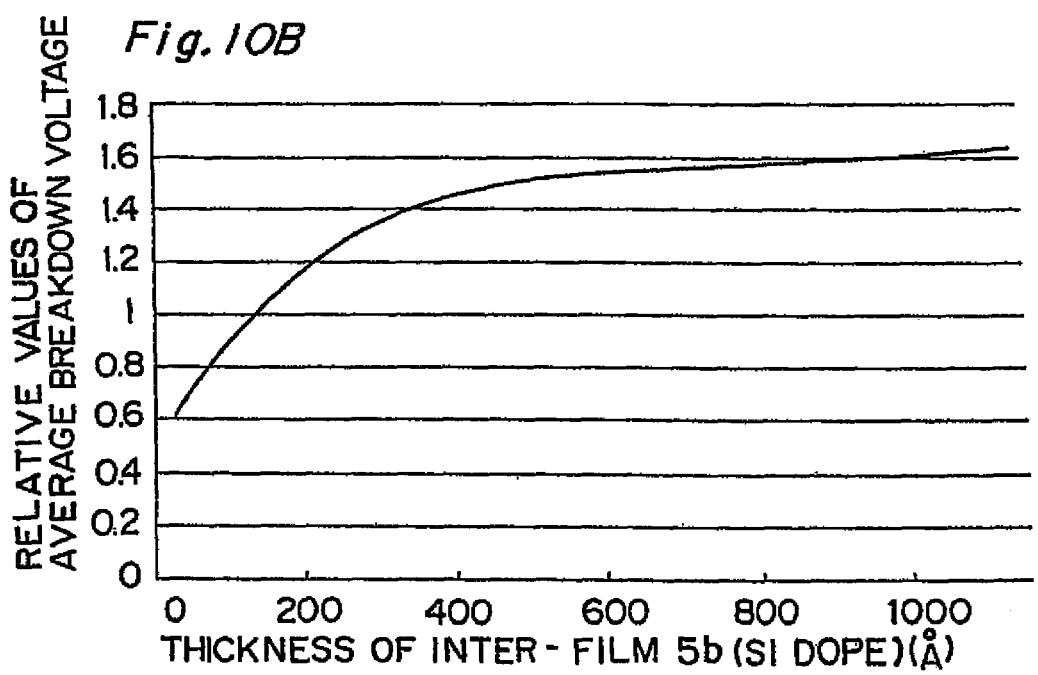
FIG. 10B is a chart showing the relative values of the electrostatic withstand voltage over the thickness of the inter-film 305b of the nitride semiconductor device according to the fifth embodiment of the present invention.

(2) Experiment 2

Where samples of the LED device are produced having the lower film 305a of 3000 angstroms and the upper film 305c of 50 angstroms, and also having the inter-film 305b of which thickness are subsequently changed, the characteristics of the forward voltage, the light emitting output, and the electrostatic withstand voltage were measured for each sample (each thickness of the layer). The results are shown in FIGS. 10A and 10B.

Figure 11A:
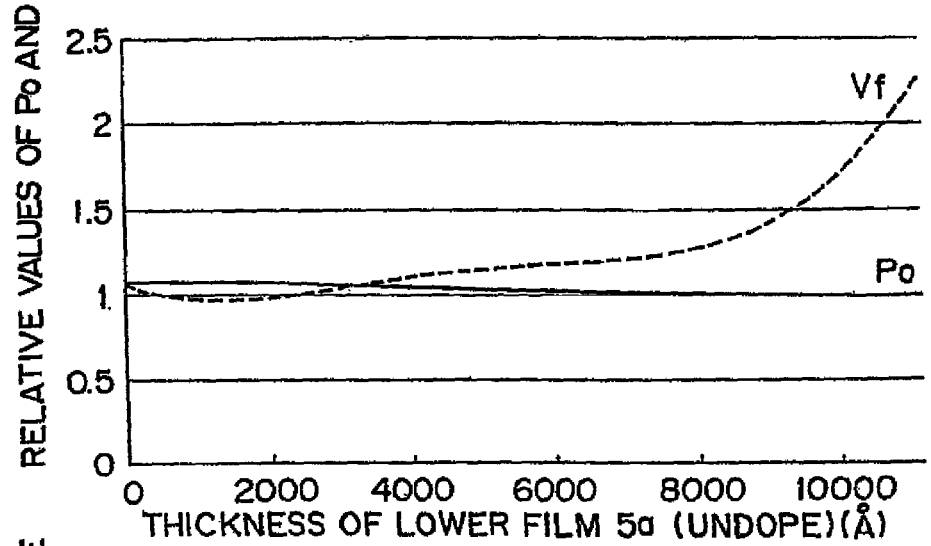
FIG. 11A is a chart showing the relative values of the P0 and the Vf over the thickness of the undoped lower film 305a of the nitride semiconductor device according to the fifth embodiment of the present invention.
Figure 11B:
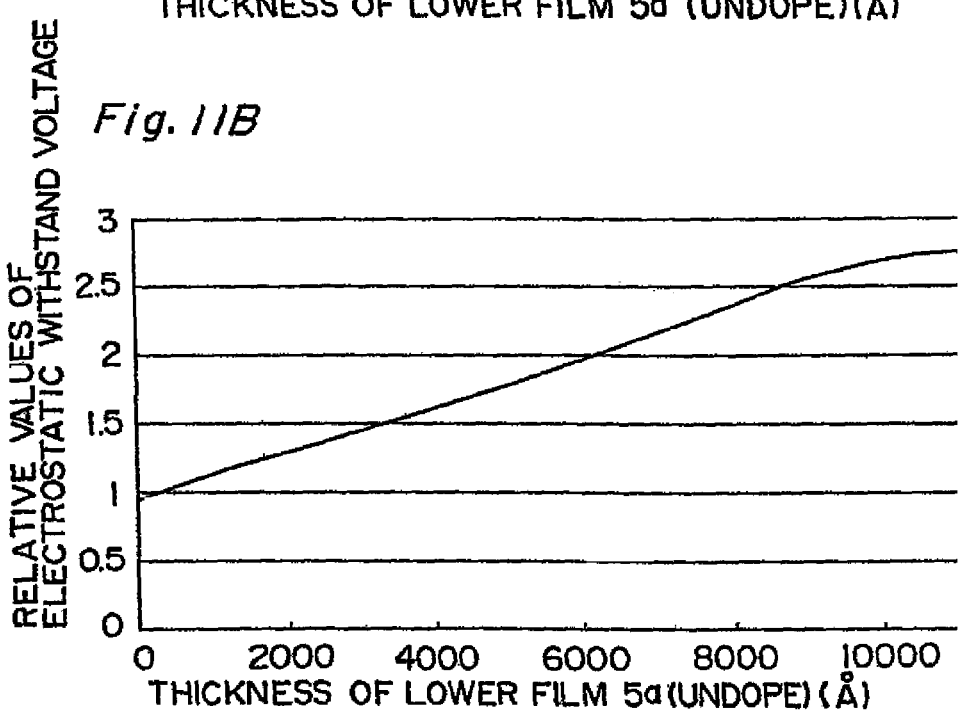
FIG. 11B is a chart showing the relative values of the electrostatic withstand voltage over the thickness of the undoped lower film 305a of the nitride semiconductor device according to the fifth embodiment of the present invention.

(3) Experiment 3

Where samples of the LED device are produced having the inter-film 305b of 350 angstroms and the upper film 305c of 50 angstroms and, and also having the lower layer of which thickness are subsequently changed, the characteristics of the forward voltage, the light emitting output, and the electrostatic withstand voltage were measured for each sample (each thickness of the layer). The results are shown in FIGS. 11A and 11B.

Each sample of the LED device was produced under the same condition described as the example 34 that will be described afterwards, with the exception in the thickness of each film of the n-side first multi-film layer 305. The characteristics shown in FIG. 9A through 11B are plotted by the relative values over the conventional LED device used for the example 34. In FIG. 9A through 11B, the $P_0$ and the Vf represent the light emitting output and the forward voltage, respectively.

In consideration of the results of the above-mentioned experiments, the thickness of the lower film 305a falls within the range of 100 through 10000 angstroms, preferably within the range of 500 through 8000 angstroms, and more preferably within the range of 1000 through 5000 angstroms. As shown in FIGS. 11A and 11B, as the lower film 305a gradually becomes thicker, the electrostatic withstand voltage becomes higher, while the Vf increases rapidly around at 10000 angstroms. On the other hand, as the lower film 305a becomes thinner, the Vf decreases while the electrostatic withstand voltage decreases and the productivity tends to be reduced at the thickness less than 100 angstroms due to the lower electrostatic withstand voltage.

Also since it is recognized that the lower film 305a reduces the adverse effect due to the poor crystallinity of the n-contact layer 4 containing the n-type impurity, it is preferable to grow the lower film 305a thick so as to improve its crystallinity.

The thickness of the inter-film 305b falls within the range of 50 through 1000 angstroms, preferably within the range of 150 through 500 angstroms, and more preferably in the range of 150 through 400 angstroms. Since the inter-film 305b doped with impurity, which has a sufficient carrier concentration, gives relatively great influence over the light emitting output, it tends to decrease the light emitting output without forming this inter-film 305b. Nevertheless, even where the inter-film 305b is as thin as about 25 angstroms, FIG. 10A shows that the light emitting output decreases slightly. This is because the thickness of other layers were adjusted even where the inter-film 305b had a thickness of 50 angstroms. And where the inter-film 305b is thicker than 1000 angstroms, the light emitting output tends to decrease substantially. Meanwhile, as shown in FIG. 10B, where the inter-film 305b is thick enough, the electrostatic withstand voltage is good, but where it is thinner than 50 angstroms, the electrostatic withstand voltage tends to decrease substantially.

The thickness of the undoped upper film 305c falls within the range of 25 through 1000 angstroms, preferably within the range of 25 through 500 angstroms, and more preferably within the range of 25 through 150 angstroms. This undoped upper film 305c is formed in contact with or most adjacent to the active layer among the first multi-film layer 305, hence, it affects a lot to the prevention of the leakage current. Where the upper film 305c is less than 25 angstroms, the leakage current tends to increase, and where it is more than 1.000 angstroms, as shown in FIGS. 9A and 9B, the Vf increases and the electrostatic withstand voltage decreases.

As described above, we noted the device characteristics that are easily affected by the varying thickness of each film, and determined the thickness for each layer within the above-mentioned range to optimize all device characteristics equally, especially the light emitting output and the electrostatic withstand voltage so that a comparatively high demanded standard are satisfied. Consequently we achieved products of which light emitting output as well as its reliability were preferably improved.

The combination of thickness for each film of the first multi-film layer 305 are adjusted appropriately in order to optimize the effect, based upon the condition, such as the various composition of the active layer defining the wavelength, and the shapes of the electrodes and the LED device. The combination of the varied thickness for each film within the above-described range, the device characteristics, especially the light emitting output and the electrostatic withstand voltage, can be enhanced over the conventional ones.

As long as the composition of each film composing the first multi-film layer 305 is expressed in the formula of $In_gAl_hGa_{1-g-h}N$ ($0 \leq g < 1$, $0 \leq h < 1$), the composition of each layer may be same or different, preferably the composition ratio of In and Al are small, more preferably they are made up of GaN.

Although the doping dose of the n-type impurity in the n-type impurity doped inter-film 305b of the first multi-film layer 305 is not specifically limited, the inter-film 305b contains the doping dose of $3 \times 10^{18}/cm^3$ or over, preferably $5 \times 10^{18}/cm^3$ or over. Although the upper limit of the doping dose of the n-type impurity is not specifically defined, it is preferable to set the doping dose of $5 \times 10^{21}/cm^3$ or less in order to deteriorate the crystallinity. It is preferable that the impurity concentration in the inter-film 305b of the first multi-film layer falls within the above-mentioned range, because the light emitting output is improved and the Vf is decreased.

An element from IVB or VIB Groups in the periodic table such as Si, Ge, Se, S, and O is selected as the n-type impurity, preferably Si, Ge, or S is used for the n-type impurity.

At the composition face of the first multi-film layer 305, each film acts as both films as long as it deteriorates the function of each film and the device.

Next, according to the fifth embodiment, an n-side second multi-film layer 306 is a multi-film layer alternatively deposited with a first nitride semiconductor film 306a containing In and a second nitride semiconductor film 306b that has a different composition from the first nitride semiconductor film 306a. At least one of, or both of the first and the second films 306a and 306b have a thickness of 100 angstroms or less, preferably 70 angstroms or less, more preferably 50 angstroms or less. By thinning the layers like this, the multi-film layer has a superlattice structure so that the crystallinity of the multi-film layer is enhanced thereby improving the emission output.

Even where only one of the first and second films 306a and 306b has a thickness of 100 angstroms or less, the thin layer has the critical elastic thickness so that the crystallinity is improved. Thus the crystallinity of either one of the first and second multi-film layer 306a and 306b that is formed on the thin layer is improved so that the multi-film layer as a whole shows a good crystallinity thereby enhancing the output of the device.

Where both of the first and second films have a thickness of 100 angstroms or less that means less than the critical elastic thickness of a nitride semiconductor of the single-layered structure, the nitride semiconductor can be grown with a better crystallinity than that in case where none of, or one of the films are grown having a thickness of 100 angstroms or less. Also where both of the films have thickness of 70 angstroms or less, the n-side second multi-film layer 306 has a superlattice structure so that the active layer can be grown on the good crystallinity multi-film layer 306 with a much better crystallinity since the n-side second multi-film layer 306 acts as a buffer layer.

According to the fifth embodiment, where the first multi-film layer 305 and the second multi-film layer 306 are combined in the n-region 330, advantageously the light emitting output is enhanced and the Vf is reduced. Although the reason is not clearly confirmed, it seems because the crystallinity of the active layer formed on the n-side second multi-film layer 306 is improved.

Each of at least one of the first and second nitride semiconductor films 306a and 306b of the n-side second multi-film layer 306 may have the same as or different thickness from the adjacent one of the first and second nitride semiconductor films 306a and 306b, respectively. The thickness of at least one of the first and second nitride semiconductor films 306a and 306b of the n-side second multi-film layer 306 are preferably different from that of the adjacent one of the first and second nitride semiconductor films 306a and 306b, respectively.

Different thickness from that of the adjacent one means that, where a plurality of the first nitride semiconductor film 306a and the second nitride semiconductor film 306b are deposited to form the multi-film layer, the thickness of the first nitride semiconductor film 306a (the second nitride semiconductor film 306b) is different from the thickness of the first nitride semiconductor film 306a (the second nitride semiconductor film 306b) which sandwiches thereof.

For instance, where the first and second nitride semiconductor films 306a and 306b are made of InGaN and GaN, respectively, the InGaN film sandwiched between the GaN films can be thicker or thinner as the InGaN film is closer to the active layer so that the multi-film layer has varied refractive indices therein thereby forming a layer with the gradually and substantially changing refractive index. Therefore we can expect the substantially same effect as where forming the nitride semiconductor layer with the gradient composition films. Thus in case that the device requires a waveguide like a laser device, the multi-film layer formed as the waveguide can be used for modulating the laser beam.

At least one of the first and second nitride semiconductor films 306a and 306b may have the same or different composition of elements from the III Group from the adjacent one of the first and second nitride semiconductor films 306a and 306b, respectively. At least one of the first and second nitride semiconductor films 306a and 306b has preferably different composition of elements from the III Group from the adjacent one of the first and second nitride semiconductor films 306a and 306b, respectively. Different composition of the III Group element from that of the adjacent one means that, where a plurality of the first nitride semiconductor film 306a and the second nitride semiconductor film 306b are deposited to form the multi-film layer, the composition ratio of the 111 Group element of the first nitride semiconductor film 306a (the second nitride semiconductor film 306b) is different from the composition ratio of the first nitride semiconductor film 306a (the second nitride semiconductor film 306b) which sandwiches thereof.

For instance, where the first and second nitride semiconductor films 306a and 306b are made of InGaN and GaN, respectively, the InGaN film sandwiched between the GaN films can have more or less composition ratio of In, as the InGaN film is closer to the active layer so that the multi-film layer has varied refractive indices therein thereby forming a layer with the gradually and substantially changing refractive index. It is to be noted that as the composition ratio of In decreases, the refractive index tends to decreases.

The n-side second multi-film layer 306 comprises, as shown in FIG. 8, the first nitride semiconductor film 306a containing In and the second nitride semiconductor film 306b made of the composition different from that of the first nitride semiconductor film 306a, which are alternatively laminated.

In the n-side second multi-film layer 306, at least one film of each of the first and second nitride semiconductor films is deposited, which means two films in total, preferably three films in total, or more preferably at least two films of each film are deposited, that means 4 films in total.

The n-side second multi-film layer 306 may be spaced away from the active layer, but most preferably formed in contact with the active layer. Where it is formed in contact with the active layer, the output tends to increase.

In case that the n-side second multi-film layer 306 is formed in contact with the active layer, the first film contacting with the first layer of the active layer, i.e. the well layer or the barrier layer, may be either one of the first nitride semiconductor film and the second nitride semiconductor film, and the depositing sequence of the h-side second multi-film layer 306 is not specifically limited. Further, as shown in FIG. 8, the n-side second multi-film layer 306 is formed in contact with the active layer, but any other n-type nitride semiconductor layer may be formed between the active layer 7 and the n-side second multi-film layer 306.

The first nitride semiconductor film 306a is made of the nitride semiconductor containing In, preferably of the ternary compound $In_kGa_{1-k}N$ (0<k<1), and more preferably the suffix k is 0.5 or less, and the most preferably the suffix k is 0.2 or less. On the other hand, as long as the composition of the second nitride semiconductor film 306b is different from that of the first nitride semiconductor film 306a, the composition is not specifically limited. However, in order to form the second nitride semiconductor with a good crystallinity, it is preferable to grow the second nitride semiconductor made of the binary or ternary compound of $In_mGa_{1-m}N$ (0≦m<1, m<k) with bandgap greater than that of the first nitride semiconductor. More preferably, the second nitride semiconductor film is made up of GaN. Where the second nitride semiconductor is GaN, then the multi-film layer with good crystallinity as a whole can be grown. The preferable combination is $In_kGa_{1-k}N$ (0<k<1) for the first nitride semiconductor film 306a and $In_mGa_{1-m}N$ (0≦m<1, m<k) for the second nitride semiconductor film 306b, preferably GaN for the second nitride semiconductor film 306b. The more preferable combination is $In_kGa_{1-k}N$ for the first nitride semiconductor film 306a with the suffix k of 0.5 or less and GaN for the second nitride semiconductor film 306b.

None of, or both of the first and second nitride semiconductor films 306a and 306b may be doped with the n-type impurity, or either one of them may be doped with the n-type impurity (modulation doping). However in order to enhance the crystallinity, it is most preferable to have both films undoped with the n-type impurity, second most preferably either one of them is undoped, and permissively both of them are doped.

Doping with the n-type impurity into either one of the first and second nitride semiconductor films 306a and 306b is referred to as a modulation doping, and the us of the modulation doping brings the tendency of the higher light emission.

It is to be noted that elements from Group IV and VI such as Si, Ge, Sn, and S are selected as the n-type impurity, preferably Si and Sn are used.

In case that the n-type impurity is doped, the impurity concentration is adjusted to be $5 \times 10^{21}/cm^3$ or less, and preferably $1 \times 10^{20}/cm^3$ or less. The impurity concentration greater than $5 \times 10^{21}/cm^3$ causes crystalline deterioration to reduce the light emission. This is also adapted for the modulation dope.

According to the fifth embodiment, the active layer 7 of the multi quantum well structure is formed of the nitride semiconductor containing in and Ga, preferably made up of the formula of $In_aGa^{1-a}N$ ($0 \leqq a < 1$). Further the active layer may be doped with the p- or n-type impurity but preferably undoped (no impurity added) to obtain the strong band-to-band emission and the sharp wavelength with the narrow half width. The active layer 7 may be doped with the p- or n-type impurity. Where the active layer 7 is doped with the n-type impurity, the band-to-band emission can be intensified compared with that of the undoped active layer. Where the active layer 7 is doped with the p-type impurity, the peak wavelength can be shifted towards the longer wavelength with the gap corresponding to the energy of 0.5 eV, but the half width is broader than that of the undoped active layer. Where the active layer 7 is doped with the p-type impurity and n-type impurity, the band-to-band emission can be further intensified compared with that of the active layer doped with only the p-type impurity. Where the active layer is doped with the p-type impurity, preferable it is, as a whole, made of the n-type conductive semiconductor by doping Si or the like therein. It is to be noted that the undoped active layer has most crystallinity.

The sequence of the barrier and the well layers of the active layer 7 is not specifically limited, any laminating sequence of the layers may be adapted such as, depositing firstly the well layer and lastly the well layer, depositing firstly the well layer and lastly the barrier layer, depositing firstly the barrier layer and lastly the barrier layer, and depositing firstly the barrier layer and lastly the well layer. The thickness of the well layer is adjusted to be 100 angstroms or less, preferably 70 angstroms or less, and more preferably 50 angstroms or less. Although not specifically limited thereto, the upper limit of the thickness of the well layer is not less than one atom film and preferably not less than 10 angstroms. Where the thickness of the well layer is more than 100 angstroms, the output is difficult to be increased.

On the other hand, the thickness of the barrier layer is adjusted to be 2000 angstroms or less, preferably 500 angstroms or less, and more preferably 300 angstroms or less. Although not specifically limited thereto, the upper limit of the thickness of the barrier layer is not less than one atom film and preferably not less than 10 angstroms. Where the thickness of the barrier layer falls within the above-mentioned range, the emission output is advantageously improved. Also the total thickness of the active layer is not specifically limited, but in consideration of the desired wavelength of LED device or the like, the number and the sequence of well layers and barrier layers as well as the total thickness of the active layer 7 are adjusted.

In the fifth embodiment, the p-cladding layer 8 comprises a third nitride compound film 108a having great bandgap and a fourth nitride compound film 108b having bandgap less than that of the third nitride compound film 108a. The p-cladding layer 8 may be a multi-film layer laminating the third and fourth nitride semiconductor films 108a and 108b having the same or different p-impurity concentration, or a single-layered layer of $Al_bGa_{1-b}N$ ($0 \leqq b \leqq 1$) containing the p-type impurity.

Now the p-cladding layer 8 where it is a multi-film p-cladding layer having a multi-film structure (superlattice structure) will be described hereinafter.

The thickness of third and fourth nitride semiconductor films 108a and 108b composing the multi-film p-cladding layer are adjusted to be 100 angstroms or less, preferably 70 angstroms or less, and more preferably in the range of 10 through 40 angstroms. The third and fourth nitride semiconductor films 108a and 108b may have the same or different thickness. Where the thickness of each of the multi-film layer structure falls within the above-mentioned range, the thickness is not greater than the critical elastic thickness, so that the better crystalline nitride semiconductor can be grown than that of the conventional one grown with a thicker layer. Because of that, the p-layer doped, with the p-type impurity can be obtained with the high carrier concentration and the low resistivity due to its better crystallinity of the nitride semiconductor films so that the Vf or the threshold current tend to decrease. Where each of the third and fourth nitride semiconductor films 108a and 108b of such thickness is referred as one paired film, a plural of paired film are deposited to form the multi-film layer. And the total thickness of the multi-film p-cladding layer 8 is adjusted by modifying the thickness of each film and the depositing number of the paired films. Although not specifically limited thereto, the total thickness of the multi-film p-cladding layer 8 is 2000 angstroms or less, preferably 1000 angstroms or less, and more preferably 500 angstroms or less. Where the total thickness falls within the above-mentioned range, advantageously the light emitting output is high and the Vf is reduced.

The third nitride semiconductor film 108a is formed of a nitride semiconductor containing at least Al, or preferably formed of $Al_nGa_{1-n}N$ ($0 < n \leqq 1$). The fourth nitride semiconductor film 108b is formed of the binary or ternary compounds, preferably such as $Al_pGa_{1-p}N$ ($0 < p \leqq 1$, $n > p$) and $In_rGa_{1-r}N$ ($0 \leqq r \leqq 1$). Where the p-cladding layer 8 has the superlattice structure, the crystallinity tends to be improved so that the resistivity and the Vf tend to be reduced.

The third and fourth nitride semiconductor films 108a and 108b of the multi-film p-cladding layer have the different p-type impurity concentration from each other, thus the impurity concentration of one film is greater than that of the other film. As well as the n-cladding layer 12, where the p-type impurity concentration of the third nitride semiconductor film 108a with bandgap greater than that of the fourth nitride semiconductor film 108b is greater than that of the fourth nitride semiconductor film 108b, or where the fourth nitride semiconductor film 108b is undoped, the threshold voltage and the Vf or the like are reduced. On the contrary, the p-type impurity concentration of the third nitride semiconductor film 108a with bandgap greater than that of the fourth nitride semiconductor film 108b may be less than that of the fourth nitride semiconductor film 108b.

The doping dose of the p-type impurity into the third nitride semiconductor film 108a is preferably set to fall within the range of $1 \times 10^{16}/cm^3$ through $1 \times 10^{21}/cm^3$, more preferably $1 \times 10^{19}/cm^3$ through $5 \times 10^{20}/cm^3$. Where the doping dose is less than $1 \times 10^{18}/cm^3$, the difference of the dopant dose between the third and fourth nitride semiconductor films becomes so small that it is difficult to obtain the layer with high carrier concentration. And the doping dose of $1 \times 10^{21}/cm^3$ or more causes the crystalline deterioration. On the other hand, it is sufficient that the doping dose of the p-type impurity into the fourth nitride semiconductor film 108b is less than that of the third nitride semiconductor film 108a, but preferably the doping dose in the fourth film 108b is one-tenth less than that of the third film 108a. Most preferably, the fourth nitride semiconductor film 108b is undoped so that the highest movability can be achieved, but in that case, since the p-type impurity is diffused from the third nitride semiconductor film due to the thin film, the impurity concentration is preferably adjusted not greater $1 \times 10^{20}/cm^3$. This is also adapted to the case where the p-type impurity concentration of the third nitride semiconductor film 108a with bandgap greater, than that of the fourth nitride semiconductor film 108b is less than that of the fourth nitride semiconductor film 108b.

Elements selected from the IIA and IIB groups in the periodic table, such as Mg, Zn, Ca, and Be can be selected as the p-type impurity, and preferably Mg, Ca, or the like is used as the p-type impurity.

In the nitride semiconductor layer composing the multi-films layer, it is desirable that the impurity doped films around the middle position along the thickness direction have more impurity concentration than those adjacent to both end positions, which are preferably undoped, so that the resistivity can be reduced.

Next, in the case where the p-cladding layer 8 is formed of a single-layered structure of $Al_bGa_{1-b}N$ ($0 \leq b \leq 1$), the thickness of the p-cladding layer 8 is 2000 angstroms or less, preferably 1000 angstroms or less, and more preferably within the range of 100 though 500 angstroms. When the thickness falls within the above-mentioned range, advantageously the light emitting output is intensified and the Vf is reduced. The composition of the p-cladding layer 8 is made of $Al_bGa_{1-b}N$ ($0 \leq b \leq 1$).

The crystallinity of the single-layered p-cladding layer 8 is not as good as that of the above-mentioned multi-film p-cladding layer, but by combining the single-layered p-cladding layer with the first multi-film layer 4, the single-layered p-cladding layer can be grown with good crystallinity, and also the threshold current and Vf can be reduced. In addition to that the combination of the single-layered p-cladding layer with the first multi-film layer 4 can suppress the characteristics deterioration, because of the single-layered layer, it can advantageously simplify the process for manufacturing thereof.

The p-type impurity concentration of the single-layered p-cladding layer 8 is set to be within the range of $1\times10^{18}/cm^3$ through $1\times10^{21}/cm^3$, preferably $5\times10^{18}/cm^3$ through $5\times10^{20}/cm^3$, more preferably $5\times10^{19}/cm^3$ through $1\times10^{20}/cm^3$. Where the p-type impurity concentration falls within the above-mentioned range, advantageously the p-type layer can be grown with a good crystallinity.

Also according to the fifth embodiment, the p-contact layer 9 of GaN doped with Mg has the binary compound nitride semiconductor of the composition not containing In and Al. If it contains In or Al, the ohmic contact with the p-electrode 11 cannot be achieved so that the light emitting output is reduced. The thickness of the p-contact layer 9 falls within the range of 0.001 µm through 0.5 µm, preferably 0.01 µm through 0.3 µm, and more preferably 0.05 µm through 0.2 µm. Where the thickness is less than 0.001 µm, the p-contact layer 9 tends to electrically short-circuit with the p-type cladding layer 8 of AlGaN so that it is difficult to function as a contact layer. Where the thickness is more than 0.5 µm, since the binary compound contact layer of GaN are deposited on the ternary compound cladding layer of AlGaN, the lattice defects easily run within the p-contact layer 9 of GaN due to the misfit between both crystals to cause the crystalline deterioration. It is to be noted that as the contact layer 9 is thinner, the Vf can be reduced more and the light emitting output can be enhanced. Also where Mg is used as the p-type impurity in the p-contact layer 9 of GaN, it is easy to achieve the p-type characteristics as well as the ohmic contact. The impurity concentration of Mg falls within the range of $1\times10^{18}/cm^3$ through $1\times10^{21}/cm^3$, preferably $5\times10^{19}/cm^3$ through $3\times10^{20}/cm^3$, more preferably of approximately $1\times10^{20}/cm^3$. Where the impurity concentration of Mg falls within the above-mentioned range, advantageously the p-type layer can be easily grown with good crystallinity and the Vf is reduced The n-electrode 12 and p-electrode 11 are formed on the n-contact layer 4 and the p-contact layer 9 of GaN doped with Mg, respectively. Although not specifically limited, any materials for the n-electrode and the p-electrode can be selected, for example, W/Al and Ni/Au can be used for the n-electrode and the p-electrode, respectively.

Embodiment 6

Now a nitride semiconductor device according to sixth embodiment of the present invention will be described hereinafter.

Since the nitride semiconductor device according to the sixth embodiment includes an n-side multi-film layer and a p-side multi-film layer, and have the same basic structure as the embodiment 1. Accordingly, referring to FIG. 1, further explanation will be provided hereinafter.

The nitride semiconductor device according to the sixth embodiment, comprises, on a sapphire substrate 1, a buffer layer 2, an undoped GaN layer 3, an n-contact layer 4 of GaN doped with Si, an undoped GaN layer 5, a n-side multi-film layer 6, an active layer 7 of a multiple quantum well structure of InGaN/GaN, a p-side multi-film layer 8, and a p-contact layer 9 of GaN doped with Mg, sequentially formed thereon. The sixth embodiment is different from the first embodiment in that the composition and/or the depositing number of each nitride semiconductor film composing the above-mentioned n-side multi-film layer 6 and p-side multi-film layer 8. In the nitride semiconductor device according to the sixth embodiment, various multi-film layers as described for the first through fifth embodiment can be used as the n-side multi-film layer 6 and the p-side multi-film layer 8.

In FIG. 1, one n-side and p-side multi-film layers are deposited as the n-type and p-type nitride semiconductor, respectively, but more than two n-side and p-side multi-film layers may be deposited in the n-region and the p-region, respectively. For instance, where the above-mentioned undoped GaN layer 5 is made of a multi-film layer comprising an undoped nitride semiconductor lower film that is closest to the substrate 1, a nitride semiconductor inter-film, and an undoped nitride semiconductor upper film sequentially formed thereon, the light emitting output, the Vf, and electrostatic withstand voltage can be advantageously improved. As such, where two kinds of n-side multi-film layers are grown in the n-region, the number of the laminated film in either one of the n-side multi-film layer should be more than that of the p-side multi-film layer.

Firstly, the n-side multi-film layer will be described hereinafter.

In the sixth embodiment, as long as the n-side multi-film layer 6 comprises at least two kinds of the nitride semiconductor films which have different composition from each other, two kinds of compositions can be selected such as $Al_zGa_{1-z}N$ ($0 \leq z < 1$) for the first nitride semiconductor film, and $In_pGa_{1-p}N$ ($0 < p < 1$) for the second nitride semiconductor film.

As the suffix z in the chemical formula representing the first nitride semiconductor film becomes smaller, the composition is preferable to cause the good crystallinity. And more preferably the suffix z is zero, i.e. the composition is made of GaN.

Also the suffix p in the chemical formula representing the second nitride semiconductor Film is preferably of 0.5 or less, and more preferably of 0.1 or less, that means the composition is made of $In_pGa_{1-p}N$.

According to this embodiment, the desirable combination of the first and second nitride semiconductor films are GaN and $In_xGa_{1-x}N$, wherein the suffix x is 0.5 or less, respectively.

The n-side multi-film layer 6 made of the above-mentioned composition may be formed of at least one film for each of the first and second nitride semiconductor films, i.e. two films in total, or three films, preferably formed of at least two films for each of the first and second nitride semiconductor films, i.e. four films in total, more preferably formed of at least seven films for each of the first and second nitride semiconductor films, i.e. fourteen films in total.

Although not specifically limited thereto, the uppermost limit of the laminating number of the first and second nitride semiconductor films is, for example, of 500 or less. Where the number is over 500, it takes too much time to deposit the films and the device characteristics are slightly deteriorated.

Although the thickness of the n-side multi-film layer 6 of the single-layered structure is not specifically limited, at least one kind of two nitride semiconductor films has the thickness of 100 angstroms or less, preferably 70 angstroms or less, and more preferably 50 angstroms or less.

Like this, by thinning the thickness of the single-layered nitride semiconductor layer composing the n-side multi-film layer 6, the multi-film layer can be grown of a superlattice structure to form the multi-film layer of the good crystallinity to enhance the output.

Where the n-side multi-film layer 6 comprises the first and second nitride semiconductor films, the thickness of at least either one of the films is set to be 100 angstroms or less, preferably 70 angstroms or less, and more preferably 50 angstroms or less.

Where at least one of the first and second nitride semiconductor films is a thin film of 100 angstroms or less, such film is thinner than the critical elastic thickness to enhance the crystallinity. Where an another film with thickness less than the critical elastic thickness is further grown on the crystallinity enhanced film, the crystallinity is more enhanced. Therefore as the first and second nitride semiconductor films are deposited in more times, the crystallinity of the n-side multi-film layer 6 as a whole also much more improved so that the light emitting output of the device is intensified.

The thickness of both of the first and second nitride semiconductor films of the n-side multi-film layer 6 are 100 angstroms or less, preferably 70 angstroms or less, and more preferably 50 angstroms or less.

Where the thickness of both of the first and second nitride semiconductor films of the n-side multi-film layer 6 are 70 angstroms or less, the multi-film layer 6 has a superlattice structure so that the active layer can be grown with good crystallinity as it is formed on the good crystalline superlattice structure because the n-side multi-film layer 6 functions as a buffer layer.

Although not specifically limited thereto, the thickness of the n-side multi-film layer falls within the range of 25 through 10000 angstroms, preferably 25 through 5000 angstroms, and more preferably 25 through 1000 angstroms. Where the thickness falls within the above-mentioned range, the crystallinity and the device output are improved.

Although the position of the n-side multi-film layer 6 to be formed is not specifically defined, it may be formed in contact with or spaced apart from the active layer 7. It is desirable to form the n-side multi-film layer 6 in contact with active layer 7.

Where the n-side multi-film layer 6 is formed in contact with active layer 7, either one of the first and second nitride semiconductor films may be contacted with the first layer of the active layer 7, i.e. the well layer or the barrier layer. As such, the laminating sequence of the first and second nitride semiconductor films composing the n-side multi-film layer 6 is not specifically limited. Thus any laminating sequence may be adapted such as, laminating the first nitride semiconductor film at the bottom and the first nitride semiconductor film at the uppermost, laminating the first nitride semiconductor film at the bottom and the second nitride semiconductor film at the uppermost, laminating the second nitride semiconductor film at the bottom and the first nitride semiconductor film at the uppermost, and laminating, the second nitride semiconductor film at the bottom and the second nitride, semiconductor film at the uppermost.

Although the n-side multi-film layer 6 is formed in contact with the active layer 7 according to FIG. 1, as mentioned above, where it is spaced apart from the active layer 7, an another n-type nitride semiconductor layer may be formed between the n-side multi-film layer 6 and the active layer 7.

In the sixth embodiment, each of the nitride semiconductor films composing the n-side multi-film layer 6 such as the first and second nitride semiconductor films may be undoped or doped with the n-type impurity.

In the sixth embodiment, the term of "undoped" represents the status not being doped intentionally, that includes the status even where the impurity is diffused from the adjacent nitride semiconductor layers according to the present invention. The impurity concentration due to the diffused impurity often has a gradient concentration in the layers.

In the case where the nitride semiconductor layer composing the n-side multi-film layer 6 is made of the first and second nitride semiconductor films, none of, both of, or either one of the first and second nitride semiconductor films may be doped with impurity.

In case where either one of the first and second nitride semiconductor films is doped with the n-type impurity, or where both of the first and second nitride semiconductor films are doped with the n-type impurity but the impurity concentrations of adjacent films are different, these cases are referred to as the n-side multi-film layer 6 is modulation-doped. Where the n-side multi-film layer 6 is modulation-doped, the output has a tendency to be improved.

Where the both of the first and second nitride semiconductor films are doped with the n-type impurity, the impurity concentrations of adjacent films may be same or different, but it is preferable they are different from each other.

In order to improve the crystallinity, most preferably both of the films are undoped, second most preferably either one of films is doped, or permissively both of films are doped with the impurity.

Where both of the first and second nitride semiconductor films are doped with the n-type impurity, either one of the impurity concentrations may be higher than that of the others.

Where the film is doped with the n-type impurity, although not specifically limited, the uppermost limit of the impurity concentration is adjusted to be $5\times10^{21}/cm^3$ or less, preferably $1\times10^{20}/cm^3$ or less, and the lowermost limit is set to be $5\times10^{16}/cm^3$ or more. If the impurity concentration is more than $5\times10^{21}/cm^3$, the crystallinity of the nitride semiconductor films is deteriorated, and the output decreases. This is adapted also for the case where the films are modulation doped.

According to the present invention, elements selected from the Group IV and VI such as Si, Ge, Sn, and S are selected for the n-type impurity, more preferably Si and Sn are used.

Now the p-side multi-film layer 8 will be described hereinafter.

According to the sixth embodiment, the p-side multi-film layer 8 comprises at least two kinds of nitride semiconductor films which have different composition from each other, the compositions may be preferably selected such as $Al_xGa_{1-x}N$ ($0 \leq x < 1$) for the third nitride semiconductor film, and $In_yGa_{1-y}N$ ($0 \leq y < 1$) for the fourth nitride semiconductor film.

The preferable composition of the third nitride semiconductor film is made of $Al_xGa_{1-x}N$, wherein the suffix x in such chemical formula representing the third nitride semiconductor film is smaller than 0.5. Where it is over 0.5, it tends to show that the crystallinity is deteriorated to cause cracks.

Also the preferable composition of the fourth nitride semiconductor film is made of GaN, wherein the suffix y in such chemical formula representing the fourth nitride semiconductor film is 0 (zero). Where the suffix y is zero, the multi-film layers can be grown with good crystallinity as a whole.

According to the sixth embodiment, the preferable combination of the third and fourth nitride semiconductor films are $Al_xGa_{1-x}N$, where the suffix x is 0.5 or less and GaN, respectively.

The p-side multi-film layer 8 made of the above-mentioned composition may be formed of at least one of the third and fourth nitride semiconductor films, i.e. more than two or three films in total, or preferably formed of at least two of the third and fourth nitride semiconductor films, i.e. more than four films in total.

Although not specifically defined thereto, the uppermost limit of the laminating number of the third and fourth nitride semiconductor films can be selected, for example, to be 100 or less, in consideration of the manufacturing process such as the laminating time duration and the device characteristics.

Although not specifically limited thereto, the total thickness of the p-side multi-film layer 8 falls within the range of 25 through 10000 angstroms, preferably 25 through 5000 angstroms, and more preferably 25 through 1000 angstroms. Where the thickness falls within the above-mentioned range, the crystallinity and the device output are improved.

According to the present invention, it is to be noted that as the p-side multi-film layer 8 is thinner, the Vf or the threshold current of the device tend to become lower.

Although the thickness of one of the nitride semiconductor films composing the p-side multi-film layer 8 is not specifically defined, at least one of two nitride semiconductor films has the thickness of 100 angstroms or less, preferably 70 angstroms or less, and more preferably 50 angstroms or less.

Like this, by thinning the thickness of each of films composing the p-side multi-film layer 8, the multi-film layer has a superlattice structure so that its crystallinity can be improved. Therefore such p-type layer doped with the p-type impurity having the high carrier concentration and the low resistivity is grown so that the Vf or the threshold current of the device can be reduced. In addition, the lower consumption energy and better light emitting output can be achieved.

Where the p-side multi-film layer 8 comprises the third and fourth nitride semiconductor films, the thickness of at least one of films is 100 angstroms or less, preferably 70 angstroms or less, and most preferably 50 angstroms or less.

At least one of the third and fourth nitride semiconductor films is a thin film of 100 angstroms or less, the or each of the nitride semiconductor films is thinner than the critical elastic thickness to improve the crystallinity. Where the other nitride semiconductor film is grown on this crystallinity improved nitride semiconductor film, a more improved crystallinity nitride semiconductor film can be obtained. Thus as the third and fourth nitride semiconductor films are deposited on and on, the p-side multi-film layer 8 can be formed with the improved crystallinity as a whole. Because of the improved crystallinity, the p-type layer doped with the p-type impurity having the high carrier concentration and the low resistivity can be grown so that the Vf or the threshold current can be reduced. Thus the low energy consumption and the intensified light emitting output can be obtained.

The desirable thickness of both of the third and fourth nitride semiconductor films composing the p-side multi-film layer 8 is 100 angstroms or less, preferably 70 angstroms or less, and most preferable 50 angstroms or less.

Where the thickness of both of the third and fourth nitride semiconductor films is 100 angstroms or less, since each nitride semiconductor film is thinner than the critical elastic thickness, the better crystalline nitride semiconductor can be grown than the thick layer.

Also where the thickness of both of the third and fourth nitride semiconductor films composing the p-side multi-film layer 8 is 70 angstroms or less, the multi-film layer can be formed of the superlattice structure with the good crystallinity so that preferably the Vf and or the threshold current can be reduced thereby intensifying the light emitting output.

Although the position of the p-side multi-film layer 8 to be formed is not specifically defined, it may be formed in contact with or spaced apart from the active layer 7. It is desirable to form the p-side multi-film layer 8 in contact with active layer 7. Where the p-side multi-film layer 8 is formed in contact with the active layer 7, it is preferable because the light emitting output tends to be intensified.

Where the p-side multi-film layer 8 is formed in contact with active layer 7, either one of the third and fourth nitride semiconductor films may be contacted with the first layer of the active layer 7, i.e. the well layer or the barrier layer. As such, the laminating sequence of the third and fourth nitride semiconductor films composing the p-side multi-film layer 8 is not specifically limited. Thus any laminating sequence may be adapted such as, laminating the third nitride semiconductor film at the bottom and the third nitride semiconductor film at the uppermost, laminating the third nitride semiconductor film at the bottom and the fourth nitride semiconductor film at the uppermost, laminating the fourth nitride semiconductor film at the bottom and the third nitride semiconductor film at the uppermost, and laminating the fourth nitride semiconductor film at the bottom and the fourth nitride semiconductor film at the uppermost.

Although the p-side multi-film layer 8 is formed in contact with the active layer 7 according to FIG. 1, as mentioned above, where it is spaced apart from the active layer 7, an another p-type nitride semiconductor layer may be formed between the p-side multi-film layer 8 and the active layer 7.

In the sixth embodiment, each of the nitride semiconductor films composing the p-side multi-film layer 8 such as the third and fourth nitride semiconductor films may be undoped or doped with the p-type impurity.

Where the both of the first and second nitride semiconductor films composing the p-type multi-film layer 8 are undoped, the thickness of the p-type multi-film layer 8 is set to be 0.1 μm or less, preferably 700 angstroms or less, more preferably 500 angstroms or less. In case where the p-type multi-film layer 8 is thinner than 0.1 μm, the electron holes is difficult to be injected into the active layer 7 so that the light emitting output tends to be reduced. Further in that case, the resistivity of the undoped layer tends to become higher.

Where either one of the third and fourth nitride semiconductor films is doped with the p-type impurity, that is, the p-type multi-film layer 8 is modulation-doped, the light emitting output tends to increase. And advantageously the modulation doped p-side layer can be easily grown with the high carrier concentration.]

Also where both of the third and fourth nitride semiconductor films are doped with the p-type impurity, such formed p-type multi-film layer 8 preferably has the higher carrier concentration thereby reducing the Vf in comparison with that of the p-type multi-film layer 8 in case where only one of the third and fourth nitride semiconductor films is doped. In case where both of the third and fourth nitride semiconductor films are doped with the p-type impurity, although the impurity concentration of the third nitride semiconductor film may be same as that of the fourth nitride semiconductor film, preferably they are different from each other, that means the modulation doping.

According to the sixth embodiment, where the p-type impurity is doped into the p-side multi-film layer 8, elements of Group II such as Mg, Zn, Cd, Be, and Ca can be selected as the p-type impurity, and preferably Mg and Be are used.

Where the p-type impurity is doped into the p-side multi-film layer 8, the impurity concentration is adjusted to be $1 \times 10^{22}/cm^3$ or less, preferably $5 \times 10^{20}/cm^3$ or less. Where the impurity concentration is greater than $1 \times 10^{22}/cm^3$, a poor crystalline nitride semiconductor film is grown so that the light emitting output is reduced. Although not specifically limited thereto, preferably the lowermost doping dose of the p-type impurity is $5 \times 10^{16}/cm^3$.

Structures of layers other than the n-side and p-side multi-film layers 6 and 8 which compose the device will be described hereinafter, however this invention is not specifically limited thereto.

The substrate 1 may be employed in the form of an insulative substrate such as a sapphire substrate having its principal surface represented by a C-, R- or or A-face or spinel ($MgAl_2O_4$), or a semiconductor substrate made of such as SiC (including 6H, 4H or 3C), Si, ZnO, GaAs, and GaN.

The buffer layer 2 may be made of the nitride semiconductor of $Ga_dAl_{1-d}N$ (where $0<d\leq1$), preferably the composition including less Al has the much improved crystallinity, more preferably the buffer layer 2 is made of the composition of GaN.

The thickness of the buffer layer 2 is adjusted within the range of 0.002 μm through 0.5 μm, preferably 0.005 μm through 0.2 μm, more preferably 0.01 μm through 0.02 μm. Where the thickness of the buffer layer 2 falls within the above-mentioned range, the crystal morphology is better so that the nitride semiconductor layer formed on the buffer layer 2 has the better crystallinity.

The temperature for growing the buffer layer 2 is adjusted to fall within 200 through 900° C., preferably 400 through 800° C. Where the growth temperature falls within the above range, the good crystalline poly-crystal can be obtained so that the nitride semiconductor layer formed on the buffer layer 2 with the poly-crystal as a seed crystal has the better crystallinity. And the buffer layer 2 grown at the low temperature may be omitted depending upon the substrate material and the growing method thereof.

The undoped GaN layer 3 is grown at a higher temperature than that of the previously grown buffer layer 2, for example, at the temperature of 900 through 1100° C., and may be made up of the composition in the formula of $In_1Al_gGa_{1-f-g}N$ ($0\leq f$, $0\leq g$, $f+g\leq1$). Although not specifically limited thereto, where the composition is made of GaN or $Al_gGa_{1-g}N$ wherein the suffix g is 0.2 or less, then the nitride semiconductor layer can be grown with less crystal defect. Also the thickness of the undoped GaN layer 3 is not specifically limited, as long as it is thicker than the buffer layer 2. Typically the undoped GaN layer 3 has thickness of 0.1 μm or more.

The GaN n-contact layer 4 doped with Si may be made up of $In_fAl_gGa_{1-f-g}N$ ($0\leq f$, $0\leq g$, $f+g\leq1$) as well as the undoped GaN layer 3. Although not specifically limited thereto, where the composition is made of GaN or $Al_gGa_{1-g}N$ wherein the suffix g is 0.2 or less, then the nitride semiconductor layer can be grown with less crystal defect. Also although not specifically limited thereto, since the n-contact layer 4 is a layer on which the n-electrode is grown, it preferably has the thickness of 1 μm or more. And the nitride semiconductor preferably has the concentration of the n-type impurity that is high to the extent that such high concentration does not cause the crystalline deterioration. It is preferable that the impurity is doped within the range of $1 \times 10^{18}/cm^3$ through $5 \times 10^{21}/cm^3$.

The undoped GaN layer 5 may be made up of $In_fAl_gGa_{1-f-g}N$ ($0\leq f$, $0\leq g$, $f+g\leq1$) as well as the aforementioned layers. Although not specifically limited thereto, where the composition is made of GaN, $Al_gGa_{1-g}N$ wherein the suffix g is 0.2 or less, or $In_fGa_{1-f}N$ wherein the suffix f is 0.1 or less, then the nitride semiconductor layer can be grown with less crystal, defect. The growth of the undoped GaN layer 5 brings, the good crystalline basis for easily growing the following layer, instead of the growth of the following layer directly formed on the n-contact layer, so that the following n-side multi-film layer 6 can be easily grown and advantageously, in turn, the active layer can be easily grown with the good crystallinity. As such, where the LED device has a structure comprising the undoped GaN layer 3 made of the undoped nitride semiconductor, the n-contact layer 4 made of the nitride semiconductor doped with the high concentrated n-type impurity, the undoped GaN layer 5 made of the undoped nitride semiconductor, and the above-mentioned n-side multi-film layer 6, that are subsequently grown thereon, the Vf of the LED device tends to decrease. It is to be noted that where the n-side multi-film layer 6 is undoped, the undoped GaN layer 5 can be omitted.

Further instead of the above-mentioned undoped GaN 5 according to the sixth embodiment, as described in the fifth embodiment, the undoped lower film 305a, the inter-film 305b doped with the n-type impurity, and the undoped upper film 305c composing the multi-film layer can be also used.

The multi-film layer are formed of three films comprising the undoped lower film 305a nearest from the substrate, the inter-film 305b doped with the n-type impurity, and the undoped upper film 305c. The multi-film layer may be formed in contact with the active layer, or may be spaced and include an another layer therebetween.

The composition composing the aforementioned lower film 305a through upper film 305c may be any composition expressed in the formula of $In_gAl_hGa_{1-g-h}N$ ($0\leq g<1$, $0\leq h<1$), and preferably it is made of the composition of GaN. Also the composition of each film of the n-side first multi-film layer 305 may be same or different.

Although not specifically limited thereto, the thickness of the multi-film layer is adjusted to fall within the range of 175 through 12000 angstroms, preferably 1000 through 10000 angstroms, and more preferably 2000 through 6000 angstroms. Where the thickness of the multi-film layer is within the above-mentioned range, advantageously the Vf can be optimized and the electrostatic withstand voltage can be enhanced.

The total thickness of the multi-film layer is adjusted within the above-mentioned range by appropriately selecting the thickness of the lower film 305a, inter-film 305b, and the upper film 305c. Although not specifically limited thereto, the thickness range of the lower film 305a, the inter-film 305b, and the upper film 305c can be defined by keeping any two of three film thickness and gradually changing the other film thickness while giving a special attention to the condition that provides the device characteristics with substantial influences depending upon the position of film in the multi-film layer.

Each film of the multi-film layer may affect nothing to the electrostatic withstand voltage, however the films are combined to form the multi-film layer so that the multi-film layer can be grown with the improved characteristics, as a whole, and especially with the intensified light emitting output and the improved electrostatic withstand voltage.

The thickness of the lower film 305a falls within the range of 100 through 10000 angstroms, preferably within the range of 500 through 8000 angstroms, and more preferably within the range of 1000 through 5000 angstroms. As the lower film 305a gradually becomes thicker, the electrostatic withstand voltage becomes higher, while the Vf increases rapidly around at 10000 angstroms. On the other hand, as the lower film 305a becomes thinner, the Vf decreases while the electrostatic withstand voltage decreases and the productivity tends to be reduced at the thickness less than 100 angstroms due to the lower electrostatic withstand voltage. Also since it is recognized that the lower film 305a reduces the adverse effect due to the poor crystallinity of the n-contact layer 4 containing the n-type impurity, it is preferable to grow the lower film 305a thick so as to improve its crystallinity.

The thickness of the inter-film 305b falls within the range of 50 through 1000 angstroms, preferably within the range of 150 through 500 angstroms, and more preferably in the range of 150 through 400 angstroms. Since the inter-film 305b doped with impurity, which has a sufficient carrier, concentration, gives relatively great influence over the light emitting output, it tends to decrease the light emitting output without forming this inter-film 305b. And where the inter-film 305b is thicker than 1000 angstroms, the light emitting output tends to decrease substantially to the extent that such device is not good as a product. Meanwhile, where the inter-film 305b is thick enough, the electrostatic withstand voltage is good, but where it is thinner than 50 angstroms, the electrostatic withstand voltage tends to decrease substantially.

The thickness of the undoped upper film 305c falls within the range of 25 through 1000 angstroms, preferably within the range of 25 through 500 angstroms, and more preferably within the range of 25 through 150 angstroms. This undoped upper film 305c is formed in contact with or most adjacent to the active layer among the first multi-film layer 305, hence, it affects a lot to the prevention of the leakage current. Where the upper film 305c is less than 25 angstroms, the leakage current tends to increase, and where it is more than 1000 angstroms, the Vf increases and the electrostatic withstand voltage decreases.

As described above, we noted the device characteristics that are easily affected by the varying thickness of each film, and determined the thickness for each layer within the above-mentioned range to optimize all device characteristics equally, especially the light emitting output and the electrostatic withstand voltage so that a comparatively high demanded standard are satisfied. Consequently we achieved products of which light emitting output as well as its reliability were preferably improved.

The combination of thickness for each film of the first multi-film layer 305 are adjusted appropriately in order to optimize the effect, based upon the condition, such as the various composition of the active layer defining the wavelength, and the shapes of the electrodes and the LED device. The combination of the varied thickness for each film within the above-described range, the device characteristics, especially the light emitting output and the electrostatic withstand voltage, can be enhanced over the conventional ones.

As long as the composition of each film 305a, 305b, and 305c composing the first multi-film layer 305 is expressed in the formula of $In_gAl_hGa_{1-g-h}N$ ($0 \leq g<1$, $0 \leq h<1$), the composition of each layer may be same or different, preferably the composition ratio of In and Al are small, more preferably they are made up of GaN.

Although the doping dose of the n-type impurity in the n-type impurity doped inter-film 305b of the first multi-film layer 305 is not specifically limited, the inter-film 305b contains the doping dose of $3\times10^{18}/cm^3$ or more, preferably $5\times10^{18}/cm^3$ or more. Although the upper limit of the doping dose of the n-type impurity is not specifically defined, it is preferable to set the doping dose of $5\times10^{21}/cm^3$ or less in order to deteriorate the crystallinity. It is preferable that the impurity concentration in the inter-film 305b of the first multi-film layer falls within the above-mentioned range, because the light emitting output is improved and the Vf is decreased.

An element from IVB or VIB Groups in the periodic table such as Si, Ge, Se, S, and O is selected as the n-type impurity, preferably Si, Ge, or S is used for the n-type impurity.

At the composition face of the first multi-film layer 305, each film acts as both films as long as it deteriorates the function of each film and the device.

Next, the active layer 7 can be made of the nitride semiconductor containing at least In, preferably has the well layer in the formula of $In_jGa_{1-j}N$ ($0 \leq j<1$) of the single quantum well structure or the multi quantum structure The sequence of the barrier and the well layers of the active layer 7 is not specifically limited, any laminating sequence of the layers may be adapted such as, depositing firstly the well layer and lastly the well layer, depositing firstly the well layer and lastly the barrier layer, depositing firstly the barrier layer and lastly the barrier layer, and depositing firstly the barrier layer and lastly the well layer. The thickness of the well layer is adjusted to be 100 angstroms or less, preferably 70 angstroms or less, and more preferably 50 angstroms or less. Where the thickness of the well layer is more than 100 angstroms, the output is difficult to be increased. On the other hand, the thickness of the barrier layer is adjusted to be 300 angstroms or less, preferably 250 angstroms or less, and more preferably 200 angstroms or less.

The GaN p-contact layer doped with Wig may be made up of the composition in the formula of $In_fAl_gGa_{1-f-g}N$ ($0 \leq f$, $0 \leq g$, $f+g \leq 1$). Although not specifically limited thereto, where the composition is made of GaN, then the nitride semiconductor layer can be grown with less crystal defect and the desirable ohmic contact with the p-electrode material can be achieved.

In this invention, the p-electrode and the n-electrode are not specifically limited, any conventionally known electrodes can be used, such as described in the embodiments.

The present invention will be described in the following examples, but is not limited to those examples.

EXAMPLE 1

Example 1 is related to the first embodiment according to the present invention as shown in FIG. 1.

In Example 1, a sapphire substrate (C-face) was set in the MOVPE reactor and the temperature of the substrate was increased to 1050° C. with hydrogen flown to clean the substrate. Instead of the C-face sapphire substrate, the substrate 1 may be employed in the form of a sapphire substrate having its principal surface represented by a R- or A-face, an insulative substrate of, for example, spinel ($MgAl_2O_4$) or a semiconductor substrate made of, for example, SiC (including 6H, 4H or 3C), Si, ZnO, GaAs, GaN.

(First Buffer Layer 2)

Subsequently, the temperature was decreased to 510° C. and a buffer layer 202 made of GaN which had a thickness of about 200 angstroms was grown on the substrate 1 using hydrogen as a carrier gas, and ammonia and TMG (trimethylgallium) as material gases. Such buffer layer 2 that is grown at a low temperature may be omitted, depending on the kind of the substrate, the growing method and the like.

(Second Buffer Layer 3)

After growing the buffer layer 2, only TMG was stopped and the temperature was increased to 1050° C. At 1050° C., in the same way using ammonia and TMG as material gases, the second buffer layer 3 made of undoped GaN which had a thickness of 1 μm was grown. The temperature of growth of the second buffer layer was higher than that of growth of the first buffer layer 2. The temperature may be, for example, between 900° C. and 1100° C. and the layer made of $In_XAl_YGa_{1-X-Y}N$ ($0 \leq X$, $0 \leq Y$, $X+Y \leq 1$) can be obtained. The composition is not specifically limited thereto, but preferably may be GaN and $Al_XGa_{1-X}N$ (X is not greater than 0.2). In such a case, the nitride semiconductor layer having a minimized crystal defect can easily be obtained. The thickness of the layer is not specifically limited thereto, but the thickness is larger than that of the buffer layer and is usually not smaller than 0.1 μm.

(N-Contact Layer 4)

Subsequently, at 1050° C., in the same way using ammonia and TWIG as material gases and the silane gas as an impurity gas, a n-contact layer made of GaN doped with Si of $3 \times 10^{19}/cm^3$ which had a thickness of 3 μm was grown. This n-contact layer 4 may be made of $In_XAl_YGaN$ ($0 \leq X$, $0 \leq Y$, $X+Y \leq 1$) like the second buffer layer 3 and the composition is not specifically limited thereto, but preferably may be GaN and $Al_XGa_{1-X}N$ (X is not greater than 0.2). In such a case, the nitride semiconductor layer having a minimized crystal defect can easily be obtained. The thickness is not specifically limited thereto, but the thickness may be not smaller than 1 μm because the n-electrode is formed thereon. Moreover, the n-type impurity may be desirably doped in the high concentration to the degree that the crystallinity of the nitride semiconductor is not deteriorated and preferably in the concentration between $1 \times 10^{16}/cm^3$ and $5 \times 10^{21}/cm^3$.

(Third Buffer Layer 5)

Next, only the silane gas was stopped and at 1050° C., in the same way, the third buffer layer 5 made of undoped GaN which had a thickness of 100 angstroms was grown. The third buffer layer 5 may be also made of $In_XAl_YGa_{1-X-Y}N$ ($0 \leq X$, $0 \leq Y$, $X+Y \leq 1$) and the composition is not specifically limited thereto, but may be preferably, GaN, $Al_XGa_{1-X}N$ (X is not greater than 0.2) or $In_YGa_{1-Y}N$ (Y is not greater than 0.1). In such a case, the nitride semiconductor layer having a minimized crystal defect can easily be obtained. In the case that the undoped GaN layer is grown, differently from the case that the active layer is grown directly on the n-contact layer 4 doped with an impurity of the high concentration, the crystallinity of the base layer is good and the nitride semiconductor to be grown next is likely to be grown. Thus, the three-layered structure comprising the second buffer layer 3 made of undoped nitride semiconductor, the n-contact layer 4 made of nitride semiconductor doped with a n-type impurity of the high concentration which is grown on the second buffer layer 3, and the third buffer layer 5 made of the undoped nitride semiconductor (including the n-side multi-film layer) on the n-contact layer 4 may be likely to give a lower Vf when applied, to LED device. When the n-side multi-film layer 6 is undoped, the third buffer layer 5 may be eliminated.

(N-Side Multi-Film Layer 6)

Next, the temperature was decreased to 800° C. and a first nitride semiconductor film made of undoped $In_{0.03}Ga_{0.97}N$ which had a thickness of 25 angstroms was grown using TMG, TMI and ammonia. Subsequently, the temperature was increased and on the first film, a second nitride semiconductor film made of GaN that had a thickness of 25 angstroms was grown. Then, these operations were repeated and n-side multi-film layer in the form of a superlattice structure which had a thickness of 500 angstroms was formed by alternately laminating the first film and the second film by ten times each in the order of the first and second films.

(Active Layer 7)

Next, a barrier layer made of undoped. GaN having a thickness of 200 angstroms was grown and at 800° C., and an well layer made of undoped $In_{0.4}Ga_{0.6}N$ which had a thickness of 30 angstroms was grown using TMG, TMI and ammonia. An active layer 7 of the multiple quantum well structure having a total thickness of 1120 angstroms was grown by laminating alternately five barrier layers and four well layers in the order of barrier layer, well layer, barrier layer and barrier layer. The active layer 7 was grown by laminating the barrier layer firstly, but may be grown by laminating in the order of the well layer firstly and the well layer also lastly. In the case that the active layer is grown by laminating in the order of the well layer firstly and the barrier layer lastly, or the order may be beginning the barrier layer and ending the well layer. Thus the order is not specifically limited thereto. The well layer was set to have a thickness of not greater than 100 angstroms, preferably not greater than 70 angstroms, and more preferably not greater than 50 angstrom. The thickness of greater than 100 angstroms may cause the output to be difficult to increase. On the other hand, the barrier layer was set to have a thickness of not greater than 300 angstroms, preferably not greater than 250 angstroms, and most preferably not greater than 200 angstroms.

(P-Side Multi-Film Layer 8)

Next, using TMG, TMA, ammonia and Cp2Mg (cyclopentadienyl magnesium), a third nitride semiconductor film made of p-type $Al_{0.05}Ga_{0.95}N$ doped with Mg of $5 \times 10^{19}/cm^3$ which had a thickness of 25 angstroms was grown. Subsequently, Cp2Mg and TMA were stopped and a fourth nitride semiconductor film made of undoped GaN that had a thickness of 25 angstroms was grown. Thus, these growing steps were repeated and the p-side multi-film layer 8 of a superlattice structure which had a thickness of 200 angstroms was grown by laminating alternately the third and fourth films by four time each in the order of the third and fourth films.

(P-Contact Layer 9)

Subsequently, at 1050° C., using TMG, ammonia and Cp2Mg, a p-contact layer 208 made of p-type GaN doped with Mg of $1 \times 10^{20}/cm^3$ which had a thickness of 700 angstrom was grown. The p-contact layer 208 also may be made of $In_XAl_YGa_{1-X-Y}N$ ($0 \leq X$, $0 \leq Y$, $X+Y \leq 1$) and the composition is not specifically limited thereto, but preferably may be GaN. In such a case, a nitride semiconductor layer having a minimized crystal defect can be obtained and an excellent ohmic contact thereof with the p-electrode material can be achieved.

After the completion of the reaction, the temperature was decreased to the room temperature and further, the wafer was annealed in the nitrogen atmosphere at 700° C. in the reactor, so as to make the p-type layers less resistive.

After annealing, the wafer was removed out of the reactor. A mask of a desired shape was formed on the top surface of the p-contact layer and the etching was conducted from the p-contact layer side with a RIE (reactive ion etching) apparatus to expose the surface of the h-contact layer, as shown in FIG. 1.

After the etching, a transparent p-electrode 10 containing Ni and Au, which had a thickness of 200 angstroms, was formed on the approximately entire surface of the top p-contact layer. On the p-electrode 10, a p-pad electrode 11 made of Au for bonding which had a thickness of 0.5 μm was formed.

On the other hand, an n-electrode containing W and Al was formed on the n-contact layer 4 which had been exposed by etching, so as to complete a LED device.

The resulting LED device emitted pure green light of 520 nm at 20 mA of forward voltage and the Vf was only 3.2V. The Vf was almost 0.8 V lower than that of the conventional LED device of the multiple quantum well structure. And the power was two times or more as high as that of the conventional LED device. Therefore, the LED had the almost same properties at 10mA as those of the conventional LED.

In this example, the second nitride semiconductor film which constituted the n-side multi-film layer was made of GaN, but the film may be made of other $In_xAl_yGa_{1-X-Y}N$ ($0 \leq X$, $0 \leq Y$, $X+Y \leq 1$), preferably InGaN in which the composition of In is smaller than that in the first nitride semiconductor. And the fourth nitride semiconductor which constituted the p-side multi-film layer was made of GaN, but the film may be made of other $In_xAl_yGa_{1-X-Y}N$ ($0 \leq X$, $0 \leq Y$, $X+Y \leq 1$), preferably AlGaN in which the composition of Al is smaller than that in the third nitride semiconductor.

In the conventional LED device, on the first buffer layer made of GaN, the second buffer layer made of undoped GaN, the n-contact layer made of GaN doped with Si, the active layer of the same multiple quantum well structure as that of Example 1, single-layered Mg-doped $Al_{0.1}Ga_{0.9}$ layer and the p-contact layer made of GaN doped with Mg are laminated successively.

EXAMPLE 2

Example 2 relates to the LED device as shown in FIG. 2. The LED device was fabricated in the same way as in Example 1, except that the third buffer layer 5 was not grown, the p-side multi-film layer 8 was not in the form of a superlattice structure, and the p-cladding layer 108 made of p-type $Al_{0.1}Ga_{0.9}N$ doped with Mg to $5 \times 10^{19}/cm^3$ which had a thickness of 200 angstroms was grown. The Vf was 3.3 V at 20 mA that is extremely good. The power was 1.8 times higher than that the conventional LED.

EXAMPLE 3

In the LED device of Example 1, where the n-side multi-film layer 6 was grown, Si is doped only into the second nitride semiconductor film made of GaN to $1 \times 10^{18}/cm^3$. And the p-side multi-film layer was not in the form of a superlattice structure and the p-cladding layer 108 made of p-type $Al_{0.1}Ga_{0.9}N$ doped with Mg to $5 \times 10^{19}/cm^3$ which had a thickness of 200 angstroms was grown. The resulting LED device had similar properties to those of Example 2.

EXAMPLE 4

The LED device was fabricated in the same way as in Example 1, except that where the n-side multi-film layer 6 was grown, the first nitride semiconductor film was made of $In_{0.03}Ga_{0.97}$ doped with St to $1 \times 10^{18}/cm^3$ and the second nitride semiconductor film was made of GaN doped with Si to $5 \times 10^{18}/cm^3$, the p-side multi-film layer was not in the form of a superlattice structure and the p-cladding layer 108 was made of p-type $Al_{0.1}Ga_{0.9}N$ doped with Mg to $5 \times 10^{19}/cm^3$. The resulting LED device had excellent properties in that the Vf was 3.4 V at 20mA and the power was 1.5 times higher than that of the conventional LED device.

EXAMPLE 5

The LED device was fabricated in the same way as in Example 1, except that where the p-side multi-film layer 8 was grown, the third buffer layer 5 was not grown and the fourth nitride semiconductor film was made of p-type GaN doped with Mg to $1 \times 10^{19}/cm^3$. The resulting LED device had similar properties to those of Example 1.

EXAMPLE 6

The LED device was fabricated in the same way as in Example 1, except that the third buffer layer 5 was not grown and the p-side multi-film layer 8 which had a total thickness of 100 angstroms was grown by laminating alternately two films of the third nitride semiconductor film made of undoped $Al_{0.08}Ga_{0.95}N$ which had a thickness of 25 angstroms and two films of the fourth nitride semiconductor film made of undoped GaN which had a thickness of 25 angstroms. The resulting LED device had similar properties to those of Example 4.

EXAMPLE 7

In Example 1, where the n-side multi-film layer 6 was grown, the first nitride semiconductor film made of undoped $In_{0.03}Ga_{0.97}N$ which had a thickness of 50 angstroms was grown and subsequently, the second nitride semiconductor film made of undoped GaN which had a thickness of 25 angstroms was grown. Subsequently, the next first nitride semiconductor film made of undoped $In_{0.3}Ga_{0.97}N$ that had a thickness of 45 angstroms was grown and subsequently, again an undoped GaN layer which had a thickness of 25 angstroms was grown. Next, an undoped $In_{0.03}Ga_{0.97}N$ layer that had a thickness of 40 angstroms was grown. Thus, the first nitride semiconductor films were subsequently formed having a thickness thinner by 5 angstrom than that of the proximate one until having a thickness of 5 angstroms. Thus, the n-side multi-film layer in the form of a superlattice, which had a total thickness of 525 angstroms, was grown by laminating alternately ten layers of each of the first and second nitride semiconductor films.

On the other hand, similarly in Example 1, where the p-side multi-film layer 8 was grown, the third nitride semiconductor-film made of p-type $Al_{0.05}Ga_{0.95}N$ doped with Mg to $5 \times 10^{19}/cm^3$ which had a thickness of 40 angstroms was grown and subsequently, the fourth nitride semiconductor film made of undoped GaN which had a thickness of 25 angstroms was grown. Subsequently, the next third nitride semiconductor film made of p-type $Al_{0.05}Ga_{0.9}N$ layer doped with Mg to the same concentration which had a thickness of 35 angstroms was grown and subsequently, an undoped GaN layer which had a thickness of 25 angstroms was grown. Thus, the third nitride semiconductor films were subsequently formed having a thickness thinner by 5 angstrom than that of the proximate one until having a thickness of 20 angstroms. Thus, the p-side multi-film layer in the form of a superlattice, which had a total thickness of 275 angstroms, was grown by laminating alternately the third layer and the fourth layer, in 5 layers each.

The LED device of the same structure as those in Example 1 other than above-mentioned had almost the same properties as those in Example 1. In this example, the thickness of the first nitride semiconductor films constituting the n-side multi-film layer 6 was varied, but the variation of the thickness of the second nitride semiconductor films gives the same effects. The thickness of the third nitride semiconductor films constituting the p-side multi-film layer 8 was varied, but the variation of the thickness of the fourth nitride semiconductor films gives the same effects.

EXAMPLE 8

In Example 1, where the n-side multi-film layer 6, the first nitride semiconductor film made of undoped $In_{0.03}Ga_{0.97}N$ which had a thickness of 25 angstroms was grown and next, the second nitride semiconductor film made of undoped GaN which had a thickness of 25 angstroms was grown. Subsequently, the next first nitride semiconductor film of InGaN which had a little larger mole ratio of In and a thickness of 25 angstroms was grown and next, an undoped GaN layer which had a thickness of 25 angstroms was grown. Thus, the amount of In contained in the first nitride semiconductor film was increased little by little. Finally, the n-side multi-film layer which had a total thickness of 500 angstroms was grown by laminating the first layer and the second layer alternately in 10 layers each in such a manner that the final first layer was made of $In_{0.3}Ga_{0.7}N$.

On the other hand, similarly in Example 1, where the p-side multi-film layer 8, the third nitride semiconductor film made of p-type $Al_{0.05}Ga_{0.95}N$ doped with Mg to $5 \times 10^{19}/cm^3$ which had a thickness of 25 angstroms was grown and next, the fourth nitride semiconductor film made of undoped GaN which had a thickness of 25 angstroms was grown. Subsequently, the next third nitride semiconductor film of p-type AlGaN doped with Mg to the same concentration which had a little larger mole ratio of Al and a thickness of 25 angstroms was grown and next, again the undoped GaN layer which had a thickness of 25 angstroms was grown. Thus, the amount of Al contained in the third nitride semiconductor films was increased little by little. Finally, the p-side multi-film layer which had a total thickness of 200 angstroms was grown by laminating 4 layers of each of the third layer and the fourth layer alternately in such a manner that the final third layer was made of $In_{0.2}Ga_{0.8}N$.

The present LED device, where the other structure was the same as those in Example 1, had almost the same properties as those in Example 1. In this example, the ratio of the Group III element contained only in the first nitride semiconductor films composing the n-side multi-film layer 6 was varied, but the second nitride semiconductor film may be made of nitride semiconductor of ternary or quaternary composition crystals and the ratio of the Group III element may be varied, to obtain the similar effects. The ratio of the Group III element contained only in the third nitride semiconductor films composing the p-side multi-film layer 8 was varied, but the fourth nitride semiconductor film may be made of nitride semiconductor of ternary or quaternary composition crystals and the ratio of the Group III element may be varied, to obtain the similar effects.

EXAMPLE 9

The LED device was fabricated in the same way as in Example 7, except that the p-side multi-film layer 8 was not a multi-film layer and the p-cladding layer 108 made of p-type $Al_{0.1}Ga_{0.9}N$ doped with Mg to $5 \times 10^{19}/cm^3$ which had a thickness of 200 angstroms was grown. The present LED device had almost similar properties to those of Example 2.

EXAMPLE 10

The LED device was fabricated in the same way as in Example 8, except that the p-side multi-film layer 8 was not a multi-film layer and the p-cladding layer 108 made of p-type $Al_{0.1}Ga_{0.9}N$ doped with Mg to $5 \times 10^{19}/cm^3$ which had a thickness of 200 angstroms was grown. The present LED device had almost similar properties to those of Example 2.

EXAMPLE 11

In Example 8, the composition ration of In in the first nitride semiconductor composing the n-side multi-film layer was reversed to that in case of Example 8, and the composition of Al in the third nitride semiconductor composing the p-side multi-film layer was reversed as well. That is, the concentration of In in the first nitride semiconductor films was decreased as the distance thereof to the active layer decreased and the concentration of Al in the third nitride semiconductor films was decreased as the distance thereof was increased to the active layer increased. The other structures were the same as those in Example 8. The resulting LED device had almost similar properties to those in Example 8.

EXAMPLE 12

The LED device was fabricated in the same way as in Example 1, except that, where the n-side multi-film layer 6 was grown, a first nitride semiconductor film made of undoped $In_{0.2}Ga_{0.8}N$ which had a thickness of 25 angstroms was grown and next, a second nitride semiconductor film made of undoped $In_{0.05}Ga_{0.95}N$ which had a thickness of 25 angstroms was grown. The resulting LED device had almost similar properties to those in Example 1.

EXAMPLE 13

The LED device was fabricated in the same way as in Example 1, except that, where the p-side multi-film layer 8 was grown, a first nitride semiconductor film made of $Al_{0.05}Ga_{0.95}N$ doped with Mg which had a thickness of 25 angstroms was grown and next, a second nitride semiconductor film made of undoped $In_{0.1}Ga_{0.9}N$ which had a thickness of 25 angstroms was grown. The resulting LED device had almost similar properties to those in Example 1.

EXAMPLE 14

The LED device was fabricated in the same way as in Example 1, except that, where the n-side multi-film layer 6 was grown, a first nitride semiconductor film made of undoped $In_{0.03}Ga_{0.97}N$ which had a thickness of 200 angstroms was grown and next, a second nitride semiconductor film made of undoped GaN which had a thickness of 25 angstroms was grown, that is, except that the first nitride semiconductor film had a thickness, of 200 angstroms. The resulting LED device had almost similar properties to those in Example 1.

EXAMPLE 15

The LED device was fabricated in the same way as in Example 1, except that, where the p-side multi-film layer 8 was grown, a first nitride semiconductor film made of $Al_{0.05}Ga_{0.95}N$ doped with Mg which had a thickness of 200 angstroms was grown. The resulting LED device had almost the same properties as those in Example 1.

EXAMPLE 16

Figure 3:
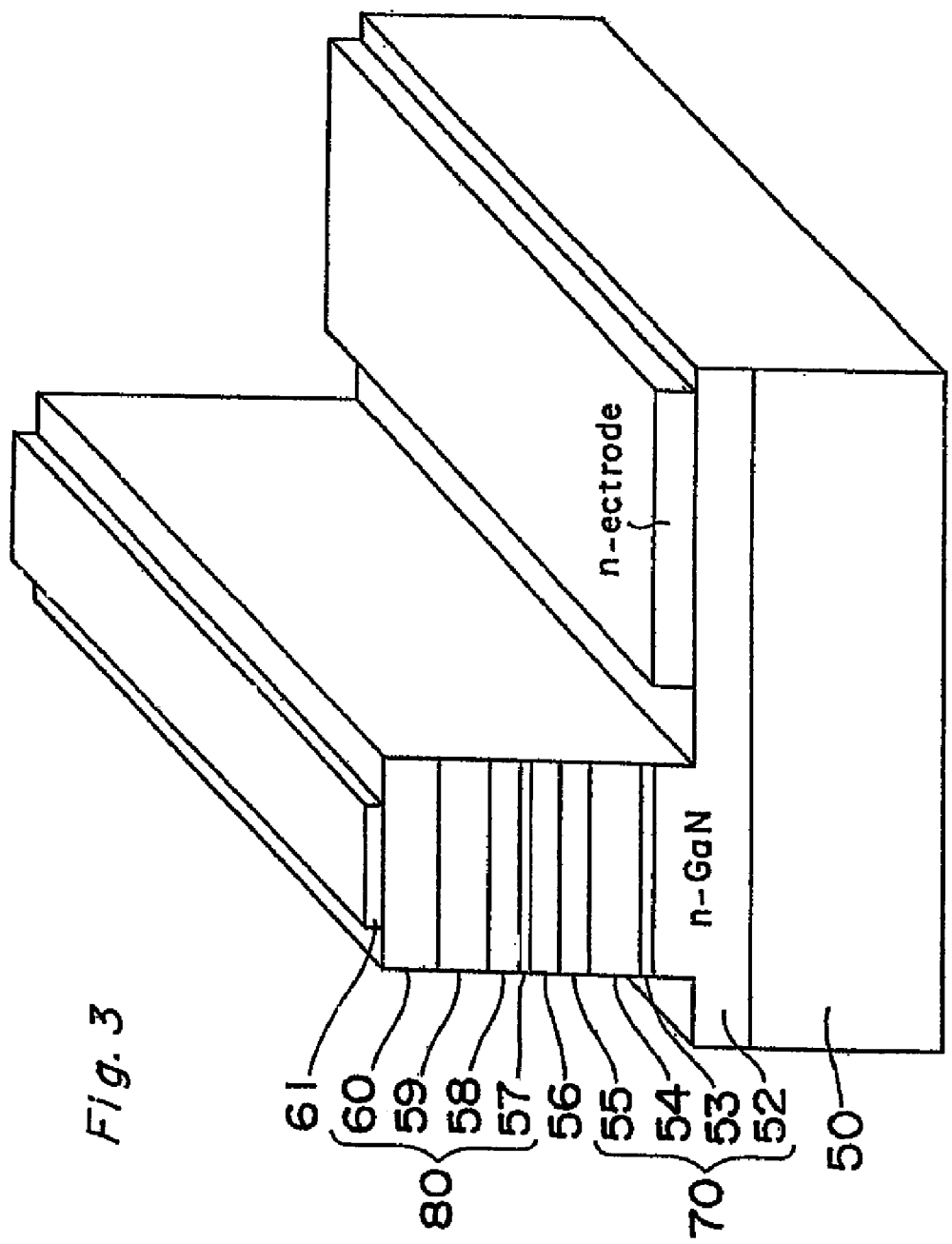
FIG. 3 is a perspective view showing the structure of a nitride semiconductor device (LD device) according to Example 16 of the present invention.

The nitride semiconductor device according to Example 16 of the present invention is a laser diode which has an active layer 56 sandwiched between the p-side region 80 and the n-side region 70, as shown in FIG. 3.

The laser diode according to Example 16 was fabricated on the GaN substrate 50 having a thickness of 80 μm by growing the following, 1) an n-type GaN layer 52 made of doped with Si which had a thickness of 3 μm, 2) an $In_{0.1}Ga_{0.3}N$ layer 53 having a thickness of 0.1 μm, 3) an n-cladding layer 54 in the form of a superlattice structure made of $I_xGa_{1-x}N$/n-type GaN, 4) an n-type GaN beam guide layer 55 doped with Si which had a thickness of 0.1 μm, 5) an active layer 56 of a multiple quantum well structure made of $In_{0.4}Ga_{0.6}N/In_{0.02}Ga_{0.98}N$, 6) an $Al_{0.2}Ga_{0.8}N$ 57 layer doped with Mg having a thickness of 200 angstroms, 7) a p-type GaN beam guide layer 58 doped with Mg which had a thickness of 0.1 μm, 8) a p-cladding layer 59 of a superlattice structure made of $Al_yGa_{1-y}N$/p-type GaN, and 9) a p-type GaN contact layer 60 doped with Mg which had a thickness of 0.05 μm.

The n-cladding layer 54 was formed by laminating alternately 240 layers of each of a Si-doped GaN film having a thickness of 25 angstroms and an undoped $In_xGa_{1-x}N$ film having a thickness of 25 angstroms, and showed a n-type conductivity as a whole. Suffix x was varied successively between 0.01 and 0.3, thereby to vary the composition of the n-cladding layer, so that the concentration of In in the undoped $In_xGa_{1-x}N$ films composing the n-cladding layer 54 was increased with decrease of the distance thereof to the active layer.

The active layer 56 was formed by alternately laminating four layers of each of a Sloped $In_{0.15}Ga_{0.85}N$ well layer having a thickness of 20 angstroms and a Si-doped $In_{0.02}Ga_{0.95}N$ barrier layer having a thickness of 50 angstroms.

Further, the p-cladding layer 59 was formed by alternately laminating 120 layers of each of a Mg-doped GaN film having a thickness of 25 angstroms and an undoped $Al_yGa_{1-y}N$ having a thickness of 25 angstroms, and showed a p-type conductivity as a whole. Suffix y was varied successively between 0.01 and 0.2, thereby to vary the composition of the p-cladding layer 59, so that the concentration of Al in the undoped $Al_yGa_{1-y}N$ films composing the p-cladding layer 59 was decreased with decrease of the distance thereof to the active layer.

In Example 16, after the above-mentioned layers of (1) to (9) were formed, the etching was conducted to obtain a ridge geometry having a width of 3 μm and a length of 450 μm. A p-electrode 61 made of Ni/Au was formed on the p-contact layer 60 and an n-electrode made of Ti/Al was formed on the n-type GaN layer on one side of the ridge.

In the laser diode according to Example 16, the both facets of the ridge was formed with $TiO_2/SiO_2$, so as to obtain the 50% reflection coefficient of each facet.

Where the semiconductor laser diode fabricated in this way was used, the continuous emission having a small threshold current was observed at room temperature.

As such, where the multi-film layer (the layer of a superlattice structure) may be formed even apart from the active layer, a good result can be obtained, as described in Example 16.

EXAMPLE 17

Example 17 relates to the second embodiment as shown in FIG. 4.

In Example 17, a sapphire substrate (C-face) was set in the MOVPE reactor and the temperature of the substrate was increased to 1050° C. with hydrogen flown to clean the substrate.

(Buffer Layer 102)

Subsequently, the temperature was decreased to 510° C. and a buffer layer 102 made of GaN which had a thickness of about 150 angstroms was grown on the substrate 1 using hydrogen as a carrier gas and ammonia and TMG (trimethylgallium) as material gases.

(Undoped GaN Layer 103).

After growing the buffer layer 102, only TMG was stopped and the temperature was increased to 1050° C. At 1050° C., in the same way using ammonia and TMG as material gases, an undoped GaN layer 103 having a thickness of 1.5 μm was grown.

(N-Contact Layer 4)

Subsequently, at 1050° C., in the same way using ammonia and TMG as material gases and the silane gas as an impurity gas, a n-contact layer 4 made of GaN doped with Si to $4.5 \times 10^{18}/cm^3$ which had a thickness of 2.25 μm was grown.

(N-Side First Multi-Film Layer 105)

Next, only the silane gas was stopped and at 1050° C., an undoped GaN layer having a thickness of 75 angstroms was grown using TMG and ammonia gas. Subsequently, the silane gas was added and a GaN layer doped with Si to $4.5 \times 10^{18}/cm^3$ which had a thickness of 25 angstroms was grown. Thus, a pair comprising A layer which was an undoped GaN layer having a thickness of 75 angstroms and B layer which was a GaN layer doped with Si to $4.5 \times 10^{18}/cm^3$ having a thickness of 25 angstroms were grown. An n-side first multi-film layer 105 in the form of a superlattice structure that had a total thickness of 2500 angstroms was grown by laminating 25 pairs.

(N-Side Second Multi-Film Layer 106)

Next, at the similar temperature, a second nitride semiconductor film 106 made of undoped GaN which had a thickness of 40 angstroms was grown. Then, the temperature was decreased to 800° C. and using TMG, TMI, and ammonia, a first nitride semiconductor 106a made of undoped $In_{0.13}Ga_{0.87}N$ which had a thickness of 20 angstroms was grown. Then these operation were repeated and an n-side second multi-film layer in the form of a superlattice structure which had a total thickness of 640 angstroms was formed toy alternately laminating 10 layers of each of these films in the order of the second film, the first film . . . , and finally by again laminating the second nitride semiconductor film 106b made of GaN.

(Active Layer 7)

Next, a barrier layer made of undoped GaN having a thickness of 200 angstroms was grown and at 800° C., an well layer made of undoped $In_{0.4}Ga_{0.6}N$ which had a thickness of 30 angstroms was grown using TMG, TMI and ammonia. An active layer 7 of a multiple quantum well structure which had a total thickness of 1120 angstroms was grown by alternately laminating a barrier layer and an well, layer, in the order of barrier+well+barrier . . . +barrier layer, in five layers and in four layers, respectively.

(P-Side Multi-Film Cladding Layer 108)

Next, at 1050° C., using TMG TMA, ammonia and Cp2Mg (cyclopentadienyl magnesium), a third nitride semiconductor film 108a made of p-type $Al_{0.2}Ga_{0.5}N$ doped with Mg to $1 \times 10^{20}/cm^3$ which had a thickness of 40 angstroms was grown. Subsequently, the temperature was decreased to 800° C. and a fourth nitride semiconductor film 108b made of $In_{0.03}Ga_{0.97}N$ doped with Mg to $1\times10^{20}/cm^3$ which, had a thickness of 25 angstroms was grown using TMG, TMI, ammonia and Cp2Mg. Thus, these operations were repeated and the p-side multi-film cladding layer 108 in the form of a superlattice structure which had a total thickness of 365 angstroms was grown by laminating alternately a third layer and a fourth layer in the order of 3rd+4th . . . , in five layers each and finally by laminating a third nitride semiconductor film 108a.

(GaN P-Contact Layer 9)

Subsequently, at 1050° C., using TMG, ammonia and Cp2Mg, a p-contact layer 9 made of p-type GaN doped with Mg to $1\times10^{20}/cm^3$ which had a thickness of 700 angstroms was grown.

After the completion of the reaction, the temperature was decreased to the room temperature and further, the wafer was annealed in the nitrogen atmosphere at 700° C. in the reactor, so as to make the p-type layer less resistive.

After annealing, the wafer was removed out of the reactor. A mask of a desired shape was formed on the top surface of the p-contact layer 9 and the etching was conducted from p-contact layer side with a RIE (reactive ion etching) apparatus to expose the surface of the n-contact layer, as shown in FIG. 4.

After the etching, a transparent p-electrode 11 containing Ni and Au, which had a thickness of 200 angstroms, was formed on the approximate entire surface of the top p-contact layer. On the p-electrode 11, a p-pad electrode 11 made of Au for bonding which had a thickness of 0.5 μm was formed. On the other hand, an n-electrode 12 containing W and Al was formed on the surface of the n-contact layer 4 that had been exposed by etching, so as to obtain an LED device.

The LED device emitted pure green light of 520 nm at 20 mA of forward current and the Vf was 3.5 V. The Vf was almost 1.0 V lower than that of the conventional LED device having a multiple quantum well structure. And the power was two times or more as high as that of the conventional LED. Therefore, the LED had the almost same properties at 10mA as those of the conventional LED.

The conventional LED device comprises a first buffer layer made of GaN on which the second buffer layer made of undoped GaN, the n-contact layer made of GaN doped with Si, the active layer of the same multiple quantum well structure as that of Example 12, single-layered Mg-doped $Al_{0.1}Ga_{0.9}N$ layer and the p-contact layer made of GaN doped with Mg are laminated successively.

EXAMPLE 18

The LED device was fabricated in the same way as in Example 17, except that the active layer 7 was grown as follows.
(Active Layer 7)

A barrier layer made of undoped GaN having a thickness of 250 angstroms was grown and at 800° C., an well layer made of undoped $In_{0.3}Ga_{0.7}N$ which had a thickness of 30 angstroms was grown using TMG, TMI and ammonia. An active layer 7 of a multiple quantum well structure which had a total thickness of 1930 angstroms was grown by laminating alternately a barrier layer and an well layer in the order of barrier+well+barrier . . . +barrier layer, in seven layers and in six layers, respectively.

The resulting LED device emitted pure blue light of 470 nm at 20mA of forward current. The excellent results similar to those in Example 17 were obtained.

EXAMPLE 19

The LED device was fabricated in the same way as in Example 17, except that the active layer 7 was grown as follows.
(Active Layer 7)

Next, a barrier layer made of undoped GaN having a thickness of 250 angstroms was grown and at 800° C., an well layer made of undoped $In_{0.3}Ga_{0.7}N$ which had a thickness of 30 angstroms was grown using TMG, TMI and ammonia. An active layer 7 of multiple quantum well structure which had a total thickness of 1650 angstroms was grown by alternately laminating a barrier layer and an well layer in the order of barrier+well+barrier . . . +barrier layer, in six layers and in five layers, respectively.

The resulting LED device emitted pure blue light of 470 nm at 20mA of forward current. The excellent results similar to those in Example 17 were obtained.

EXAMPLE 20

The LED device was fabricated in the same way as in Example 17, except that the active layer 7 was grown as follows.
(Active Layer 7)

A barrier layer made of undoped GaN having a thickness of 250 angstroms was grown and at 800° C., an well layer made of undoped $In_{0.35}Ga_{0.66}N$ which had a thickness of 30 angstroms was grown using TMG, TMI and ammonia. Ah active layer 7 of multiple quantum well structure which had a total thickness of 1930 angstroms was grown by alternately laminating a barrier layer and an well layer in the order of barrier+well+barrier . . . +barrier layer, in seven layers and in six layers, respectively.

The resulting LED device emitted blue-green light of 500 nm at 20mA of forward current, the excellent results similar to those in Example 17 were obtained.

EXAMPLE 21

The LED device was fabricated in the same way as in Example 17, except that the active layer 7 was grown as follows.
(Active Layer 7)

Next, a barrier layer made of undoped GaN having a thickness of 250 angstroms was grown and at 800° C., an well layer made of undoped $In_{0.35}Ga_{0.65}N$ which had a thickness of 30 angstroms was grown using TMG, TMI and ammonia. An active layer 7 of multiple quantum well structure which had a total thickness of 1090 angstroms was grown by laminating alternately a barrier layer and an well layer in the order of barrier+well+barrier . . . +barrier layer, in four layers and in three layers, respectively.

The resulting LED device emitted blue-green light of 500 nm at 20mA of forward current. The excellent results similar to those in Example 17 were obtained.

EXAMPLE 22

The LED device was fabricated in the same way as in Example 17, except that the n-side second multi-film layer 6 was not grown.

The resulting LED device had a little lower device properties and emitting power than those in Example 17, but had an excellent emitting power as compared with the conventional LED device.

EXAMPLE 23

The LED device was fabricated in the same way as in Example 17, except that the p-side multi-film cladding layer 8 was formed as follows.
(P-Side Single-Layered Cladding Layer 18)
At 1050° C., a p-side single-layered cladding layer made of p-type $Al_{0.16}Ga_{0.84}N$ doped Mg to $1\times10^{20}/cm^3$ which had a thickness of 300 angstroms was grown using TMG, TMA, ammonia and Cp2Mg (cyclopentadienylmagnesium).

The resulting LED device comprised a cladding layer in the form of a single film, instead of a superlattice structure. The performance of the resulting LED device was a little lower than that in Example 1. However, the combination thereof with the other layer structures gave good results almost similar to those in Example 1. The single-film layer is preferable because the manufacturing procedures can be simplified, as compared with the multi-film layer.

EXAMPLE 24

The LED device was fabricated in the same way as in Example 17, except that the n-side multi-film layer 105 was formed as follows.
(N-Side First Multi-Film Layer 105)
An undoped GaN film (A film) having a thickness of 100 angstroms was grown and an $Al_{0.1}Ga_{0.9}N$ film (B film) doped, with Si to $1\times10^{18}/cm^3$ which had a thickness of 25 angstroms was grown. The n-side first multi-film layer 105 having a thickness of 2500 angstroms was grown by laminating the 20 pair of the A film and the B film.

The resulting LED device had almost similar properties to those in Example 17 and the excellent results were obtained.

EXAMPLE 25

The LED device was fabricated in the same way as in Example 17, except that the n-contact layer 4 was formed as follows.
(N-Contact Layer 4)
At 1050° C., an n-contact layer 4 made of GaN doped with Si to $4.5\times10^{15}/cm^3$ which had a thickness of 6 μm was grown using TMG, ammonia gas as material gases and the silane gas as an impurity gas.

The resulting LED device had almost similar properties to those in Example and the excellent results were obtained.

EXAMPLE 26

Example 26 is related to the third embodiment according to the present invention as shown in FIG. 5.

In Example 26, a sapphire substrate (which was cut in such a way that the facet was C-face) was set in the reactor and the atmosphere inside the reactor was fully replaced with hydrogen. Then the temperature of the substrate was increased to 1050° C. with hydrogen flown to clean the substrate. Instead of the C-face sapphire substrate, the substrate 1 may be employed in the form of a sapphire substrate having its principal surface represented by a R- or A-face, an insulating substrate of, for example, spinel ($MgAl_2O_4$) or a semiconductor substrate made of, for example, SiC (including 6H, 4H or 3C), Si, ZnO, GaAs, GaN.

(Buffer Layer 202)
Subsequently, the temperature was decreased to 510° C. and a buffer layer 202 made of GaN which had a thickness of about 200 angstroms was grown on the substrate 1 using hydrogen as a carrier gas and ammonia and TMG (trimethylgallium) as material gases.
(First N-Side Nitride Semiconductor Layer 203)
After growing the buffer layer 202, only TMG was stopped and the temperature was increased to 1050° C. At 1050, in the same way using ammonia and TMG as material gases, the first n-side nitride semiconductor layer 203 made of undoped GaN which had a thickness of 5 μm was grown. The first n-side nitride semiconductor layer was preferably grown at a higher temperature than the buffer layer, for example, at a temperature between 900° C. and 1100° C. The first n-side nitride semiconductor layer may be made of $In_xAl_yGa_{1-x-y}N$ ($0 \leq x$, $0 \leq y$, $x+y \leq 1$), instead of GaN, but the first n-side nitride semiconductor layer may be preferably made of GaN and $Al_xGa_{1-x}N$ (X is not greater than 0.2) and a nitride semiconductor layer having a minimized crystal defect may be obtained. The thickness thereof may be preferably larger than that of the buffer layer and is usually not smaller than 0.1 μm. This layer is usually an undoped layer and the layer has properties close to those of an intrinsic semiconductor and a resistibility of larger than 0.2Ω·cm. The first n-side nitride semiconductor layer may be doped with n-type impurities such as Si and Ge in the less amount than that of second n-side nitride semiconductor layer to make the resistivity thereof lower.
(Second N-Side Nitride Semiconductor Layer 204)
Subsequently, at 1050° C., using TMG and ammonia, an undoped GaN layer having a thickness of 20 angstroms was grown. Subsequently, the silane gas was added and a GaN layer doped with Si to $1\times10^{19}/cm^3$ which had a thickness of 20 angstroms was grown. Then, the silane gas was stopped and the undoped GaN layer having a thickness of 20 angstroms was grown. The pair, comprising A film that was an undoped GaN film having a thickness of 20 angstroms and B film which was a Si-doped GaN film having a thickness of 20 angstroms Were grown in this way. The second n-side nitride semiconductor layer 204 made of modulation-doped GaN was grown by laminating the pair.
(Third N-Side Nitride Semiconductor Layer 205)
Next, only the silane gas was stopped and at 1050° C., in the same way, the third n-side nitride semiconductor layer 205 made of undoped GaN which had a thickness of 100 angstroms was grown. The third buffer layer may be also made of $In_xAl_yGa_{1-x-y}N$ ($0 \leq x$, $0 \leq y$, $x+y \leq 1$) instead of GaN The composition is not specifically limited thereto, but preferably, may be GaN, $Al_xGa_{1-x}N$ (X is not greater than 0.2) or $In_yGa_{1-y}N$ (Y is not greater than 0.1). In such a case, a nitride semiconductor layer having a minimized crystal defect can be obtained. In the case that the InGaN layer is grown and the nitride semiconductor containing Al is grown thereon, cracks can be prevented from developing in the nitride semiconductor layer containing Al.
(Active Layer)
Next, at 800° C. using nitrogen as a carrier gas and TMG, TMI (trimethylindium) and ammonia, an undoped $In_{0.4}Ga_{0.6}N$ layer having a thickness of 30 angstroms was grown to obtain an active layer 7 in the form of a single quantum well structure. The active layer may be in the form of a multiple quantum well structure having a well layer made of InGaN.
(P-Cladding Layer 108)
Next, the temperature was increased to 1050° C. and using TMG, TMA, ammonia and Cp2Mg (cyclopentadienyl magnesium), a p-type $Al_{0.1}Ga_{0.9}N$ layer doped with Mg to $1\times10^{20}M/cm^3$ which had a thickness of 20 angstroms was grown. Then, using TMG, ammonia and Cp2Mg, a p-type GaN layer doped with Mg to $1\times10^{19}/cm^3$ which had a thickness of 20 angstroms was grown. Thus, these operations were repeated and the p-cladding layer of a superlattice structure that had a total thickness of 0.8 µm was formed.

(P-Contact Layer 208)

Next, at 800° C., a first nitride semiconductor film made of undoped $In_{0.1}Ga_{0.9}N$ which had a thickness of 30 angstroms was grown. Subsequently, TMI was stopped and a second nitride semiconductor film made of GaN doped with Mg to $1\times10^{20}/cm^3$ was grown. Thus, the p-contact layer 208 having a total thickness of 600 angstroms was grown by alternately laminating these films.

After the completion of the reaction, the temperature was decreased to the room temperature and further, the wafer was annealed in the nitrogen atmosphere at 700° C. in the reactor, so as to make each of the p-region layers less resistive.

After annealing, the wafer was removed out of the reactor. A mask of a desired shape was formed on the top surface of the p-contact layer 208 and the etching was conducted from the side of the p-contact layer with a RIE (reactive ion etching) apparatus to expose the surface of the second n-side nitride semiconductor layer, as shown in FIG. 5.

After the etching, a transparent p-electrode 10 containing Ni and Au, which had a thickness of 200 angstroms, was formed on the almost entire surface of the top p-contact layer. On the p-electrode 10, a p-pad electrode 11 made of Au for bonding which had a thickness of 0.5 µm was formed. On the other hand, an n-electrode 12 containing W and Al was formed on the second n-side nitride semiconductor layer 204, which had been exposed by etching. At last, an insulating film 12 made of $SiO_2$, as shown in FIG. 5, was formed to protect the surface of the p-electrode 10. Then, the wafer was scribed and separated so as to obtain an LED device, which had a square of 350 µm by 350 µm.

The resulting LED device emitted green light of 520 nm, which had a forward voltage of 3.2 V at 20 mA and the Vf could be decreased by 0.2 to 0.3 V. The power could be increased by 10% and more. One hundred of LED chips according to Example 21 were fabricated and the forward voltage, the Vf thereof were measured at 20mA. The range of the Vf was between 3.2V and 3.3V with extremely little distribution.

EXAMPLE 27

The LED device was fabricated in the same way as in Example 26, except that where the p-contact layer was grown, the order of undoped $In_{0.1}Ga_{0.9}N$ films and GaN films doped with Mg to $1\times10^{20}/cm^3$ to be laminated were reversed.

EXAMPLE 28

The LED device was fabricated in the same way as in Example 26, except that where the p-contact layer was grown, the second nitride semiconductor film was made of $In_{0.05}Ga_{0.95}N$.

EXAMPLE 29

The LED device was fabricated in the same way as in Example 26, except that where the p-contact layer was grown, the second nitride semiconductor film was made of $In_{0.05}Ga_{0.95}N$ doped with Mg to $1\times10^{20}/cm^3$.

EXAMPLE 30

The LED device was fabricated in the same way as in Example 26, except that where the p-contact layer was grown, the second nitride semiconductor film was made of $In_{0.05}Ga_{0.95}N$ doped with Mg to $1\times10^{20}/cm^3$.

EXAMPLE 31

The LED device was fabricated in the same way as in Example 26, except that where the p-contact layer was grown, the first nitride semiconductor film was doped with Mg to $1\times10^{19}/cm^3$.

EXAMPLE 32

The LED device was fabricated in the same way as in Example 26, except that where the p-contact layer 208 was grown, the first nitride semiconductor film made of $In_{0.1}Ga_{0.9}N$ doped with Mg to $1\times10^{20}/cm^3$ was used in place of the first nitride semiconductor film made of undoped $In_{0.1}Ga_{0.9}N$, the second nitride semiconductor film made of GaN doped with Mg to $1\times10^{19}/cm^3$ was used in place of the second nitride semiconductor film made of GaN doped with Mg to $1\times10^{20}/cm^3$, and the top film was a first nitride semiconductor film.

EXAMPLE 33

The LED device was fabricated in the same way as in Example 26, except that the p-contact layer 208 was formed as follows.

That is, at 8000, a first nitride semiconductor film made of undoped $In_{0.1}Ga_{0.9}N$ which had a thickness of 30 angstroms was grown. And subsequently, TMI was decreased little by little to form a gradient composition layer which had a composition varying little by little from $In_{0.1}Ga_{0.9}N$ to GaN with the increase, of the thickness and after TMI was stopped, a second nitride semiconductor film made of GaN doped with Mg to $1\times10^{20}/cm^3$ which had a thickness of 30 angstroms was grown. Then, TMI was increased little by little to form the gradient composition film which had a composition varying little by little from GaN to $In_{0.1}Ga_{0.9}N$ and thereafter, a first nitride semiconductor film made of undoped $In_{0.1}Ga_{0.9}N$ which had a thickness of 30 angstroms was grown. Thus, these operations were repeated to laminate the first nitride semiconductor film and the second nitride semiconductor film, in 10 layers each, so as to form a p-contact layer 208.

The LED devices according to Examples 27 through 33 showed good emitting properties as compared with the conventional LED device.

There was a problem that the conventional p-contact layer made of InGaN absorbed much light in the range of relatively short wavelength and the p-contact layer was colored yellow, therefore, the wavelength of the light emitted from the active layer being shifted into the longer wavelength. However, the p-contact layer of the present invention is in the form of a superlattice structure and the absorptivity of the light having a shorter wavelength can be decreased as compared with the conventional single-layered contact layer made of InGaN. Therefore, the p-contact layer of the present invention can prevent the light from shifting into the longer wavelength region and increase the light transmittance.

Figure 7:
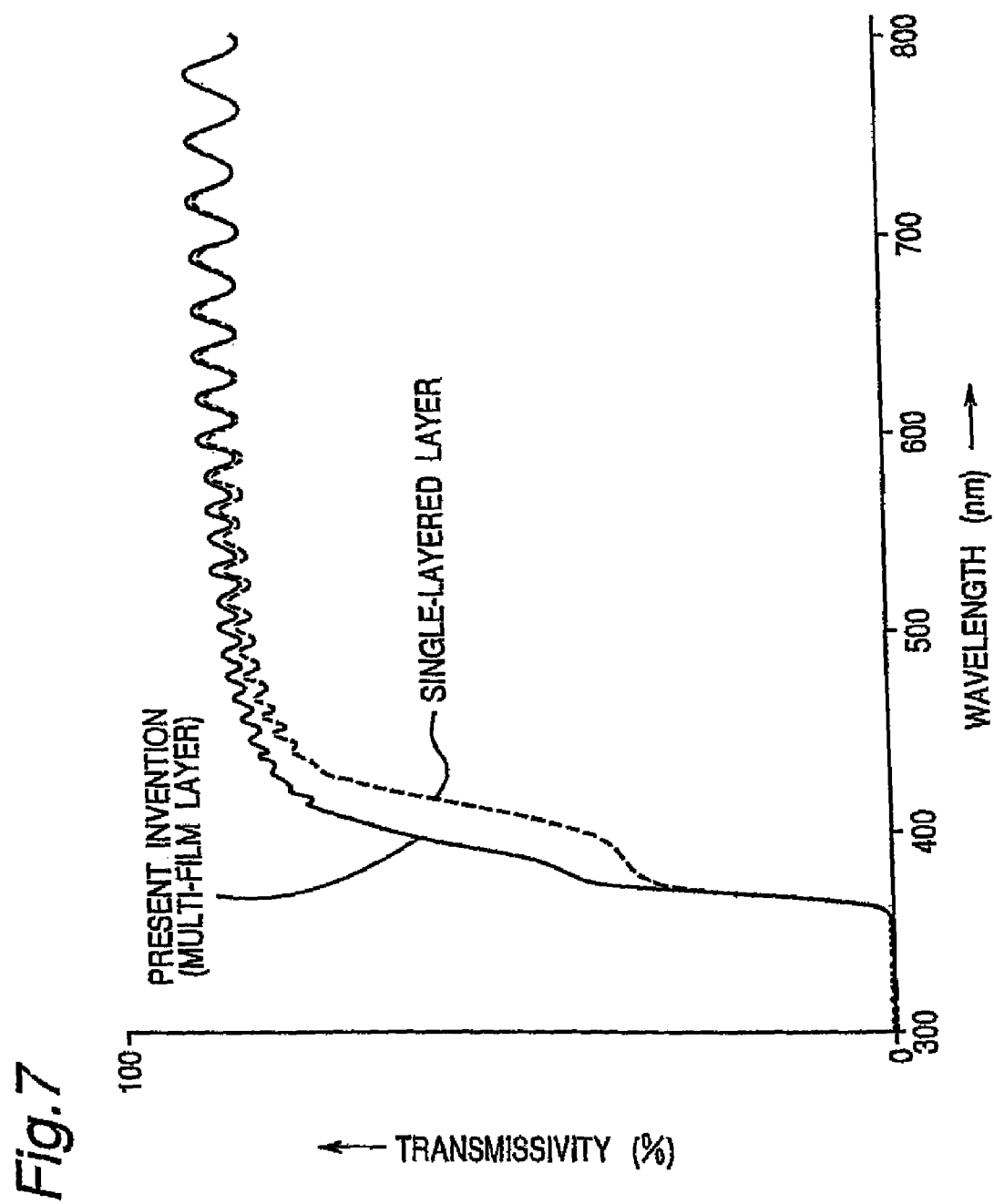
FIG. 7 is a chart showing the beam absorptivity over the wavelength of a multi-film layer (p-side multi-film layer) of the present invention.

FIG. 7 is a chart which shows light transmittance of the multi-film layer in the form of a superlattice structure made of GaN and InGaN according to the present invention relative to wavelength. The multi-film layer was formed by alternately laminating a GaN film (20 angstroms) and a InGaN film (20 angstroms) in 30 layers each and was a p-type layer which was doped with Mg and had a carrier concentration of $4\times10^{18}/cm^3$. FIG. 7 also shows a light transmittance of the conventional single-layered $In_{0.15}Ga_{0.85}N$ layer (having a thickness of 0.12 μm) for the comparison. As shown in FIG. 7, the absorptivity near 400 nm of wavelength was extremely different between the multi-film layer in the form of a superlattice structure according to the present invention and the conventional single-layered structure, and the multi-film layer in the form of a superlattice structure according to the present invention has a excellent light transmittance near 400 nm of wavelength. The resistivity, ρ, of the multi-film layer in the form of a superlattice structure according to the present invention and the conventional single-film layer were both 0.5Ω·cm. The light transmittance in FIG. 7 is a relative value in the case that the light transmittance of the sapphire substrate is 100%.

EXAMPLE 34

Example 34 is related to the fifth embodiment according to the present invention as shown in FIG. 8.

In Example 34, a sapphire substrate (C-face) was set in the MOVPE reactor and the temperature of the substrate was increased to 1050° C. with hydrogen flown to clean the substrate.

(Buffer Layer 102)

Subsequently, the temperature was decreased to 510° C. and a buffer layer 102 made of GaN which had a thickness of about 150 angstroms was grown on the substrate 1 using hydrogen as a carrier gas and ammonia and TMG (trimethylgallium) as material gases.

(Undoped GaN Layer 103)

After growing the buffer layer 102, only TMG was stopped and the temperature was increased to 1050° C. At 1050° C., in the same way using ammonia and TMG as material gases, an undoped GaN layer 3 which had a thickness of 1.5 μm was grown.

(N-Contact Layer 4)

Subsequently, at 1050° C., in the Same Way Using Ammonia and TMG as material gases and the silane gas as an impurity gas, an n-contact layer made of GaN doped with Si to $4.5\times10^{18}/cm^3$ which had a thickness of 2.25 μm was grown.

(N-Side First Multi-Film Layer 305)

Next, only the silane gas was stopped and at 1050° C., using TMG and ammonia gas, a lower film 305*a* made of undoped GaN which had a thickness of 2000 angstroms was grown. Subsequently, at the same temperature, silane gas was added, an inter-film 305*b* made of GaN doped with Si to $4.5\times10^{18}/cm^3$ which had a thickness of 300 angstroms was grown. Subsequently, the silane gas was stopped and at the same temperature, an upper film 305*c* made of undoped GaN which had a thickness of 50 angstroms was grown. Thus, the n-side multi-film layer 5 comprising three films that had a total thickness of 2350 angstroms was grown.

(N-Side Second Multi-Film Layer 306)

Next, at the same temperature, a second nitride semiconductor film made of undoped GaN that had a thickness of 40 angstroms was grown. Next, the temperature was decreased to 800° C. and using TMG, TMI and ammonia, a first nitride semiconductor film made of undoped $In_{0.13}Ga_{0.87}N$ which had a thickness of 20 angstroms was grown. Then these operations were repeated and the n-side second multi-film layer 306 in the form of a superlattice structure which had a total thickness of 640 angstroms was formed by alternately laminating the first film and the second film in the order of 2nd+1st, in 10 layers each and finally laminating a second nitride semiconductor film made of GaN which had a thickness of 40 angstroms.

(Active Layer 7)

Next, a barrier layer made of undoped GaN having a thickness of 200 angstroms was grown and at 800° C., an well layer made of undoped $In_{0.4}Ga_{0.6}N$ which had a thickness of 30 angstroms was grown using TMG, TMI and ammonia. An active layer 7 in the form of a multiple quantum well structure which had a total thickness of 1120 angstroms was grown by laminating alternately a barrier layer and a well layer in the order of barrier+well+barrier . . . +barrier layer, in 5 layers and 4 layers, respectively.

(P-Side Multi-Film Cladding Layer 8)

Next, using TMG, TMA, ammonia and Cp2Mg (cyclopentadienyl magnesium), a third nitride semiconductor film made of p-type $Al_{0.2}Ga_{0.8}N$ doped with Mg to $1\times10^{20}/cm^3$ which had a thickness of 40 angstroms was grown. Subsequently, at 800° C., using TMG, TMI, ammonia and Cp2Mg, a fourth nitride semiconductor film made of $In_{0.03}Ga_{0.97}N$ doped with Mg to $1\times10^{20}/cm^3$ which had a thickness of 25 angstroms was grown. Thus, these operations were repeated and the p-side multi-film cladding layer 8 in the form of a superlattice structure which had a total thickness of 365 angstroms was grown by alternately laminating a third layer and a fourth layer in the order of 3rd+4th, in 5 layers each and finally laminating the third nitride semiconductor film which had a thickness of 40 angstroms.

(P-Side GaN Contact Layer 9)

Subsequently, at 1050° C., using TMG, ammonia and Cp2Mg, a p-contact layer 9 made of p-type GaN doped with Mg to $1\times10^{20}/cm^3$ which had a thickness of 700 angstroms was grown.

After the completion of the reaction, the temperature was decreased to the room temperature and further, the wafer was annealed in the nitrogen atmosphere at 700° C. in the reactor, so as to make the p-type layers less resistive.

After annealing, the wafer was removed out of the reactor. A mask of a desired shape was formed on the top surface of the p-contact layer 9 and the etching was conducted from the p-contact layer with a RIE (reactive ion etching) apparatus to expose the surface of the n-contact layer, as shown in FIG. 8.

After the etching, a transparent p-electrode 10 containing Ni and Au, which had a thickness of 200 angstroms, was formed on the almost entire surface of the top p-contact layer. On the p-electrode 10, a p-pad electrode 11 made of Au for bonding which had a thickness of 0.5 μm was formed. On the other hand, an n-electrode 12 containing W and Al was formed on the n-contact layer 4, which had been exposed by etching, so as to obtain an LED device.

The resulting LED device emitted pure green light of 520 nm at 20 mA of forward current and the Vf was 3.5V. The Vf was almost 1.0 V lower than that of the conventional LED device having a multiple quantum well structure. And the power was two times or more as high as that of the conventional LED. Therefore, the LED had almost the same properties at 10mA as those of the conventional LED. Moreover, where the electrostatic withstand voltage of the resulting LED device was measured by applying voltage little by little in the backward direction from each electrode of n-layers and p-layers, it was 1.5 times higher than that of the conventional LED device and good results were obtained.

In the conventional LED device, on the first buffer layer made of GaN, the second buffer layer made of undoped GaN, the n-contact layer made of GaN doped with Si, the active layer in the form of the same multiple quantum well structure as that of Example 27, single Mg-doped $Al_{0.1}Ga_{0.9}N$ layer and the p-contact layer made of GaN doped with Mg were laminated successively.

EXAMPLE 35

The LED device was fabricated in the same way as in Example 34, except that the active layer 7 was formed as follows.
(Active Layer 7)

Next, a barrier layer made of undoped GaN having a thickness of 250 angstroms was grown and at 800° C., an well layer made of undoped $In_{0.3}Ga_{0.7}N$ which had a thickness of 30 angstroms was grown using TMG, TMI and ammonia. An active layer 7 in the form of a multiple quantum well structure which had a total thickness of 1930 angstroms was grown by laminating alternately a barrier layer and a well layer in the order of barrier+well+barrier . . . +barrier layer, in 7 layers and 6 layers, respectively.

The resulting LED device emitted a pure blue light of 470 nm at 20 mA of forward current and good results were obtained like Example 34.

EXAMPLE 36

The LED device was fabricated in the same way as in Example 34, except that the active layer 7 was formed as follows.
(Active Layer 7)

Next, a barrier layer made of undoped GaN having a thickness of 250 angstroms was grown and at 8000, an well layer made of undoped $In_{0.3}Ga_{0.7}N$ which had a thickness of 30 angstroms was grown using TMG, TMI and ammonia. An active layer 7 in the form of a multiple quantum well structure which had a total thickness of 1650 angstroms was grown by alternately laminating a barrier layer and a well layer in the order of barrier+well+barrier . . . +barrier layer, in 6 layers and 5 layers, respectively.

The resulting LED device emitted a pure blue light of 470 nm at 20 mA of forward current and good results were obtained like Example 34.

EXAMPLE 37

The LED device was fabricated in the same way as in Example 34, except that the active layer 7 was formed as follows.
(Active Layer 7)

Next, a barrier layer made of undoped GaN having a thickness of 250 angstroms was grown and at 800° C., an well layer made of undoped $In_{0.35}Ga_{0.65}N$ which had a thickness of 30 angstroms was grown using TMG, TMI and ammonia. An active layer 7 in the form of a multiple quantum well structure which had a total thickness of 1930 angstroms was grown by laminating alternately a barrier layer and a well layer in the order of barrier+well+barrier . . . +barrier layer, in 7 layers and 6 layers, respectively.

The resulting LED device emitted a blue green light of 500 nm at 20 mA of forward current and good results, were obtained like Example 34.

EXAMPLE 38

The LED device was fabricated in the same way as in Example 34, except that the active layer 7 was formed as follows.
(Active Layer 7)

Next, a barrier layer made of undoped GaN having a thickness of 250 angstroms was grown and at 800° C., an well layer made, of undoped $In_{0.35}Ga_{0.65}N$ which had a thickness of 30 angstroms was grown using TMG, TMI and ammonia. An active layer 7 in the form of a multiple quantum well structure which had a total thickness of 1090 angstroms was grown by laminating alternately a barrier layer and a well layer in the order of barrier+well+barrier . . . +barrier layer, in 4 layers and 3 layers, respectively.

The resulting LED device emitted a blue green light of 500 rim at 20 mA of the forward current and good results were obtained like Example 34.

EXAMPLE 39

The LED device was fabricated in the same way as in Example 34, except that the n-side second multi-film layer 306 was not grown.

The resulting LED device had a tittle lower device properties and emission power than those in Example 34. The electrostatic withstand voltage of the resulting LED was almost the same as that in Example 27.

EXAMPLE 40

The LED device was fabricated in the same way as in Example 34, except that the p-side multi-film cladding layer 8 was grown as follows.
(P-Side Single-Film Cladding Layer 8)

At 1050° C., using TMG, TMA, ammonia and Cp2Mg (cyclopentadienyl magnesium), a p-side single-layered cladding layer 8 made of p-type $Al_{0.15}Ga_{0.84}N$ doped with Mg to $1\times10^{20}/cm^3$ which had a thickness of 300 angstroms was grown.

The resulting LED device had a single-layered cladding layer instead of that in the form a superlattice structure. The combination thereof with the other structures gave a little less emission power than those in Example 27, but gave a good electrostatic withstand voltage. In the case of the single-layered layer, the manufacturing process can be simplified as compared with the case of the multi-film layer.

EXAMPLE 41

The LED device was fabricated in the same way as in Example 34, except that each film of the n-side first multi-film layer 305 had a different thickness as follows.
(N-Side First Multi-Film Layer 305)

Next, only the silane gas was stopped and at 1050° C., using TMG and ammonia gas, a lower film 305*a* made of undoped GaN which had a thickness of 3000 angstroms was grown. Subsequently, at the same temperature, the silane gas was added and an inter-film 305*b* made of GaN doped with Si to $4.5\times10^{18}/cm^3$ which had a thickness of 300 angstroms was grown. Subsequently, the silane gas was stopped and at the same temperature, an upper film 305*c* made of undoped GaN which had a thickness of 50 angstroms was grown. Thus, a first multi-film layer 5 comprising three films, which had a total thickness of 3350 angstroms, was grown.

The resulting LED device had almost similar properties to those in Example 34 and good results were obtained.

EXAMPLE 42

The LED device was fabricated in the same way as in Example 41, except that the n-side first multi-film layer 305 was formed as follows.

That is, a lower film 305a made of undoped $Al_{0.1}Ga_{0.9}N$ which had a thickness of 3000 angstroms was grown, an inter-film 305b made of $Al_{0.1}Ga_{0.9}N$ doped with Si to $4.5 \times 10^{18}/cm^3$ which had a thickness of 300 angstroms was grown, and an upper film 305c made of undoped $Al_{0.1}Ga_{0.9}N$ which had a thickness of 50 angstroms was grown. The resulting LED device had almost similar properties to those in Example 41 and good results were obtained.

COMPARATIVE EXAMPLE 1

The LED device was fabricated in the same way as in Example 34, except that the lower film 305a made of undoped GaN which composed the n-side first multi-film layer 305 was not formed.

The resulting LED device had an extremely low electrostatic withstand voltage as compared with Example 34. The leak current and the Vf of the resulting LED device were not satisfactory values.

COMPARATIVE EXAMPLE 2

The LED device was fabricated in the same way as in Example 34, except that the inter-film 305b made of Si-doped GaN which composed the n-side first multi-film layer 305 was not formed.

The resulting LED device had an extremely low emission power and electrostatic withstand voltage as compared with Example 34. The other properties of the resulting LED device were not satisfactory values.

COMPARATIVE EXAMPLE 3

The LED device was fabricated in the same way as in Example 34, except that the upper film 305c made of undoped GaN which composed the n-side first multi-film layer 305 was not formed.

The leak current of the resulting LED device was high as compared with that in Example 34. The other properties of the resulting LED device were not satisfactory values.

EXAMPLE 43

Example 43 is related to the sixth embodiment according to the present invention.
(Substrate 1)
A sapphire substrate (C-face) was set in the MOVPE reactor and the temperature of the substrate was increased to 1050° C. with hydrogen flown to clean the substrate.
(Buffer Layer 2)
Subsequently, the temperature was decreased to 510° C. and a buffer layer 2 made of GaN which had a thickness of about 200 angstroms was grown on the substrate 1 using hydrogen as a carrier gas and ammonia and TMG (trimethylgallium) as material gases. The first buffer layer 2 that was grown at a low temperature may be omitted, depending on the kind of the substrate, the growing method and the like.

(Undoped GaN Layer 3)
After growing the buffer layer 2, only TMG was stopped and the temperature was increased to 1050° C. At 1050° C., in the same way using TMG and ammonia gas as material gases, an undoped GaN layer 3 which had a thickness of 1 μm was grown.
(N-Contact Layer 4)
Subsequently, at 1050° C., in the same way using ammonia and TMG as material gases and the silane gas as an impurity gas, a n-contact layer made of GaN doped with Si to $3 \times 10^{19}/cm^3$ which had a thickness of 3 μm was grown.
(Undoped GaN Layer 5)
Next, only the silane gas was stopped and at 1050° C., in the same way, an undoped GaN layer 5 which had a thickness of 100 angstroms was grown.
(N-Side Multi-Film Layer 6)
Next, the temperature was decreased to 800° C. and a second nitride semiconductor film made of undoped $In_{0.03}Ga_{0.97}N$ which had a thickness of 25 angstroms was grown using TMG, TMI and ammonia. Subsequently, the temperature was increased and on the second film, a first nitride semiconductor film made of undoped GaN, which had a thickness of 25 angstroms, was grown. Then these operations were repeated and the n-type multi-film layer in the form of a superlattice structure which had a thickness of 500 angstroms was grown by alternately laminating a second film and a first film in the order of 2nd+1st, in 10 layers each.
(Active Layer 7)
Next, a barrier layer made of undoped GaN having a thickness of 200 angstroms was grown and at 800° C. an well layer made of undoped $In_{0.4}Ga_{0.6}N$ which had a thickness of 30 angstroms was grown using TMG, TMI and ammonia. An active layer 7 in the form of a multiple quantum well structure which had a total thickness of 1120 angstroms was grown by alternately laminating a barrier layer and a well layer in the order of barrier+well+barrier . . . +barrier layer, in 5 layers and 4 layers, respectively.
(P-Side Multi-Film Layer 8)
Next, using TMG, TMA, ammonia and Cp2Mg (cyclopentadienyl magnesium), a third nitride semiconductor film made of p-type $Al_{0.1}Ga_{0.9}N$ doped with Mg to $1 \times 10^{19}/cm^3$ which had a thickness of 25 angstroms was grown. Subsequently, Cp2Mg and TMA were stopped and a fourth nitride semiconductor film made of undoped GaN, which had a thickness of 25 angstroms, was grown. Thus, these operations were repeated and the p-side multi-film layer 8 in the form of a superlattice structure which had a total thickness of 200 angstroms was grown by alternately laminating a third film and a fourth film in the order of 3rd+4th, in 4 layers each.
(P-Contact Layer 9)
Subsequently, at 10500, using TMG ammonia and Cp2Mg, a p-contact layer 8 made of p-type GaN doped with Mg to $1 \times 10^{20}/cm^3$ which had a thickness of 700 angstroms was grown.

After the completion of the reaction, the temperature was decreased to the room temperature and further, the wafer was annealed in the nitrogen atmosphere at 700° C. in the reactor, so as to make the p-type layers less resistive.

After annealing, the wafer was removed out of the reactor. A mask of a desired shape was formed on the top surface of the p-contact layer 9 and the etching was conducted from the side of the p-contact layer with a RIE (reactive ion etching) apparatus to expose the surface of the n-contact layer 4, as shown in FIG. 1.

After the etching, a transparent p-electrode 10 containing Ni and Au which had a thickness of 200 angstroms was formed on the almost entire surface of the top p-contact layer.

On the p-electrode 10, a p-pad electrode 11 made of Au for bonding which had a thickness of 0.5 μm was formed. On the other hand, an n-electrode 12 containing W and Al was formed on the n-contact layer 4 which had been exposed by etching, so as to obtain an LED device.

The resulting LED device emitted pure green light of 520 nm at 20 mA of forward current and the Vf was only 3.5V. The Vf was almost 0.5 V lower than that of the conventional LED device having a multiple quantum well structure. And the power was two times or more as high as that of the conventional LED. Therefore, the LED had almost the same properties at 10mA as those of the conventional LED. Moreover, the electrostatic withstand voltage of the resulting LED device was about 1.2 times or more as high as that of the conventional LED device.

In the conventional LED device, on the first buffer layer made of GaN, the second buffer layer made of undoped GaN, the n-contact layer made of GaN doped with Si, the active layer in the form of the same multiple quantum well structure as that in Example 1, single Mg-doped $Al_{0.1}Ga_{0.9}N$ layer and the p-contact layer made of GaN doped with Mg were laminated successively.

EXAMPLE 44

The LED device was fabricated in the same way as in Example 43, except that when the n-type multi-film layer 6 was grown, the first nitride semiconductor film was made of GaN doped with Si to $1\times10^{18}/cm^3$. The resulting LED device had almost similar properties to those in Example 43.

EXAMPLE 45

The LED device was fabricated in the same way as in Example 43, except that when the n-type multi-film layer 6 was grown, the second nitride semiconductor film was made of $In_{0.03}Ga_{0.37}$ doped with Si to $1\times10^{18}/cm^3$ and the first nitride semiconductor film was made of GaN doped with Si to $5\times10^{18}/cm^3$. The resulting LED device had the Vf of 3.4 V at 20mA and a power 1.5 times higher than that of the conventional LED device. The electrostatic withstand voltage was good like in Example 43.

EXAMPLE 46

The LED device was fabricated in the same way as in Example 43, except that where the p-type multi-film layer 8 was grown, the fourth nitride semiconductor film was made of p-type GaN doped with Mg to $1\times10^{19}/cm^3$. The resulting LED device had almost similar properties to those in Example 43.

EXAMPLE 47

The LED device was fabricated in the same way as in Example 43, except that the p-type multi-film layer 8 having a total thickness of 100 angstroms was grown by alternately laminating a third nitride semiconductor film made of undoped $Al_{0.1}Ga_{0.9}N$ which had a thickness of 25 angstroms and a fourth nitride semiconductor film made of undoped GaN which had a thickness of 25 angstroms, in 2 layers each. The resulting LED device had almost similar properties to those in Example 43.

EXAMPLE 48

The LED device was fabricated in the same way as in Example 43, except that a multi-film layer was formed in place of an undoped GaN layer 5 and certain layers were formed as follows.

(N-Contact Layer 4)

Subsequently, at 1050° C., in the same way using ammonia and TMG as material gases and the silane gas as ah impurity gas, a n-contact layer 4 made of GaN doped with Si to $6\times10^{18}/cm^3$ which had a thickness of 2.25 μm was grown.

(Multi-Film Layer)

Next, only the silane gas was stopped and at 1050° C., using TMG and ammonia gas, a lower film 305a made of undoped GaN which had a thickness of 2000 angstroms was grown. Subsequently, at the same temperature, the silane gas was added and an inter-film 305b made of GaN doped with Si to $6\times10^{18}/cm^3$ which had a thickness of 300 angstroms was grown. Further, subsequently, only the silane gas was stopped and at the same temperature, an upper film 305c made of undoped GaN which had a thickness of 50 angstroms was grown. Thus, the multi-film layer comprising three films, which had a total thickness of 2350 angstroms, was grown.

(N-Type Multi-Film Layer 6)

Next, at the same temperature, a first nitride semiconductor film made of undoped GaN that had a thickness of 40 angstroms was grown. Then, the temperature was decreased to 800° C. and a first nitride semiconductor film made of undoped $In_{0.02}Ga_{0.98}N$ which had a thickness, of 20 angstroms was grown using TMG, TMI and ammonia. Then these operations were repeated and the n-type multi-film layer 6 in the form of a superlattice structure which had a thickness of 640 angstroms was grown by alternately laminating a first film and a second film in the order of 1 st+2nd, in 10 films each and finally laminating a first nitride semiconductor film made of GaN which had a thickness of 40 angstroms.

(P-Type Multi-Film Layer 8)

Next, at 1050° C., using TMG, TMA, ammonia and Cp2Mg (cyclopentadienyl magnesium), a third nitride semiconductor film made of p-type $Al_{0.2}Ga_{0.8}N$ doped with Mg to $5\times10^{19}/cm^3$ which had a thickness of 40 angstroms was grown. Subsequently, the temperature was decreased to 800° C. and using TMG, TMI, ammonia and Cp2Mg, a fourth nitride semiconductor film made of $In_{0.02}Ga_{0.98}N$ doped with Mg to $5\times10^{19}/cm^3$ which had a thickness of 25 angstroms was grown. Thus, these operations were repeated and the p-side multi-film layer 8 in the form of a superlattice structure which had a total thickness of 365 angstroms was grown by alternately laminating a third film and a fourth film in the order of 3rd-4th, in 5 films each and finally laminating the third nitride semiconductor film having a thickness of 40 angstroms.

The resulting LED device had an excellent emitting power and the Vf like in Example 34. Moreover, when the electrostatic withstand voltage of the resulting LED device was measured by applying the reverse-biased voltage little by little between the electrodes of n-region and p-region, it was 1.5 times or more as high as that of the conventional LED device. And as for the electrostatic withstand voltage, better results were obtained than in Example 34.

In the above-mentioned Examples, the present invention was described using a nitride semiconductor light emitting device, which was an LED device. However, the present invention is not to be limited to the LED device and can be applied to the other light emitting devices such as laser diode devices.

And the present invention is not to be limited to the light emitting device and can be applied to solar cells, photodetectors such as light sensors using nitride semiconductors or electronic devices such as transistors and power devices.

INDUSTRIAL APPLICABILITY

As mentioned above, according to the present, invention, nitride semiconductor devices, particularly nitride semiconductor light emitting devices can be obtained with and a power equal to or higher than that of the conventional LED device at a low current and therefore, the light emitting power can be further improved.

According to the present invention, the electrostatic withstand voltage can be increased and a highly reliable nitride semiconductor device can be provided. Therefore, the range of the applicable products can be increased.

The present invention can be applied not only to light emitting devices, but also to any electronic devices using nitride semiconductors, such as photodetectors and solar cells.

The invention claimed is:

1. A nitride semiconductor device comprising;
an n-region having an n-side contact layer of nitride semiconductor, a buffer layer of nitride semiconductor and an n-side multi-film layer having at least one first nitride semiconductor film containing In and at least one second nitride semiconductor film having a composition different from that of said at least one first nitride semiconductor film, wherein the buffer layer is located between the n-side contact layer and said n-side multi-film layer;
a p-region having a nitride semiconductor film, and
an active layer interposed between said n-region and said p-region, wherein the n-side multi-film layer of said n-region is located between said active layer and said buffer layer of said n-side multi-film layer,
wherein at least one of said at least one first nitride semiconductor film and said at least one second nitride semiconductor films has the thickness less than 100 angstroms.

2. The nitride semiconductor device according to claim 1, wherein said buffer layer has a thickness not less than 100 angstroms and said buffer layer is made of one selected from a group consisting of GaN, $Al_xGa_{1-x}N$ ($0<x<0.1$) and $In_yGa_{1-y}N$ ($0<y<0.1$).

3. The nitride semiconductor device according to claim 2, wherein said buffer layer is an undoped GaN layer.

4. The nitride semiconductor device according to claim 2, wherein said n-side contact layer is formed on said an undoped GaN layer.

5. The nitride semiconductor device according to claim 2, wherein said at least one first nitride semiconductor film is made of $In_xGa_{1-x}N$ ($0<x<1$) and said at least one second nitride semiconductor film is made of $In_yGa_{1-y}N$ ($0\leq y<1$, $y<x$).

6. The nitride semiconductor device according to claim 5, wherein said n-side multi-film layer is in contact with said active layer.

7. The nitride semiconductor device according to claim 5, wherein said at least one first nitride semiconductor film has more than one first nitride semiconductor film and said at least one second nitride semiconductor film has more than one second nitride semiconductor film, and
wherein at least one of adjacent first nitride semiconductor films have different thickness from each other and adjacent second nitride semiconductor films have different thickness from each other.

8. The nitride semiconductor device according to claim 5, wherein said at least one first nitride semiconductor film has more than one first nitride semiconductor film and said at least one second nitride semiconductor film has more than one second nitride semiconductor film, and
wherein at least one of adjacent first nitride semiconductor films have different composition ratios of an element selected from Group III from each other and adjacent second nitride semiconductor films have different composition ratio of an element selected from Group III from each other.

9. The nitride semiconductor device according to claim 5, wherein said at least one first and second nitride semiconductor films are not doped with an n-type impurity.

10. The nitride semiconductor device according to claim 5, wherein said at least one first nitride semiconductor film and said at least one second nitride semiconductor film include n-type impurity, and
wherein a concentration of the n-type impurity in the first nitride semiconductor film is different from a concentration of the n-type impurity in the first nitride semiconductor film.

11. The nitride semiconductor device according to claim 5, wherein the nitride semiconductor layer of said p-region is a p-side cladding layer composed of $Al_bGa_{1-b}N$ ($0\leq b\leq 1$).

12. A nitride semiconductor device comprising:
an n-region layer structure including (a) a first n-region multi-film layer having at least one first nitride semiconductor films containing In and at least one second nitride semiconductor film, said at least one second nitride semiconductor film having a different bandgap and a different concentration of an n-type impurity than said at least one first nitride semiconductor film, and (b) a second n-region multi-film layer having at least one fifth nitride semiconductor film and at least one sixth nitride semiconductor film, said at least one sixth nitride semiconductor film having a different composition than said at least one fifth nitride semiconductor film;
a p-region layer structure including a p-region single-layered cladding layer doped with a p-type impurity and made of $Al_bGa_{1-b}N$ ($0\leq b\leq 1$); and
an active layer, interposed between said n-region and p-region layer structures, made of a multiple quantum well structure of $In_aGa_{1-a}N$ ($0\leq a<1$),
wherein said second n-region multi-film layer is interposed between said first n-region multi-film layer and said active layer, and
wherein at least one of said at least one first nitride semiconductor film and said at least one second nitride semiconductor film has a thickness of less than 100 angstroms.

13. The nitride semiconductor device according to claim 12, wherein said first nitride semiconductor films are made of $In_xGa_{1-x}N$ ($0<x<1$) and the second nitride semiconductor films are made of $In_yGa_{1-y}N$ ($0\leq y<1$, $y<x$).

14. The nitride semiconductor device according to claim 13, wherein said n-region layer structure further includes an n-contact layer containing the n-type impurity, interposed between said first n-region multi-film layer and a substrate.

15. The nitride semiconductor device according to claim 13, wherein said n-side multi-film layer is in contact with said active layer.

16. The nitride semiconductor device according to claim 13, wherein said at least one first nitride semiconductor film has more than one first nitride semiconductor film and said at least one second nitride semiconductor film has more than one second nitride semiconductor film, and
wherein at least one of adjacent first nitride semiconductor films have different thickness from each other and adjacent second nitride semiconductor films have different thickness from each other.

17. The nitride semiconductor device according to claim 13, wherein said at least one first nitride semiconductor film has more than one first nitride semiconductor film and said at least one second nitride semiconductor film has more than one second nitride semiconductor film, and wherein at least one of adjacent first nitride semiconductor films have different composition ratios of an element selected from Group III from each other and adjacent second nitride semiconductor films have different composition ratio of an element selected from Group III from each other.

18. The nitride semiconductor device according to claim 13, wherein said at least one first and second nitride semiconductor films are not doped with an n-type impurity.

19. The nitride semiconductor device according to claim 13, wherein said at least one first nitride semiconductor film and said at least one second nitride semiconductor film include n-type impurity, and wherein a concentration of the n-type impurity in the first nitride semiconductor film is different from a concentration of the n-type impurity in the second nitride semiconductor film.

20. The nitride semiconductor device according to claim 13, wherein the nitride semiconductor layer of said p-region is a p-side cladding layer composed of $Al_bGa_{1-b}N$ ($0 \leqq b \leqq 1$).

* * * * *